United States Patent
Nakagawa et al.

(10) Patent No.: US 11,552,616 B2
(45) Date of Patent: Jan. 10, 2023

(54) ACOUSTIC WAVE DEVICE, MULTIPLEXER, RADIO-FREQUENCY FRONT END CIRCUIT, AND COMMUNICATION DEVICE

(71) Applicant: Murata Manufacturing Co., Ltd., Nagaokakyo (JP)

(72) Inventors: Ryo Nakagawa, Nagaokakyo (JP); Shou Nagatomo, Nagaokakyo (JP); Hideki Iwamoto, Nagaokakyo (JP); Tsutomu Takai, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 524 days.

(21) Appl. No.: 16/783,203

(22) Filed: Feb. 6, 2020

(65) Prior Publication Data
US 2020/0177153 A1 Jun. 4, 2020

Related U.S. Application Data

(63) Continuation of application No. PCT/JP2018/027363, filed on Jul. 20, 2018.

(30) Foreign Application Priority Data

Aug. 9, 2017 (JP) .................... JP2017-154240

(51) Int. Cl.
*H03H 9/02* (2006.01)
*H03H 9/05* (2006.01)
(Continued)

(52) U.S. Cl.
CPC .... *H03H 9/02574* (2013.01); *H03H 9/02559* (2013.01); *H03H 9/02614* (2013.01);
(Continued)

(58) Field of Classification Search
CPC ........... H03H 9/02574; H03H 9/02559; H03H 9/02614; H03H 9/058; H03H 9/14502;
(Continued)

(56) References Cited

U.S. PATENT DOCUMENTS

| | | | |
|---|---|---|---|
| 2010/0182101 A1 | 7/2010 | Suzuki | |
| 2014/0152146 A1 | 6/2014 | Kimura et al. | |

(Continued)

FOREIGN PATENT DOCUMENTS

| | | |
|---|---|---|
| JP | 2010-187373 A | 8/2010 |
| JP | 2014-068123 A | 4/2014 |

(Continued)

OTHER PUBLICATIONS

Official Communication issued in International Patent Application No. PCT/JP2018/027363, dated Sep. 25, 2018.

*Primary Examiner* — Samuel S Outten
(74) *Attorney, Agent, or Firm* — Keating & Bennett, LLP

(57) ABSTRACT

An acoustic wave device includes a support substrate, a silicon nitride film stacked on the support substrate, a silicon oxide film stacked on the silicon nitride film, a piezoelectric body stacked on the silicon oxide film and made of lithium tantalite, and an IDT electrode provided on one main surface of the piezoelectric body. For a wavelength normalized film thickness of the piezoelectric body, an Euler angle of the piezoelectric body, a wavelength normalized film thickness of the silicon nitride film, a wavelength normalized film thickness of the silicon oxide film, and a wavelength normalized film thickness of the IDT electrode, values are set so that at least one of a response intensity of a first higher order mode, corresponding to the response intensity of a second higher order mode, and of a response intensity of a third higher mode is greater than about −2.4.

19 Claims, 20 Drawing Sheets

(51) Int. Cl.
  *H03H 9/145*   (2006.01)
  *H03H 9/25*    (2006.01)
  *H03H 9/64*    (2006.01)
  *H03H 9/72*    (2006.01)

(52) U.S. Cl.
  CPC ........ *H03H 9/058* (2013.01); *H03H 9/14502* (2013.01); *H03H 9/25* (2013.01); *H03H 9/6406* (2013.01); *H03H 9/6483* (2013.01); *H03H 9/725* (2013.01)

(58) Field of Classification Search
  CPC ...... H03H 9/25; H03H 9/6406; H03H 9/6483; H03H 9/725
  See application file for complete search history.

(56) References Cited

U.S. PATENT DOCUMENTS

| | | |
|---|---|---|
| 2017/0093371 A1 | 3/2017 | Takamine |
| 2017/0250674 A1 | 8/2017 | Takamine et al. |
| 2018/0152170 A1 | 5/2018 | Iwamoto |

FOREIGN PATENT DOCUMENTS

| | | |
|---|---|---|
| WO | 2012/086441 A1 | 6/2012 |
| WO | 2015/198904 A1 | 12/2015 |
| WO | 2016/103953 A1 | 6/2016 |
| WO | 2017/043394 A1 | 3/2017 |

ACOUSTIC WAVE DEVICE, MULTIPLEXER, RADIO-FREQUENCY FRONT END CIRCUIT, AND COMMUNICATION DEVICE

CROSS REFERENCE TO RELATED APPLICATIONS

This application claims the benefit of priority to Japanese Patent Application No. 2017-154240 filed on Aug. 9, 2017 and is a Continuation Application of PCT Application No. PCT/JP2018/027363 filed on Jul. 20, 2018. The entire contents of each of these applications are incorporated herein by reference.

BACKGROUND OF THE INVENTION

1. Field of the Invention

The present invention relates to an acoustic wave device having a structure in which a piezoelectric body made of lithium tantalate is stacked on a support substrate made of silicon and to a multiplexer, a radio-frequency front end circuit, and a communication device.

2. Description of the Related Art

Heretofore, multiplexers have been widely used in radio-frequency front end circuits of mobile phones and smartphones. For example, a multiplexer serving as a splitter disclosed in Japanese Unexamined Patent Application Publication No. 2014-068123 includes two or more band pass filters having different frequencies from each other. Each band pass filter is formed of a surface acoustic wave filter chip. Each surface acoustic wave filter chip includes a plurality of surface acoustic wave resonators.

Furthermore, Japanese Unexamined Patent Application Publication No. 2010-187373 discloses an acoustic wave device in which an insulating film made of silicon dioxide and a piezoelectric substrate made of lithium tantalate are stacked on a silicon support substrate. The acoustic wave device has improved heat resistance due to the support substrate and the insulating film being bonded to each other at the (111) plane of silicon.

In the multiplexer disclosed in Japanese Unexamined Patent Application Publication No. 2014-68123, a plurality of acoustic wave filters having different frequencies from each other are connected via a common connection on the antenna terminal side.

The inventors of preferred embodiments of the present application discovered that, in a structure where a piezoelectric body made of lithium tantalate is directly or indirectly stacked on a support substrate made of silicon, a plurality of higher order modes appear on the high-frequency side of the utilized main mode. In the case where such an acoustic wave resonator is used in an acoustic wave filter having a lower pass band in a multiplexer, there is a risk that a ripple due to a higher order mode of that acoustic wave filter will appear in the pass band of another acoustic wave filter having a higher pass band in the multiplexer. In other words, in the multiplexer, if a higher order mode of the acoustic wave filter having the lower pass band is located inside the pass band of the acoustic wave filter having the higher pass band, a ripple will be generated in the pass band of the acoustic wave filter having the higher pass band. Therefore, there is a risk of the filter characteristic of the other acoustic wave filter being degraded.

SUMMARY OF THE INVENTION

Preferred embodiments of the present invention provide acoustic wave devices in each of which a ripple due to a higher order mode is unlikely to be generated in another acoustic wave filter, and multiplexers, radio-frequency front end circuits including the multiplexers, and communication devices.

As will be described later, the inventors of preferred embodiments of the present application discovered that in an acoustic wave device in which a piezoelectric body made of lithium tantalate is directly or indirectly stacked on a support substrate made of silicon, first to third higher-order modes, which are described later, appear on the high-frequency side of the main mode of the acoustic wave device.

An acoustic wave device according to a preferred embodiment of the present invention reduces or prevents at least one higher order mode of the first, second, and third higher order modes.

That is, an acoustic wave device according to a preferred embodiment of the present invention preferably includes a support substrate, which is a silicon substrate, a silicon nitride film stacked on the support substrate, a silicon oxide film stacked on the silicon nitride film, a piezoelectric body stacked on the silicon oxide film and made of lithium tantalate, and an InterDigital Transducer (IDT) electrode provided on one main surface of the piezoelectric body. When $\lambda$ is a wavelength determined by an electrode finger pitch of the IDT electrode, $T_{LT}$ is a wavelength normalized film thickness of the piezoelectric body, $\theta_{LT}$ is a Euler angle $\theta$ of the piezoelectric body, $T_N$ is a wavelength normalized film thickness of the silicon nitride film, $T_S$ is a wavelength normalized film thickness of the silicon oxide film, $T_E$ is a wavelength normalized film thickness of the IDT electrode expressed as an aluminum thickness obtained from a product of the wavelength normalized film thickness of the IDT electrode and a ratio of a density of the IDT electrode to a density of aluminum, $\psi_{Si}$ is a propagation direction inside the support substrate, and $T_{Si}$ is a wavelength normalized film thickness of the support substrate. $T_{LT}$, $\theta_{LT}$, $T_N$, $T_S$, $T_E$, and $\psi_{Si}$ are set so that at least one of $I_h$ corresponding to a response intensity of a first higher order mode, $I_h$ corresponding to a response intensity of a second higher order mode, and $I_h$ corresponding to a response intensity of a third higher order mode is greater than about −2.4, and $T_{Si}$>about 20.

Formula (1)

$$I_h = a^{(2)}_{T_{LT}}((T_{LT} - c_{T_{LT}})^2 - b^{(2)}_{T_{LT}}) + a^{(1)}_{T_{LT}}(T_{LT} - c_{T_{LT}}) +$$
$$a^{(2)}_{T_S}((T_S - c_{T_S})^2 - b^{(2)}_{T_S}) + a^{(1)}_{T_S}(T_S - c_{T_S}) + a^{(3)}_{T_N}((T_N - c_{T_N})^3 - b^{(3)}_{T_N}) +$$
$$a^{(2)}_{T_N}((T_N - c_{T_N})^2 - b^{(2)}_{T_N}) + a^{(1)}_{T_N}(T_N - c_{T_N}) + a^{(2)}_{T_E}((T_E - c_{T_E})^2 - b^{(2)}_{T_E}) +$$
$$a^{(1)}_{T_E}(T_E - c_{T_E}) + a^{(4)}_{\psi_{Si}}((\psi_{Si} - c_{\psi_{Si}})^4 - b^{(4)}_{\psi_{Si}}) +$$
$$a^{(3)}_{\psi_{Si}}((\psi_{Si} - c_{\psi_{Si}})^3 - b^{(3)}_{\psi_{Si}}) + a^{(2)}_{\psi_{Si}}((\psi_{Si} - c_{\psi_{Si}})^2 - b^{(2)}_{\psi_{Si}}) +$$
$$a^{(1)}_{\psi_{Si}}(\psi_{Si} - c_{\psi_{Si}}) + a^{(2)}_{\theta_{LT}}((\theta_{LT} - c_{\theta_{LT}})^2 - b^{(2)}_{\theta_{LT}}) +$$
$$a^{(1)}_{\theta_{LT}}(\theta_{LT} - c_{\theta_{LT}}) + d_{T_{LT}T_S}(T_{LT} - c_{T_{LT}})(T_S - c_{T_S}) +$$
$$d_{T_{LT}T_N}(T_{LT} - c_{T_{LT}})(T_N - c_{T_N}) + d_{T_{LT}T_E}(T_{LT} - c_{T_{LT}})(T_E - c_{T_E}) +$$
$$d_{T_{LT}\psi_{Si}}(T_{LT} - c_{T_{LT}})(\psi_{Si} - c_{\psi_{Si}}) + d_{T_{LT}\theta_{LT}}(T_{LT} - c_{T_{LT}})(\theta_{LT} - c_{\theta_{LT}}) +$$
$$d_{T_S T_N}(T_S - c_{T_S})(T_N - c_{T_N}) + d_{T_S T_E}(T_S - c_{T_S})(T_E - c_{T_E}) +$$
$$d_{T_S\psi_{Si}}(T_S - c_{T_S})(\psi_{Si} - c_{\psi_{Si}}) + d_{T_S\theta_{LT}}(T_S - c_{T_S})(\theta_{TL} - c_{\theta_{LT}}) +$$

-continued $$d_{T_N T_E}(T_N - c_{T_N})(T_E - c_{T_E}) + d_{T_N \psi_{Si}}(T_N - c_{T_N})(\psi_{Si} - c_{\psi_{Si}}) +$$

$$d_{T_N \theta_{LT}}(T_N - c_{T_N})(\theta_{TL} - c_{\theta_{LT}}) + d_{T_E \psi_{Si}}(T_E - c_{T_E})(\psi_{Si} - c_{\psi_{Si}}) +$$

$$d_{T_E \theta_{LT}}(T_E - c_{T_E})(\theta_{TL} - c_{\theta_{LT}}) + d_{\psi_{Si} \theta_{LT}}(\psi_{Si} - c_{\psi_{Si}})(\theta_{TL} - c_{\theta_{LT}}) + e$$

Here, coefficients a, b, c, d, and e in the above Formula (1) are values listed in below Tables 1 to 11 determined in accordance with the crystal orientation of the support substrate, a type of higher order mode indicating either the first higher order mode, the second higher order mode, or the third higher order mode, and respective ranges of the wavelength normalized film thickness $T_S$ of the silicon oxide film, the wavelength normalized film thickness $T_{LT}$ of the piezoelectric body, and the propagation direction $\psi_{Si}$ inside the support substrate.

TABLE 1

| | Si(100) FIRST HIGHER ORDER MODE | |
|---|---|---|
| | $0 < T_{LT} < 0.25$ | $0.25 \leq T_{LT} \leq 3.5$ |
| $a_{TLT}^{(2)}$ | 0 | 0 |
| $a_{TLT}^{(1)}$ | −14.83429368 | 3.069902124 |
| $b_{TLT}^{(2)}$ | 0 | 0 |
| $c_{TLT}$ | 0.221296296 | 0.274301676 |
| $a_{TS}^{(2)}$ | 0 | 0 |
| $a_{TS}^{(1)}$ | −5.435055656 | −11.51705287 |
| $b_{TS}^{(2)}$ | 0 | 0 |
| $c_{TS}$ | 0.244907407 | 0.246648045 |
| $a_{TN}^{(3)}$ | 0 | 0 |
| $a_{TN}^{(2)}$ | 0 | 0 |
| $a_{TN}^{(1)}$ | 0.954625056 | 2.416190553 |
| $b_{TN}^{(3)}$ | 0 | 0 |
| $b_{TN}^{(2)}$ | 0 | 0 |
| $c_{TN}$ | 0.32037037 | 0.345810056 |
| $a_{TE}^{(2)}$ | 163.7465036 | 194.8374496 |
| $a_{TE}^{(1)}$ | 8.852421424 | 2.920900643 |
| $b_{TE}^{(2)}$ | 0.001465714 | 0.001392903 |
| $c_{TE}$ | 0.153587963 | 0.15377095 |
| $a_{\psi_{Si}}^{(4)}$ | 0 | 0 |
| $a_{\psi_{Si}}^{(3)}$ | 0 | 0 |
| $a_{\psi_{Si}}^{(2)}$ | 0 | 0.004515779 |
| $a_{\psi_{Si}}^{(1)}$ | 0.078396962 | 0.109748177 |
| $b_{\psi_{Si}}^{(4)}$ | 0 | 0 |
| $b_{\psi_{Si}}^{(3)}$ | 0 | 0 |
| $b_{\psi_{Si}}^{(2)}$ | 0 | 64.80134827 |
| $c_{\psi_{Si}}$ | 7.083333333 | 10.05586592 |
| $a_{\theta_{LT}}^{(2)}$ | 0 | 0 |
| $a_{\theta_{LT}}^{(1)}$ | −0.024815031 | 0.020111202 |
| $b_{\theta_{LT}}^{(2)}$ | 0 | 0 |
| $c_{\theta_{LT}}$ | −52.03703704 | −51.79888268 |
| $d_{TLTTS}$ | 0 | 0 |
| $d_{TLTTN}$ | 0 | 0 |
| $d_{TLTTE}$ | 0 | −307.8174848 |
| $d_{TLT\psi_{Si}}$ | 0 | 0 |
| $d_{TLT\theta_{LT}}$ | 1.483479323 | 0 |
| $d_{TSTN}$ | 0 | 0 |
| $d_{TSTE}$ | 0 | 0 |
| $d_{TS\psi_{Si}}$ | −1.673812731 | −1.384976956 |
| $d_{TS\theta_{LT}}$ | 0 | 0.672079071 |
| $d_{TNTE}$ | 0 | 0 |
| $d_{TN\psi_{Si}}$ | 0 | 0 |
| $d_{TN\theta_{LT}}$ | 0 | −0.108878788 |
| $d_{TE\psi_{Si}}$ | 0 | 0 |
| $d_{TE\theta_{LT}}$ | 0 | 0 |
| $d_{\psi_{Si}\theta_{LT}}$ | 0.002868735 | 0 |
| e | −2.09327176 | −2.154987875 |

TABLE 2

| | Si(110) FIRST HIGHER ORDER MODE | |
|---|---|---|
| | $0 \leq \psi_{Si} < 30$ | $30 \leq \psi_{Si} \leq 90$ |
| $a_{TLT}^{(2)}$ | 0 | 0 |
| $a_{TLT}^{(1)}$ | −12.83201212 | −9.646567168 |
| $b_{TLT}^{(2)}$ | 0 | 0 |
| $c_{TLT}$ | 0.256470588 | 0.250903614 |
| $a_{TS}^{(2)}$ | 156.859599 | 0 |
| $a_{TS}^{(1)}$ | −21.52776656 | −15.1877177 |
| $b_{TS}^{(2)}$ | 0.001522145 | 0 |
| $c_{TS}$ | 0.261176471 | 0.243825301 |
| $a_{TN}^{(3)}$ | 0 | 0 |
| $a_{TN}^{(2)}$ | 0 | 0 |
| $a_{TN}^{(1)}$ | 18.19696789 | 8.364202341 |
| $b_{TN}^{(3)}$ | 0 | 0 |
| $b_{TN}^{(2)}$ | 0 | 0 |
| $c_{TN}$ | 0.152941176 | 0.272891566 |
| $a_{TE}^{(2)}$ | 0 | 0 |
| $a_{TE}^{(1)}$ | −6.461494684 | −4.137739161 |
| $b_{TE}^{(2)}$ | 0 | 0 |
| $c_{TE}$ | 0.152941176 | 0.153463855 |
| $a_{\psi_{Si}}^{(4)}$ | 0 | 0 |
| $a_{\psi_{Si}}^{(3)}$ | 0 | 0 |
| $a_{\psi_{Si}}^{(2)}$ | −0.007084639 | −0.003013228 |
| $a_{\psi_{Si}}^{(1)}$ | −0.301466226 | −0.031376567 |
| $b_{\psi_{Si}}^{(4)}$ | 0 | 0 |
| $b_{\psi_{Si}}^{(3)}$ | 0 | 0 |
| $b_{\psi_{Si}}^{(2)}$ | 49.58131488 | 795.684243 |
| $c_{\psi_{Si}}$ | 25.35294118 | 60.63253012 |
| $a_{\theta_{LT}}^{(2)}$ | 0 | 0 |
| $a_{\theta_{LT}}^{(1)}$ | 0 | 0.009367138 |
| $b_{\theta_{LT}}^{(2)}$ | 0 | 0 |
| $c_{\theta_{LT}}$ | 0 | −52 |
| $d_{TLTTS}$ | 140.9204814 | 0 |
| $d_{TLTTN}$ | 0 | 24.32908352 |
| $d_{TLTTE}$ | 0 | 0 |
| $d_{TLT\psi_{Si}}$ | 0 | 0 |
| $d_{TLT\theta_{LT}}$ | 0 | 0 |
| $d_{TSTN}$ | 51.74259913 | 53.37502263 |
| $d_{TSTE}$ | 0 | 0 |
| $d_{TS\psi_{Si}}$ | 0 | 0 |
| $d_{TS\theta_{LT}}$ | 0 | 0 |
| $d_{TNTE}$ | 0 | 0 |
| $d_{TN\psi_{Si}}$ | 0 | −0.241253979 |
| $d_{TN\theta_{LT}}$ | 0 | 0 |
| $d_{TE\psi_{Si}}$ | 0 | 0 |
| $d_{TE\theta_{LT}}$ | 0 | 0.503490956 |
| $d_{\psi_{Si}\theta_{LT}}$ | 0 | 0 |
| e | −1.714086264 | −1.062610881 |

TABLE 3

| | Si(111) FIRST HIGHER ORDER MODE |
|---|---|
| $a_{TLT}^{(2)}$ | 0 |
| $a_{TLT}^{(1)}$ | −11.07513554 |
| $b_{TLT}^{(2)}$ | 0 |
| $c_{TLT}$ | 0.253819444 |
| $a_{TS}^{(2)}$ | 0 |
| $a_{TS}^{(1)}$ | −14.53606605 |
| $b_{TS}^{(2)}$ | 0 |
| $c_{TS}$ | 0.255555556 |
| $a_{TN}^{(3)}$ | 0 |
| $a_{TN}^{(2)}$ | −27.47980058 |
| $a_{TN}^{(1)}$ | 11.21718185 |
| $b_{TN}^{(3)}$ | 0 |
| $b_{TN}^{(2)}$ | 0.012775849 |
| $c_{TN}$ | 0.198611111 |
| $a_{TE}^{(2)}$ | 0 |
| $a_{TE}^{(1)}$ | 0 |
| $b_{TE}^{(2)}$ | 0 |
| $c_{TE}$ | 0 |
| $a_{\psi_{Si}}^{(4)}$ | 0 |
| $a_{\psi_{Si}}^{(3)}$ | 0 |

TABLE 3-continued

Si(111)
FIRST HIGHER ORDER MODE

| | |
|---|---|
| $a_{\psi Si}^{(2)}$ | 0 |
| $a_{\psi Si}^{(1)}$ | 0.199446167 |
| $b_{\psi Si}^{(4)}$ | 0 |
| $b_{\psi Si}^{(3)}$ | 0 |
| $b_{\psi Si}^{(2)}$ | 0 |
| $c_{\psi Si}$ | 31.80555556 |
| $a_{\theta LT}^{(2)}$ | 0 |
| $a_{\theta LT}^{(1)}$ | 0.020411672 |
| $b_{\theta LT}^{(2)}$ | 0 |
| $c_{\theta LT}$ | −49.55555556 |
| $d_{TLTTS}$ | 0 |
| $d_{TLTTN}$ | 59.65672759 |
| $d_{TLTTE}$ | 0 |
| $d_{TLT\psi Si}$ | 0 |
| $d_{TLT\theta LT}$ | 0 |
| $d_{TSTN}$ | 118.0753788 |
| $d_{TSTE}$ | 0 |
| $d_{TS\psi Si}$ | 0 |
| $d_{TS\theta LT}$ | 0 |
| $d_{TNTE}$ | 0 |
| $d_{TN\psi Si}$ | 0 |
| $d_{TN\theta LT}$ | 0 |
| $d_{TE\psi Si}$ | 0 |
| $d_{TE\theta LT}$ | 0 |
| $d_{\psi Si\theta LT}$ | 0 |
| e | −1.633231485 |

TABLE 4

Si(100)
SECOND HIGHER ORDER MODE

| | |
|---|---|
| $a_{TLT}^{(2)}$ | 0 |
| $a_{TLT}^{(1)}$ | −11.81358789 |
| $b_{TLT}^{(2)}$ | 0 |
| $c_{TLT}$ | 0.238372093 |
| $a_{TS}^{(2)}$ | 0 |
| $a_{TS}^{(1)}$ | 12.8161063 |
| $b_{TS}^{(2)}$ | 0 |
| $c_{TS}$ | 0.256511628 |
| $a_{TN}^{(3)}$ | 51.69588497 |
| $a_{TN}^{(2)}$ | −32.3186317 |
| $a_{TN}^{(1)}$ | −4.371415613 |
| $b_{TN}^{(3)}$ | 0.001717063 |
| $b_{TN}^{(2)}$ | 0.027148945 |
| $c_{TN}$ | 0.29627907 |
| $a_{TE}^{(2)}$ | 0 |
| $a_{TE}^{(1)}$ | 1.615825178 |
| $b_{TE}^{(2)}$ | 0 |
| $c_{TE}$ | 0.151744186 |
| $a_{\psi Si}^{(4)}$ | 0 |
| $a_{\psi Si}^{(3)}$ | 0.000212057 |
| $a_{\psi Si}^{(2)}$ | −0.001603831 |
| $a_{\psi Si}^{(1)}$ | −0.204451256 |
| $b_{\psi Si}^{(4)}$ | 0 |
| $b_{\psi Si}^{(3)}$ | −751.8827776 |
| $b_{\psi Si}^{(2)}$ | 48.11032991 |
| $c_{\psi Si}$ | 27.48837209 |
| $a_{\theta LT}^{(2)}$ | 0 |
| $a_{\theta LT}^{(1)}$ | 0.02976445 |
| $b_{\theta LT}^{(2)}$ | 0 |
| $c_{\theta LT}$ | −49.6744186 |
| $d_{TLTTS}$ | 0 |
| $d_{TLTTN}$ | 0 |
| $d_{TLTTE}$ | 107.5358299 |
| $d_{TLT\psi Si}$ | 0 |
| $d_{TLT\theta LT}$ | 0 |
| $d_{TSTN}$ | 0 |
| $d_{TSTE}$ | 0 |
| $d_{TS\psi Si}$ | 1.157163274 |
| $d_{TS\theta LT}$ | 0 |
| $d_{TNTE}$ | 0 |
| $d_{TN\psi Si}$ | −0.328790695 |
| $d_{TN\psi LT}$ | −0.146613553 |

TABLE 4-continued

Si(100)
SECOND HIGHER ORDER MODE

| | |
|---|---|
| $d_{TE\psi Si}$ | 0 |
| $d_{TE\theta LT}$ | 0 |
| $d_{\psi Si\theta LT}$ | 0 |
| e | −3.188900929 |

TABLE 5

Si(110)
SECOND HIGHER ORDER MODE

| | $0 \leq \psi_{Si} < 30$ | $30 \leq \psi_{Si} \leq 90$ |
|---|---|---|
| $a_{TLT}^{(2)}$ | 114.8844473 | 193.3812097 |
| $a_{TLT}^{(1)}$ | −8.088688831 | 0.512582429 |
| $b_{TLT}^{(2)}$ | 0.0016209 | 0.001754662 |
| $c_{TLT}$ | 0.254008909 | 0.251239669 |
| $a_{TS}^{(2)}$ | 0 | 0 |
| $a_{TS}^{(1)}$ | −7.32209573 | −6.329562725 |
| $b_{TS}^{(2)}$ | 0 | 0 |
| $c_{TS}$ | 0.252672606 | 0.271900826 |
| $a_{TN}^{(3)}$ | 0 | −81.37971878 |
| $a_{TN}^{(2)}$ | −8.528039509 | 39.7113193 |
| $a_{TN}^{(1)}$ | −1.120271161 | 0.826800765 |
| $b_{TN}^{(3)}$ | 0 | 0.006887919 |
| $b_{TN}^{(2)}$ | 0.053619178 | 0.025205929 |
| $c_{TN}$ | 0.423830735 | 0.200826446 |
| $a_{TE}^{(2)}$ | 0 | 0 |
| $a_{TE}^{(1)}$ | 9.909256206 | 0 |
| $b_{TE}^{(2)}$ | 0 | 0 |
| $c_{TE}$ | 0.160523385 | 0 |
| $a_{\psi Si}^{(4)}$ | 0 | 0 |
| $a_{\psi Si}^{(3)}$ | 0 | 0 |
| $a_{\psi Si}^{(2)}$ | 0 | 0.003197968 |
| $a_{\psi Si}^{(1)}$ | 0.018063648 | −0.015576788 |
| $b_{\psi Si}^{(4)}$ | 0 | 0 |
| $b_{\psi Si}^{(3)}$ | 0 | 0 |
| $b_{\psi Si}^{(2)}$ | 0 | 108.7630626 |
| $c_{\psi Si}$ | 8.797327394 | 38.92561983 |
| $a_{\theta LT}^{(2)}$ | 0 | 0 |
| $a_{\theta LT}^{(1)}$ | −0.003063309 | 0.049075185 |
| $b_{\theta LT}^{(2)}$ | 0 | 0 |
| $c_{\theta LT}$ | −49.54120267 | −48.89256198 |
| $d_{TLTTS}$ | 0 | −167.1962018 |
| $d_{TLTTN}$ | −32.41085998 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTN}$ | 33.06314431 | 0 |
| $d_{TSTE}$ | 124.8374401 | 0 |
| $d_{TS\psi Si}$ | 0 | 0.486860801 |
| $d_{TS\theta LT}$ | 0 | 0 |
| $d_{TNTE}$ | −38.52108083 | 0 |
| $d_{TN\psi Si}$ | 0 | 0 |
| $d_{TN\psi LT}$ | 0 | 0 |
| $d_{TE\psi Si}$ | 0 | 0 |
| $d_{TE\theta LT}$ | 0.494639958 | 0 |
| $d_{\psi Si\theta LT}$ | −0.001623976 | 0.014724275 |
| e | −2.271454108 | −2.472699496 |

TABLE 6

Si(111)
SECOND HIGHER ORDER MODE

| | $0 \leq \psi_{Si} < 30$ | $30 \leq \psi_{Si} \leq 60$ |
|---|---|---|
| $a_{TLT}^{(2)}$ | 0 | 0 |
| $a_{TLT}^{(1)}$ | −19.73613055 | −14.94881654 |
| $b_{TLT}^{(2)}$ | 0 | 0 |
| $c_{TLT}$ | 0.239145299 | 0.24607438 |
| $a_{TS}^{(2)}$ | 0 | 0 |
| $a_{TS}^{(1)}$ | −6.009225958 | 0.384596926 |

TABLE 6-continued

Si(111)
SECOND HIGHER ORDER MODE

| | $0 \leq \psi_{Si} < 30$ | $30 \leq \psi_{Si} \leq 60$ |
|---|---|---|
| $b_{TS}^{(2)}$ | 0 | 0 |
| $c_{TS}$ | 0.246837607 | 0.24862259 |
| $a_{TN}^{(3)}$ | 0 | 0 |
| $a_{TN}^{(2)}$ | −20.54217049 | −13.90920983 |
| $a_{TN}^{(1)}$ | −0.500198805 | −1.907891682 |
| $b_{TN}^{(3)}$ | 0 | 0 |
| $b_{TN}^{(2)}$ | 0.036939908 | 0.04540127 |
| $c_{TN}$ | 0.399487179 | 0.382644628 |
| $a_{TE}^{(2)}$ | 0 | 0 |
| $a_{TE}^{(1)}$ | 5.085265993 | 1.386937823 |
| $b_{TE}^{(2)}$ | 0 | 0 |
| $c_{TE}$ | 0.158376068 | 0.157438017 |
| $a_{\psi Si}^{(4)}$ | 0 | 0 |
| $a_{\psi Si}^{(3)}$ | 0 | 0 |
| $a_{\psi Si}^{(2)}$ | 0.001491321 | 0 |
| $a_{\psi Si}^{(1)}$ | 0.042768727 | −0.007722013 |
| $b_{\psi Si}^{(4)}$ | 0 | 0 |
| $b_{\psi Si}^{(3)}$ | 0 | 0 |
| $b_{\psi Si}^{(2)}$ | 159.6686391 | 0 |
| $c_{\psi Si}$ | 14.15384615 | 47.63085399 |
| $a_{\theta LT}^{(2)}$ | 0 | 0 |
| $a_{\theta LT}^{(1)}$ | 0.012313864 | 0 |
| $b_{\theta LT}^{(2)}$ | 0 | 0 |
| $c_{\theta LT}$ | −48.4034188 | 0 |
| $d_{TLTTS}$ | 0 | 0 |
| $d_{TLTTN}$ | −34.27397947 | −21.45483754 |
| $d_{TLTTE}$ | 0 | 0 |
| $d_{TLT\psi Si}$ | 0.278464842 | 0 |
| $d_{TLT\theta LT}$ | −0.425894828 | 0 |
| $d_{TSTN}$ | 46.58606596 | 0 |
| $d_{TSTE}$ | 92.95289822 | 102.0248205 |
| $d_{TS\psi Si}$ | 0 | 0.493711224 |
| $d_{TS\theta LT}$ | 0 | 0 |
| $d_{TNTE}$ | −26.83666562 | 0 |
| $d_{TN\psi Si}$ | −0.133932768 | −0.129081681 |
| $d_{TN\psi LT}$ | −0.107712568 | 0 |
| $d_{TE\psi Si}$ | 0 | 0 |
| $d_{TE\theta LT}$ | 0 | 0 |
| $d_{\psi Si\theta LT}$ | 0 | 0 |
| e | −2.444079693 | −1.863631594 |

TABLE 7

Si(100)
THIRD HIGHER ORDER MODE

| | |
|---|---|
| $a_{TLT}^{(2)}$ | 0 |
| $a_{TLT}^{(1)}$ | −13.69744796 |
| $b_{TLT}^{(2)}$ | 0 |
| $c_{TLT}$ | 0.242117117 |
| $a_{TS}^{(2)}$ | 0 |
| $a_{TS}^{(1)}$ | 21.67672451 |
| $b_{TS}^{(2)}$ | 0 |
| $c_{TS}$ | 0.24740991 |
| $a_{TN}^{(3)}$ | 0 |
| $a_{TN}^{(2)}$ | 0 |
| $a_{TN}^{(1)}$ | 0 |
| $b_{TN}^{(3)}$ | 0 |
| $b_{TN}^{(2)}$ | 0 |
| $c_{TN}$ | 0 |
| $a_{TE}^{(2)}$ | 0 |
| $a_{TE}^{(1)}$ | 0 |
| $b_{TE}^{(2)}$ | 0 |
| $c_{TE}$ | 0 |
| $a_{\psi Si}^{(4)}$ | 0 |
| $a_{\psi Si}^{(3)}$ | 0 |
| $a_{\psi Si}^{(2)}$ | 0 |
| $a_{\psi Si}^{(1)}$ | −0.012294125 |
| $b_{\psi Si}^{(4)}$ | 0 |
| $b_{\psi Si}^{(3)}$ | 0 |
| $b_{\psi Si}^{(2)}$ | 0 |
| $c_{\psi Si}$ | 23.5472973 |

TABLE 7-continued

Si(100)
THIRD HIGHER ORDER MODE

| | |
|---|---|
| $a_{\theta LT}^{(2)}$ | 0 |
| $a_{\theta LT}^{(1)}$ | −0.043141927 |
| $b_{\theta LT}^{(2)}$ | 0 |
| $c_{\theta LT}$ | −50.74774775 |
| $d_{TLTTS}$ | 0 |
| $d_{TLTTN}$ | 0 |
| $d_{TLTTE}$ | 0 |
| $d_{TLT\psi Si}$ | 0 |
| $d_{TLT\theta LT}$ | 1.006243214 |
| $d_{TSTN}$ | 0 |
| $d_{TSTE}$ | 0 |
| $d_{TS\psi Si}$ | 0 |
| $d_{TS\theta LT}$ | 0 |
| $d_{TNTE}$ | 0 |
| $d_{TN\psi Si}$ | 0 |
| $d_{TN\psi LT}$ | 0 |
| $d_{TE\psi Si}$ | 0 |
| $d_{TE\theta LT}$ | 0 |
| $d_{\psi Si\theta LT}$ | −0.002432123 |
| e | −2.624644502 |

TABLE 8

Si(110)
THIRD HIGHER ORDER MODE

| | $0 \leq \psi_{Si} < 30$ | $30 \leq \psi_{Si} \leq 90$ |
|---|---|---|
| $a_{TLT}^{(2)}$ | 0 | 0 |
| $a_{TLT}^{(1)}$ | −11.03265079 | 0 |
| $b_{TLT}^{(2)}$ | 0 | 0 |
| $c_{TLT}$ | 0.256828704 | 0 |
| $a_{TS}^{(2)}$ | 0 | 0 |
| $a_{TS}^{(1)}$ | −4.308771413 | 0.663966622 |
| $b_{TS}^{(2)}$ | 0 | 0 |
| $c_{TS}$ | 0.254976852 | 0.252631579 |
| $a_{TN}^{(3)}$ | 0 | −41.616937 |
| $a_{TN}^{(2)}$ | 0 | 15.26191272 |
| $a_{TN}^{(1)}$ | 0.749735997 | 1.074574236 |
| $b_{TN}^{(3)}$ | 0 | 0.006033304 |
| $b_{TN}^{(2)}$ | 0 | 0.043147922 |
| $c_{TN}$ | 0.380092593 | 0.303157895 |
| $a_{TE}^{(2)}$ | 0 | 0 |
| $a_{TE}^{(1)}$ | −0.678702233 | 11.03955295 |
| $b_{TE}^{(2)}$ | 0 | 0 |
| $c_{TE}$ | 0.155960648 | 0.160921053 |
| $a_{\psi Si}^{(4)}$ | 0 | 0 |
| $a_{\psi Si}^{(3)}$ | 0 | 0 |
| $a_{\psi Si}^{(2)}$ | 0 | 0 |
| $a_{\psi Si}^{(1)}$ | 0.020332938 | 0.010235202 |
| $b_{\psi Si}^{(4)}$ | 0 | 0 |
| $b_{\psi Si}^{(3)}$ | 0 | 0 |
| $b_{\psi Si}^{(2)}$ | 0 | 0 |
| $c_{\psi Si}$ | 5.99537037 | 66.78947368 |
| $a_{\theta LT}^{(2)}$ | −0.003658214 | 0 |
| $a_{\theta LT}^{(1)}$ | 0.048112599 | 0.016635787 |
| $b_{\theta LT}^{(2)}$ | 71.1933299 | 0 |
| $c_{\theta LT}$ | −50.89814815 | −49.93684211 |
| $d_{TLTTS}$ | 0 | 0 |
| $d_{TLTTN}$ | 0 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTN}$ | 0 | 0 |
| $d_{TSTE}$ | 0 | −0.323118596 |
| $d_{TS\psi Si}$ | 0 | 0.713957036 |
| $d_{TS\theta LT}$ | 0 | 0 |
| $d_{TNTE}$ | 0 | 0 |
| $d_{TN\psi Si}$ | −0.144459086 | 0 |
| $d_{TN\psi LT}$ | 0 | 0 |

TABLE 8-continued

Si(110)
THIRD HIGHER ORDER MODE

| | $0 \leq \psi_{Si} < 30$ | $30 \leq \psi_{Si} \leq 90$ |
|---|---|---|
| $d_{TE\psi Si}$ | 0.79407423 | 0.334206608 |
| $d_{TE\theta LT}$ | 0 | 0 |
| $d_{\psi Si\theta LT}$ | −0.002496666 | 0.001289273 |
| e | −2.360031711 | −3.077359987 |

TABLE 9

Si(111)
THIRD HIGHER ORDER MODE
$0 < T_{LT} < 0.25$
$0 \leq \psi_{Si} < 30$

| $a_{TLT}^{(2)}$ | 0 |
|---|---|
| $a_{TLT}^{(1)}$ | −23.116307 |
| $b_{TLT}^{(2)}$ | 0 |
| $c_{TLT}$ | 0.2289801 |
| $a_{TS}^{(2)}$ | 0 |
| $a_{TS}^{(1)}$ | −14.28753349 |
| $b_{TS}^{(2)}$ | 0 |
| $c_{TS}$ | 0.260572139 |
| $a_{TN}^{(3)}$ | 0 |
| $a_{TN}^{(2)}$ | 0 |
| $a_{TN}^{(1)}$ | −0.440595972 |
| $b_{TN}^{(3)}$ | 0 |
| $b_{TN}^{(2)}$ | 0 |
| $c_{TN}$ | 0.411940299 |
| $a_{TE}^{(2)}$ | 0 |
| $a_{TE}^{(1)}$ | 0 |
| $b_{TE}^{(2)}$ | 0 |
| $c_{TE}$ | 0 |
| $a_{\psi Si}^{(4)}$ | 0 |
| $a_{\psi Si}^{(3)}$ | 0 |
| $a_{\psi Si}^{(2)}$ | 0 |
| $a_{\psi Si}^{(1)}$ | 0.029126872 |
| $b_{\psi Si}^{(4)}$ | 0 |
| $b_{\psi Si}^{(3)}$ | 0 |
| $b_{\psi Si}^{(2)}$ | 0 |
| $c_{\psi Si}$ | 11.96517413 |
| $a_{\theta LT}^{(2)}$ | 0 |
| $a_{\theta LT}^{(1)}$ | 0 |
| $b_{\theta LT}^{(2)}$ | 0 |
| $c_{\theta LT}$ | 0 |
| $d_{TLTTS}$ | 0 |
| $d_{TLTTN}$ | 0 |
| $d_{TLTTE}$ | 0 |
| $d_{TLT\psi Si}$ | 0 |
| $d_{TLT\theta LT}$ | 0 |
| $d_{TSTN}$ | 0 |
| $d_{TSTE}$ | 0 |
| $d_{TS\psi Si}$ | 0.930830627 |
| $d_{TS\theta LT}$ | 0 |
| $d_{TNTE}$ | 0 |
| $d_{TN\psi Si}$ | −0.129081681 |
| $d_{TN\psi LT}$ | 0 |
| $d_{TE\psi Si}$ | 0 |
| $d_{TE\theta LT}$ | 0 |
| $d_{\psi Si\theta LT}$ | 0 |
| e | −2.122238265 |

TABLE 10

Si(111)
THIRD HIGHER ORDER MODE
$0 < T_{LT} < 0.25$
$30 \leq \psi_{Si} \leq 60$

| | $0 < T_N < 0.3$ | $0.3 \leq T_N < 0.5$ | $0.5 \leq T_N \leq 2.0$ |
|---|---|---|---|
| $a_{TLT}^{(2)}$ | 0 | 0 | 0 |
| $a_{TLT}^{(1)}$ | −8.85598025 | −13.00016665 | −14.59159182 |
| $b_{TLT}^{(2)}$ | 0 | 0 | 0 |
| $c_{TLT}$ | 0.228097345 | 0.22804878 | 0.228054299 |
| $a_{TS}^{(2)}$ | 103.6914504 | 0 | 0 |
| $a_{TS}^{(1)}$ | −1.916300209 | −1.043153875 | −2.152482595 |
| $b_{TS}^{(2)}$ | 0.001674808 | 0 | 0 |
| $c_{TS}$ | 0.25420354 | 0.254634146 | 0.251809955 |
| $a_{TN}^{(3)}$ | 0 | 0 | 0 |
| $a_{TN}^{(2)}$ | 0 | 0 | 0 |
| $a_{TN}^{(1)}$ | −2.052521715 | 1.895724222 | −3.806230027 |
| $b_{TN}^{(3)}$ | 0 | 0 | 0 |
| $b_{TN}^{(2)}$ | 0 | 0 | 0 |
| $c_{TN}$ | 0.187610619 | 0.403414634 | 0.604072398 |
| $a_{TE}^{(2)}$ | 0 | 0 | 0 |
| $a_{TE}^{(1)}$ | 6.773288364 | 5.622244745 | 4.676153327 |
| $b_{TE}^{(2)}$ | 0 | 0 | 0 |
| $c_{TE}$ | 0.163274336 | 0.167317073 | 0.16561086 |
| $a_{\psi Si}^{(4)}$ | 0 | 0 | 0 |
| $a_{\psi Si}^{(3)}$ | 0 | 0 | 0 |
| $a_{\psi Si}^{(2)}$ | 0 | 0 | 0 |
| $a_{\psi Si}^{(1)}$ | −0.035810857 | 0 | 0.001284581 |
| $b_{\psi Si}^{(4)}$ | 0 | 0 | 0 |
| $b_{\psi Si}^{(3)}$ | 0 | 0 | 0 |
| $b_{\psi Si}^{(2)}$ | 0 | 0 | 0 |
| $c_{\psi Si}$ | 50.7079646 | 0 | 47.46606335 |
| $a_{\theta LT}^{(2)}$ | −0.004232627 | −0.004038546 | 0 |
| $a_{\theta LT}^{(1)}$ | 0.047188385 | 0.050497193 | 0.025858407 |
| $b_{\theta LT}^{(2)}$ | 70.63732477 | 71.2056157 | 0 |
| $c_{\theta LT}$ | −50.2300885 | −50.47804878 | −50.00904977 |
| $d_{TLTTS}$ | 0 | 144.8256764 | 175.1562687 |
| $d_{TLTTN}$ | 0 | −71.99871186 | 62.29352459 |
| $d_{TLTTE}$ | 0 | 0 | 0 |
| $d_{TLT\psi Si}$ | 0 | 0 | 0.579045093 |
| $d_{TLT\theta LT}$ | 0 | 0 | 0 |
| $d_{TSTN}$ | 0 | 0 | 0 |
| $d_{TSTE}$ | 0 | 0 | 0 |
| $d_{TS\psi Si}$ | 0 | 0.421981204 | 0 |
| $d_{TS\theta LT}$ | 0.662353425 | 0.864834339 | 0.455548641 |
| $d_{TNTE}$ | 0 | 0 | 0 |
| $d_{TN\psi Si}$ | 0 | 0 | 0.218878849 |
| $d_{TN\psi LT}$ | 0 | 0 | −0.178003295 |
| $d_{TE\psi Si}$ | 0 | 0 | 0 |
| $d_{TE\theta LT}$ | 0 | 0 | 0 |
| $d_{\psi Si\theta LT}$ | 0.002492698 | 0.002050178 | 0 |
| e | −1.992833526 | −1.990755952 | −2.158637111 |

TABLE 11

Si(111)
THIRD HIGHER ORDER MODE
$0.25 \leq T_{LT} \leq 3.5$

| | $0 \leq \psi_{Si} < 30$ | $30 \leq \psi_{Si} \leq 60$ |
|---|---|---|
| $a_{TLT}^{(2)}$ | 0 | 0 |
| $a_{TLT}^{(1)}$ | −4.28090475 | 0 |
| $b_{TLT}^{(2)}$ | 0 | 0 |
| $c_{TLT}$ | 0.275829876 | 0 |
| $a_{TS}^{(2)}$ | 0 | 0 |
| $a_{TS}^{(1)}$ | −10.77092012 | −1.545108081 |
| $b_{TS}^{(2)}$ | 0 | 0 |
| $c_{TS}$ | 0.254356846 | 0.254105263 |
| $a_{TN}^{(3)}$ | 0 | 0 |
| $a_{TN}^{(2)}$ | 0 | 0 |
| $a_{TN}^{(1)}$ | −0.547621988 | −0.893667583 |
| $b_{TN}^{(3)}$ | 0 | 0 |
| $b_{TN}^{(2)}$ | 0 | 0 |
| $c_{TN}$ | 0.396680498 | 0.392631579 |
| $a_{TE}^{(2)}$ | 0 | 0 |

TABLE 11-continued

Si(111)
THIRD HIGHER ORDER MODE
$0.25 \leq T_{LT} \leq 3.5$

| | $0 \leq \psi_{Si} < 30$ | $30 \leq \psi_{Si} \leq 60$ |
|---|---|---|
| $a_{TE}^{(1)}$ | 0 | 0.708331426 |
| $b_{TE}^{(2)}$ | 0 | 0 |
| $c_{TE}$ | 0 | 0.159684211 |
| $a_{\psi Si}^{(4)}$ | 0 | 0 |
| $a_{\psi Si}^{(3)}$ | 0 | 0 |
| $a_{\psi Si}^{(2)}$ | 0 | 0 |
| $a_{\psi Si}^{(1)}$ | 0.033675166 | −0.011260677 |
| $b_{\psi Si}^{(4)}$ | 0 | 0 |
| $b_{\psi Si}^{(3)}$ | 0 | 0 |
| $b_{\psi Si}^{(2)}$ | 0 | 0 |
| $c_{\psi Si}$ | 11.70124481 | 48.21052632 |
| $a_{\theta LT}^{(2)}$ | 0 | −0.003806532 |
| $a_{\theta LT}^{(1)}$ | −0.012544759 | 0.039951436 |
| $b_{\theta LT}^{(2)}$ | 0 | 67.93672687 |
| $c_{\theta LT}$ | −49.37759336 | −49.42315789 |
| $d_{TLTTS}$ | 122.2019913 | 0 |
| $d_{TLTTN}$ | 0 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTN}$ | 0 | 0 |
| $d_{TSTE}$ | 0 | 0 |
| $d_{TS\psi Si}$ | 0.657009296 | −0.317058863 |
| $d_{TS\theta LT}$ | 0 | 0.702776192 |
| $d_{TNTE}$ | 0 | −16.38117608 |
| $d_{TN\psi Si}$ | −0.139004432 | 0.128605996 |
| $d_{TN\psi LT}$ | 0 | 0 |
| $d_{TE\psi Si}$ | 0 | 0 |
| $d_{TE\theta LT}$ | 0 | 0 |
| $d_{\psi Si\theta LT}$ | 0.001351095 | 0.001928116 |
| e | −2.653122338 | −2.237232738 |

In a preferred embodiment of the acoustic wave device according to the present invention, $I_h$ for the first higher order mode and $I_h$ for the second higher order mode are greater than about −2.4.

In a preferred embodiment of the acoustic wave device according to the present invention, $I_h$ for the first higher order mode and $I_h$ for the third higher order mode are greater than about −2.4.

In a preferred embodiment of the acoustic wave device according to the present invention, $I_h$ for the second higher order mode and $I_h$ for the third higher order mode are greater than about −2.4.

In a preferred embodiment of the acoustic wave device according to the present invention, it is preferable that $I_h$ for the first higher order mode, $I_h$ for the second higher order mode, and $I_h$ for the third higher order mode are all greater than about −2.4. In this case, the responses for all of the first higher order mode, the second higher order mode, and the third higher order mode can be effectively reduced or prevented.

In a preferred embodiment of the acoustic wave device according to the present invention, a thickness of the piezoelectric body is less than or equal to about 3.5λ.

In a preferred embodiment of the acoustic wave device according to the present invention, a thickness of the piezoelectric body is less than or equal to about 2.5λ.

In a preferred embodiment of the acoustic wave device according to the present invention, a thickness of the piezoelectric body is less than or equal to about 1.5λ.

In a referred embodiment of the acoustic wave device according to the present invention, a thickness of the piezoelectric body is less than or equal to about 0.5λ.

In a preferred embodiment of the acoustic wave device according the present invention, an acoustic wave resonator is provided as the acoustic wave device.

An acoustic wave filter according to a preferred embodiment of the present invention includes a plurality of resonators. At least one resonator of the plurality of resonators is defined by an acoustic wave device according to a preferred embodiment of the present invention. Therefore, an acoustic wave filter is obtained in which at least one response out of the first, second, and third higher order modes is reduced or prevented.

A multiplexer according to a preferred embodiment of the present invention includes N (N is greater than or equal to 2) acoustic wave filters having different pass bands from each other. First terminals of the N acoustic wave filters are connected to each other via a common connection on an antenna terminal side. At least one acoustic wave filter of the N acoustic wave filters except for the acoustic wave filter having the highest pass band includes one or more acoustic wave resonators. At least one acoustic wave resonator of the one or more acoustic wave resonators is an acoustic wave device according to a preferred embodiment of the present invention.

The multiplexers according to preferred embodiments of the present invention are preferably used as a carrier aggregation composite filter device.

In addition, a radio-frequency front end circuit according to a preferred embodiment of the present invention includes an acoustic wave filter including an acoustic wave device according to a preferred embodiment of the present invention and a power amplifier connected to the acoustic wave filter.

A communication device according to a preferred embodiment of the present invention includes a radio-frequency front end circuit including an acoustic wave filter including an acoustic wave device according to a preferred embodiment of the present invention, and a power amplifier connected to the acoustic wave filter, and an RF signal processing circuit.

With acoustic wave devices, radio-frequency front end circuits, and communication devices according to preferred embodiments of the present invention, at least one of the response of the first higher order mode, the response of the second higher order mode, and the response of the third higher order mode, which are located on the high-frequency side of the main mode, can be effectively reduced or prevented. Therefore, it is unlikely that a ripple due to a higher order mode will be generated in another band pass filter having a pass band at a higher frequency than that of the acoustic wave devices in the radio-frequency front end circuits and the communication devices including the acoustic wave devices of preferred embodiments of the present invention.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, the present invention will be described in accordance with specific preferred embodiments of the present invention with reference to the drawings.

The preferred embodiments described in the present specification are merely illustrative examples and it should be noted that elements and portions of the configurations illustrated in different preferred embodiments can be substituted for one another or combined with one another if so desired.

Figure 1A:
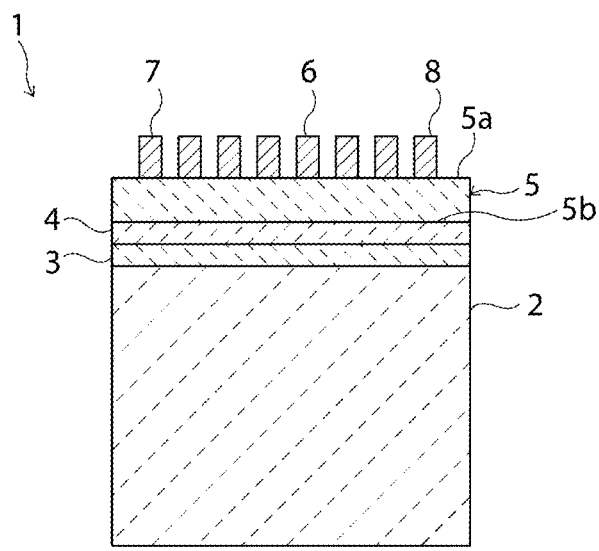
FIG. 1A is a schematic front sectional view of an acoustic wave device according to a first preferred embodiment of the present invention and FIG. 1B is a schematic plan view illustrating the electrode structure of the acoustic wave device.
Figure 1B:
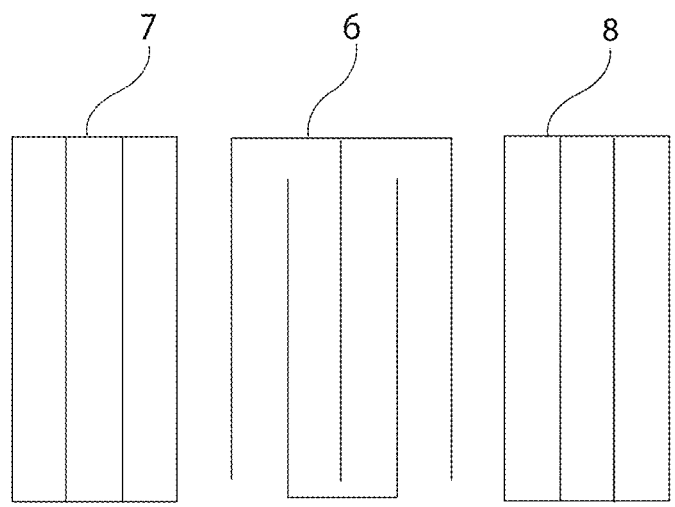

FIG. 1A is a schematic front sectional view of an acoustic wave device of a first preferred embodiment of the present invention and FIG. 1B is a schematic plan view illustrating the electrode structure of the acoustic wave device.

An acoustic wave device 1 is a one-port acoustic wave resonator. The acoustic wave device 1 preferably includes a support substrate 2, a silicon nitride film 3 stacked on the support substrate 2, a silicon oxide film 4 stacked on the silicon nitride film 3, a piezoelectric body 5 stacked on the silicon oxide film 4, and an InterDigital Transducer (IDT) electrode 6 provided on the piezoelectric body 5.

The support substrate 2 is preferably a single crystal silicon substrate, for example. The single crystal silicon may be doped with impurities. The silicon nitride film 3 is preferably a SiN film, and the silicon oxide film 4 is preferably a SiO$_2$ film, for example. The piezoelectric body 5 is made of lithium tantalate (LiTaO$_3$). The lithium tantalate may be doped with Fe or the like. The piezoelectric body 5 includes first and second main surfaces 5a and 5b, which oppose each other. The IDT electrode 6 is provided on the first main surface 5a. Reflectors 7 and 8 are provided on both sides of the IDT electrode 6 in an acoustic wave propagation direction.

The silicon nitride film 3 is not limited to being a SiN film and SiN may be doped with another element. In addition, the silicon oxide film 4 may include not only SiO, and, for example, may include silicon oxide obtained by doping SiO$_2$ with fluorine or the like.

Furthermore, the silicon oxide film 4 may have a multilayer structure including a plurality of layers and an intermediate layer made of titanium, nickel or the like, for example, between the plurality of layers. In other words, the silicon oxide film 4 may have a multilayer structure in which a first silicon oxide film, an intermediate layer, and a second silicon oxide film are sequentially stacked from the support substrate 2 side. The wavelength normalized thickness of the silicon oxide film 4 in this case represents the thickness of the entire multilayer structure. Furthermore, the silicon nitride film 3 may have a multilayer structure including a plurality of layers and an intermediate layer made of titanium, nickel or the like, for example, between the plurality of layers. In other words, the silicon nitride film 3 may have a multilayer structure in which a first silicon nitride film, an intermediate layer, and a second silicon nitride film are sequentially stacked from the support substrate 2 side. The wavelength normalized thickness of the silicon nitride film 3 in this case refers to the thickness of the entire multilayer structure.

In the acoustic wave resonator having a structure in which the piezoelectric body 5 made of lithium tantalate is directly or indirectly stacked on the support substrate 2, the inventors of preferred embodiments of the present application discovered that responses are generated due to the below-described first, second, and third higher order modes.

Figure 2:
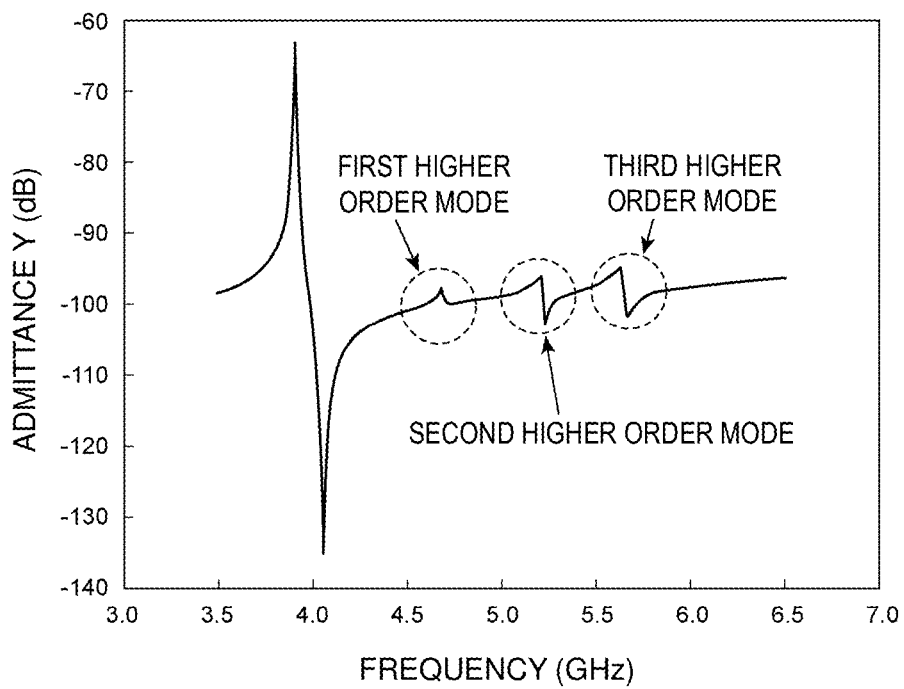
FIG. 2 is a diagram illustrating an admittance characteristic of an acoustic wave resonator.

FIG. 2 is a diagram illustrating an admittance characteristic of an acoustic wave resonator explaining the first to third higher order modes. The admittance characteristic illustrated in FIG. 2 is not the admittance characteristic of an acoustic wave resonator of a preferred embodiment of the present invention but rather the admittance characteristic of an acoustic wave resonator having the following parameters:

Euler angles ($\phi_{Si}$, $\theta_{Si}$, $\psi_{Si}$) of support substrate 2=(about 0°, about 0°, about 45'). Film thickness of silicon oxide film 4=about 0.30λ, film thickness of piezoelectric body 5=about 0.30λ, Euler angles ($\phi_{LT}$, $\theta_{LT}$, $\psi_{LT}$) of piezoelectric body= (0°, −40°, 0°). λ is a wavelength determined by the electrode finger pitch of the IDT electrode 6 and λ=about 1 µm. The IDT electrode 6 is made of a multilayer metal film in which an Al film and a Ti film are stacked and a thickness thereof expressed as an aluminum thickness from the thicknesses and densities of the individual electrode layers is about 0.05λ.

As is clear from FIG. 2, in the above-described acoustic wave resonator, responses of a first higher order mode, a second higher order mode, and a third higher order mode appear on the high-frequency side of the response of the main mode. Here, "main mode" refers to the resonant mode used to obtain the desired frequency characteristic. The frequency positions are as follows: first higher order mode response<second higher order mode response<third higher order mode response. The response of the first higher order mode is closest to the response of the main mode. However, FIG. 2 is merely an example, and the positional relationships between the frequencies of the respective modes may be interchanged depending on conditions, such as electrode thickness.

A feature of the acoustic wave device 1 of the present preferred embodiment is that at least one response among the response of the first higher order mode, the response of the second higher order mode, and the response of the third higher order mode is reduced or prevented.

λ is a wavelength determined by the electrode finger pitch of the IDT electrode 6. $T_{LT}$ is the wavelength normalized film thickness of the piezoelectric body 5 made of lithium tantalate, $\theta_{LT}$ is the Euler angle θ of the piezoelectric body made of lithium tantalate, $T_N$ is the wavelength normalized film thickness of the silicon nitride film 3, $T_S$ is the wavelength normalized film thickness of the silicon oxide film 4, $T_E$ is the wavelength normalized film thickness of the IDT electrode 6 expressed as an aluminum thickness from the thicknesses and densities of the individual electrode layers, $\psi_{Si}$ is the propagation direction inside the support substrate 2, and $T_{Si}$ is the wavelength normalized film thickness of the support substrate 2.

$T_{LT}$, $\theta_{LT}$, $T_N$, $T_S$, $T_E$, and $\psi_{Si}$ are set so that at least one $I_h$ of $I_h$ corresponding to the response intensity of the first higher order mode, $I_h$ corresponding to the response intensity of the second higher order mode, and $I_h$ corresponding to the response intensity of the third higher order mode as expressed by below Formula (1) is greater than about −2.4, and $T_{Si}$>about 20. As a result, at least one out of the responses of the first, second, and third higher order modes is effectively reduced or prevented. This will be described in detail below.

In this specification, a "wavelength normalized film thickness" is a value obtained by normalizing the thickness of a film using the wavelength λ determined by the electrode finger pitch of an IDT electrode. Therefore, a wavelength normalized film thickness is value obtained by dividing the actual thickness by λ. The wavelength λ determined by the electrode finger pitch of the IDT electrode may be determined using the average value of the electrode finger pitch.

The wavelength normalized film thickness $T_E$ of the IDT electrode 6, which is expressed as an aluminum thickness, is obtained by calculating the product of the wavelength normalized film thickness of the IDT electrode and the ratio of the density of the IDT electrode 6 to the density of aluminum. In this case, when there are a plurality of electrode layers as in the IDT electrode 6, the wavelength normalized film thickness $T_E$ of the IDT electrode 6 expressed as an aluminum thickness is calculated by obtaining the density of the IDT electrode 6 from the thicknesses and densities of the individual electrode layers.

Formula (1)

$$I_h = a_{T_{LT}}^{(2)}\left((T_{LT} - c_{T_{LT}})^2 - b_{T_{LT}}^{(2)}\right) + a_{T_{LT}}^{(1)}(T_{LT} - c_{T_{LT}}) +$$

$$a_{T_S}^{(2)}\left((T_S - c_{T_S})^2 - b_{T_S}^{(2)}\right) + a_{T_S}^{(1)}(T_S - c_{T_S}) + a_{T_N}^{(3)}\left((T_N - c_{T_N})^3 - b_{T_N}^{(3)}\right) +$$

$$a_{T_N}^{(2)}\left((T_N - c_{T_N})^2 - b_{T_N}^{(2)}\right) + a_{T_N}^{(1)}(T_N - c_{T_N}) + a_{T_E}^{(2)}\left((T_E - c_{T_E})^2 - b_{T_E}^{(2)}\right) +$$

-continued $$a_{T_E}^{(1)}(T_E - c_{T_E}) + a_{\psi_{Si}}^{(4)}((\psi_{Si} - c_{\psi_{Si}})^4 - b_{\psi_{Si}}^{(4)}) +$$
$$a_{\psi_{Si}}^{(3)}((\psi_{Si} - c_{\psi_{Si}})^3 - b_{\psi_{Si}}^{(3)}) + a_{\psi_{Si}}^{(2)}((\psi_{Si} - c_{\psi_{Si}})^2 - b_{\psi_{Si}}^{(2)}) +$$
$$a_{\psi_{Si}}^{(1)}(\psi_{Si} - c_{\psi_{Si}}) + a_{\theta_{LT}}^{(2)}((\theta_{LT} - c_{\theta_{LT}})^2 - b_{\theta_{LT}}^{(2)}) +$$
$$a_{\theta_{LT}}^{(1)}(\theta_{LT} - c_{\theta_{LT}}) + d_{T_{LT}T_S}(T_{LT} - c_{T_{LT}})(T_S - c_{T_S}) +$$
$$d_{T_{LT}T_N}(T_{LT} - c_{T_{LT}})(T_N - c_{T_N}) + d_{T_{LT}T_E}(T_{LT} - c_{T_{LT}})(T_E - c_{T_E}) +$$
$$d_{T_{LT}\psi_{Si}}(T_{LT} - c_{T_{LT}})(\psi_{Si} - c_{\psi_{Si}}) + d_{T_{LT}\theta_{LT}}(T_{LT} - c_{T_{LT}})(\theta_{LT} - c_{\theta_{LT}}) +$$
$$d_{T_ST_N}(T_S - c_{T_S})(T_N - c_{T_N}) + d_{T_ST_E}(T_S - c_{T_S})(T_E - c_{T_E}) +$$
$$d_{T_S\psi_{Si}}(T_S - c_{T_S})(\psi_{Si} - c_{\psi_{Si}}) + d_{T_S\theta_{LT}}(T_S - c_{T_S})(\theta_{TL} - c_{\theta_{LT}}) +$$
$$d_{T_NT_E}(T_N - c_{T_N})(T_E - c_{T_E}) + d_{T_N\psi_{Si}}(T_N - c_{T_N})(\psi_{Si} - c_{\psi_{Si}}) +$$
$$d_{T_N\theta_{LT}}(T_N - c_{T_N})(\theta_{TL} - c_{\theta_{LT}}) + d_{T_E\psi_{Si}}(T_E - c_{T_E})(\psi_{Si} - c_{\psi_{Si}}) +$$
$$d_{T_E\theta_{LT}}(T_E - c_{T_E})(\theta_{TL} - c_{\theta_{LT}}) + d_{\psi_{Si}\theta_{LT}}(\psi_{Si} - c_{\psi_{Si}})(\theta_{TL} - c_{\theta_{LT}}) + e$$

Here, coefficients a, b, c, d, and e in the Formula (1) have values listed in below Tables 12 to 22 determined in accordance the crystal orientation of the support substrate 2, the type of higher order mode indicating either the first higher order mode, the second higher order mode, or the third higher order mode, and the respective ranges of the wavelength normalized film thickness $T_S$ of the silicon oxide film 4, the wavelength normalized film thickness $T_{LT}$ of the piezoelectric body made of lithium tantalate, the propagation direction $\psi_{Si}$ inside the support substrate 2, and so forth. In Tables 12 to 22, Si(100), Si(110), or Si(111) represents the crystal orientation of the single crystal Si constituting the support substrate 2. These crystal orientations will be described in detail later.

TABLE 12

| | Si(100) FIRST HIGHER ORDER MODE | |
|---|---|---|
| | $0 < T_{LT} < 0.25$ | $0.25 \leq T_{LT} \leq 3.5$ |
| $a_{TLT}^{(2)}$ | 0 | 0 |
| $a_{TLT}^{(1)}$ | −14.83429368 | 3.069902124 |
| $b_{TLT}^{(2)}$ | 0 | 0 |
| $c_{TLT}$ | 0.221296296 | 0.274301676 |
| $a_{TS}^{(2)}$ | 0 | 0 |
| $a_{TS}^{(1)}$ | −5.435055656 | −11.51705287 |
| $b_{TS}^{(2)}$ | 0 | 0 |
| $c_{TS}$ | 0.244907407 | 0.246648045 |
| $a_{TN}^{(3)}$ | 0 | 0 |
| $a_{TN}^{(2)}$ | 0 | 0 |
| $a_{TN}^{(1)}$ | 0.954625056 | 2.416190553 |
| $b_{TN}^{(3)}$ | 0 | 0 |
| $b_{TN}^{(2)}$ | 0 | 0 |
| $c_{TN}$ | 0.32037037 | 0.345810056 |
| $a_{TE}^{(2)}$ | 163.7465036 | 194.8374496 |
| $a_{TE}^{(1)}$ | 8.852421424 | 2.920900643 |
| $b_{TE}^{(2)}$ | 0.001465714 | 0.001392903 |
| $c_{TE}$ | 0.153567963 | 0.15377095 |
| $a_{\psi Si}^{(4)}$ | 0 | 0 |
| $a_{\psi Si}^{(3)}$ | 0 | 0 |
| $a_{\psi Si}^{(2)}$ | 0 | 0.004515779 |
| $a_{\psi Si}^{(1)}$ | 0.078396962 | 0.109748177 |
| $b_{\psi Si}^{(4)}$ | 0 | 0 |
| $b_{\psi Si}^{(3)}$ | 0 | 0 |
| $b_{\psi Si}^{(2)}$ | 0 | 64.80134827 |
| $c_{\psi Si}$ | 7.083333333 | 10.05586592 |
| $a_{\theta LT}^{(2)}$ | 0 | 0 |
| $a_{\theta LT}^{(1)}$ | −0.024815031 | 0.020111202 |
| $b_{\theta LT}^{(2)}$ | 0 | 0 |
| $c_{\theta LT}$ | −52.03703704 | −51.79888268 |
| $d_{TLTTS}$ | 0 | 0 |
| $d_{TLTTN}$ | 0 | 0 |
| $d_{TLTTE}$ | 0 | −307.8174848 |

TABLE 12-continued

| | Si(100) FIRST HIGHER ORDER MODE | |
|---|---|---|
| | $0 < T_{LT} < 0.25$ | $0.25 \leq T_{LT} \leq 3.5$ |
| $d_{TLT\psi Si}$ | 0 | 0 |
| $d_{TLT\theta LT}$ | 1.483479323 | 0 |
| $d_{TSTN}$ | 0 | 0 |
| $d_{TSTE}$ | 0 | 0 |
| $d_{TS\psi Si}$ | −1.673812731 | −1.384976956 |
| $d_{TS\theta LT}$ | 0 | 0.672079071 |
| $d_{TNTE}$ | 0 | 0 |
| $d_{TN\psi Si}$ | 0 | 0 |
| $d_{TN\psi LT}$ | 0 | −0.108878788 |
| $d_{TE\psi Si}$ | 0 | 0 |
| $d_{TE\theta LT}$ | 0 | 0 |
| $d_{\psi Si\theta LT}$ | 0.002868735 | 0 |
| e | −2.09327176 | −2.154987875 |

TABLE 13

| | Si(110) FIRST HIGHER ORDER MODE | |
|---|---|---|
| | $0 \leq \psi_{Si} < 30$ | $30 \leq \psi_{Si} \leq 90$ |
| $a_{TLT}^{(2)}$ | 0 | 0 |
| $a_{TLT}^{(1)}$ | −12.83201212 | −9.646567168 |
| $b_{TLT}^{(2)}$ | 0 | 0 |
| $c_{TLT}$ | 0.256470588 | 0.250903614 |
| $a_{TS}^{(2)}$ | 156.858589 | 0 |
| $a_{TS}^{(1)}$ | −21.52776656 | −15.1877177 |
| $b_{TS}^{(2)}$ | 0.001522145 | 0 |
| $c_{TS}$ | 0.261176471 | 0.243825301 |
| $a_{TN}^{(3)}$ | 0 | 0 |
| $a_{TN}^{(2)}$ | 0 | 0 |
| $a_{TN}^{(1)}$ | 18.19696789 | 8.364202341 |
| $b_{TN}^{(3)}$ | 0 | 0 |
| $b_{TN}^{(2)}$ | 0 | 0 |
| $c_{TN}$ | 0.152941176 | 0.272891566 |
| $a_{TE}^{(2)}$ | 0 | 0 |
| $a_{TE}^{(1)}$ | −6.461494684 | −4.137739161 |
| $b_{TE}^{(2)}$ | 0 | 0 |
| $c_{TE}$ | 0.152941176 | 0.153463855 |
| $a_{\psi Si}^{(4)}$ | 0 | 0 |
| $a_{\psi Si}^{(3)}$ | 0 | 0 |
| $a_{\psi Si}^{(2)}$ | −0.007084639 | −0.003013228 |
| $a_{\psi Si}^{(1)}$ | −0.301466226 | −0.031376567 |
| $b_{\psi Si}^{(4)}$ | 0 | 0 |
| $b_{\psi Si}^{(3)}$ | 0 | 0 |
| $b_{\psi Si}^{(2)}$ | 49.58131488 | 795.684243 |
| $c_{\psi Si}$ | 25.35294118 | 60.63253012 |
| $a_{\theta LT}^{(2)}$ | 0 | 0 |
| $a_{\theta LT}^{(1)}$ | 0 | 0.009367138 |
| $b_{\theta LT}^{(2)}$ | 0 | 0 |
| $c_{\theta LT}$ | 0 | −52 |
| $d_{TLTTS}$ | 140.9204814 | 0 |
| $d_{TLTTN}$ | 0 | 24.32908352 |
| $d_{TLTTE}$ | 0 | 0 |
| $d_{TLT\psi Si}$ | 0 | 0 |
| $d_{TLT\theta LT}$ | 0 | 0 |
| $d_{TSTN}$ | 51.74259913 | 53.37502263 |
| $d_{TSTE}$ | 0 | 0 |
| $d_{TS\psi Si}$ | 0 | 0 |
| $d_{TS\theta LT}$ | 0 | 0 |
| $d_{TNTE}$ | 0 | 0 |
| $d_{TN\psi Si}$ | 0 | −0.241253979 |
| $d_{TN\psi LT}$ | 0 | 0 |
| $d_{TE\psi Si}$ | 0 | 0 |
| $d_{TE\theta LT}$ | 0 | 0.503490956 |
| $d_{\psi Si\theta LT}$ | 0 | 0 |
| e | −1.714086264 | −1.062610881 |

TABLE 14

| | Si(111)<br>FIRST HIGHER ORDER MODE |
|---|---|
| $a_{TLT}^{(2)}$ | 0 |
| $a_{TLT}^{(1)}$ | −11.07513554 |
| $b_{TLT}^{(2)}$ | 0 |
| $c_{TLT}$ | 0.253819444 |
| $a_{TS}^{(2)}$ | 0 |
| $a_{TS}^{(1)}$ | −14.53606605 |
| $b_{TS}^{(2)}$ | 0 |
| $c_{TS}$ | 0.255555556 |
| $a_{TN}^{(3)}$ | 0 |
| $a_{TN}^{(2)}$ | −27.47980058 |
| $a_{TN}^{(1)}$ | 11.21718185 |
| $b_{TN}^{(3)}$ | 0 |
| $b_{TN}^{(2)}$ | 0.012775849 |
| $c_{TN}$ | 0.198611111 |
| $a_{TE}^{(2)}$ | 0 |
| $a_{TE}^{(1)}$ | 0 |
| $b_{TE}^{(2)}$ | 0 |
| $c_{TE}$ | 0 |
| $a_{\psi Si}^{(4)}$ | 0 |
| $a_{\psi Si}^{(3)}$ | 0 |
| $a_{\psi Si}^{(2)}$ | 0 |
| $a_{\psi Si}^{(1)}$ | 0.199446167 |
| $b_{\psi Si}^{(4)}$ | 0 |
| $b_{\psi Si}^{(3)}$ | 0 |
| $b_{\psi Si}^{(2)}$ | 0 |
| $c_{\psi Si}$ | 31.80555556 |
| $a_{\theta LT}^{(2)}$ | 0 |
| $a_{\theta LT}^{(1)}$ | 0.020411672 |
| $b_{\theta LT}^{(2)}$ | 0 |
| $c_{\theta LT}$ | −49.55555556 |
| $d_{TLTTS}$ | 0 |
| $d_{TLTTN}$ | 59.65672759 |
| $d_{TLTTE}$ | 0 |
| $d_{TLT\psi Si}$ | 0 |
| $d_{TLT\theta LT}$ | 0 |
| $d_{TSTN}$ | 118.0753788 |
| $d_{TSTE}$ | 0 |
| $d_{TS\psi Si}$ | 0 |
| $d_{TS\theta LT}$ | 0 |
| $d_{TNTE}$ | 0 |
| $d_{TN\psi Si}$ | 0 |
| $d_{TN\psi LT}$ | 0 |
| $d_{TE\psi Si}$ | 0 |
| $d_{TE\theta LT}$ | 0 |
| $d_{\psi Si\theta LT}$ | 0 |
| e | −1.633231485 |

TABLE 15

| | Si(100)<br>SECOND HIGHER ORDER MODE |
|---|---|
| $a_{TLT}^{(2)}$ | 0 |
| $a_{TLT}^{(1)}$ | −11.81358789 |
| $b_{TLT}^{(2)}$ | 0 |
| $c_{TLT}$ | 0.238372093 |
| $a_{TS}^{(2)}$ | 0 |
| $a_{TS}^{(1)}$ | 12.8161063 |
| $b_{TS}^{(2)}$ | 0 |
| $c_{TS}$ | 0.256511628 |
| $a_{TN}^{(3)}$ | 51.69588497 |
| $a_{TN}^{(2)}$ | −32.3186317 |
| $a_{TN}^{(1)}$ | −4.371415613 |
| $b_{TN}^{(3)}$ | 0.001717063 |
| $b_{TN}^{(2)}$ | 0.027148945 |
| $c_{TN}$ | 0.29627907 |
| $a_{TE}^{(2)}$ | 0 |
| $a_{TE}^{(1)}$ | 1.615825178 |
| $b_{TE}^{(2)}$ | 0 |
| $c_{TE}$ | 0.151744186 |
| $a_{\psi Si}^{(4)}$ | 0 |
| $a_{\psi Si}^{(3)}$ | 0.000212057 |
| $a_{\psi Si}^{(2)}$ | −0.001603831 |
| $a_{\psi Si}^{(1)}$ | −0.204451256 |

TABLE 15-continued

| | Si(100)<br>SECOND HIGHER ORDER MODE |
|---|---|
| $b_{\psi Si}^{(4)}$ | 0 |
| $b_{\psi Si}^{(3)}$ | −751.8827776 |
| $b_{\psi Si}^{(2)}$ | 48.11032991 |
| $c_{\psi Si}$ | 27.48837209 |
| $a_{\theta LT}^{(2)}$ | 0 |
| $a_{\theta LT}^{(1)}$ | 0.02976445 |
| $b_{\theta LT}^{(2)}$ | 0 |
| $c_{\theta LT}$ | −49.6744186 |
| $d_{TLTTS}$ | 0 |
| $d_{TLTTN}$ | 0 |
| $d_{TLTTE}$ | 107.5358299 |
| $d_{TLT\psi Si}$ | 0 |
| $d_{TLT\theta LT}$ | 0 |
| $d_{TSTN}$ | 0 |
| $d_{TSTE}$ | 0 |
| $d_{TS\psi Si}$ | 1.157163274 |
| $d_{TS\theta LT}$ | 0 |
| $d_{TNTE}$ | 0 |
| $d_{TN\psi Si}$ | −0.328790695 |
| $d_{TN\psi LT}$ | −0.146613553 |
| $d_{TE\psi Si}$ | 0 |
| $d_{TE\theta LT}$ | 0 |
| $d_{\psi Si\theta LT}$ | 0 |
| e | −3.188900929 |

TABLE 16

| | Si(110)<br>SECOND HIGHER ORDER MODE | |
|---|---|---|
| | $0 \leq \psi_{Si} < 30$ | $30 \leq \psi_{Si} \leq 90$ |
| $a_{TLT}^{(2)}$ | 114.8844473 | 193.3812097 |
| $a_{TLT}^{(1)}$ | −8.088688831 | 0.512582429 |
| $b_{TLT}^{(2)}$ | 0.0016209 | 0.001754662 |
| $c_{TLT}$ | 0.254008909 | 0.251239669 |
| $a_{TS}^{(2)}$ | 0 | 0 |
| $a_{TS}^{(1)}$ | −7.32209573 | −6.329562725 |
| $b_{TS}^{(2)}$ | 0 | 0 |
| $c_{TS}$ | 0.252672606 | 0.271900826 |
| $a_{TN}^{(3)}$ | 0 | −81.37971878 |
| $a_{TN}^{(2)}$ | −8.528039509 | 39.7113193 |
| $a_{TN}^{(1)}$ | −1.120271161 | 0.826800765 |
| $b_{TN}^{(3)}$ | 0 | 0.006887919 |
| $b_{TN}^{(2)}$ | 0.053619178 | 0.025205929 |
| $c_{TN}$ | 0.423830735 | 0.200826446 |
| $a_{TE}^{(2)}$ | 0 | 0 |
| $a_{TE}^{(1)}$ | 9.909256206 | 0 |
| $b_{TE}^{(2)}$ | 0 | 0 |
| $c_{TE}$ | 0.160523385 | 0 |
| $a_{\psi Si}^{(4)}$ | 0 | 0 |
| $a_{\psi Si}^{(3)}$ | 0 | 0 |
| $a_{\psi Si}^{(2)}$ | 0 | 0.003197968 |
| $a_{\psi Si}^{(1)}$ | 0.018063648 | −0.015576788 |
| $b_{\psi Si}^{(4)}$ | 0 | 0 |
| $b_{\psi Si}^{(3)}$ | 0 | 108.7630626 |
| $b_{\psi Si}^{(2)}$ | 0 | 0 |
| $c_{\psi Si}$ | 8.797327394 | 38.92561983 |
| $a_{\theta LT}^{(2)}$ | 0 | 0 |
| $a_{\theta LT}^{(1)}$ | −0.003063309 | 0.049075185 |
| $b_{\theta LT}^{(2)}$ | 0 | 0 |
| $c_{\theta LT}$ | −49.54120267 | −48.89256198 |
| $d_{TLTTS}$ | 0 | −167.1962018 |
| $d_{TLTTN}$ | −32.41085998 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTN}$ | 33.06314431 | 0 |
| $d_{TSTE}$ | 124.8374401 | 0 |
| $d_{TS\psi Si}$ | 0 | 0.486860801 |
| $d_{TS\theta LT}$ | 0 | 0 |
| $d_{TNTE}$ | −38.52108083 | 0 |
| $d_{TN\psi Si}$ | 0 | 0 |
| $d_{TN\psi LT}$ | 0 | 0 |

TABLE 16-continued

| | Si(110) SECOND HIGHER ORDER MODE | |
|---|---|---|
| | $0 \leq \psi_{Si} < 30$ | $30 \leq \psi_{Si} \leq 90$ |
| $d_{TE\psi Si}$ | 0 | 0 |
| $d_{TE\theta LT}$ | 0.494639958 | 0 |
| $d_{\psi Si\theta LT}$ | −0.001623976 | 0.014724275 |
| e | −2.271454108 | −2.472699496 |

TABLE 17

| | Si(111) SECOND HIGHER ORDER MODE | |
|---|---|---|
| | $0 \leq \psi_{Si} < 30$ | $30 \leq \psi_{Si} \leq 60$ |
| $a_{TLT}^{(2)}$ | 0 | 0 |
| $a_{TLT}^{(1)}$ | −19.73613055 | −14.94881654 |
| $b_{TLT}^{(2)}$ | 0 | 0 |
| $c_{TLT}$ | 0.239145299 | 0.24607438 |
| $a_{TS}^{(2)}$ | 0 | 0 |
| $a_{TS}^{(1)}$ | −6.009225958 | 0.384596926 |
| $b_{TS}^{(2)}$ | 0 | 0 |
| $c_{TS}$ | 0.246837607 | 0.24862259 |
| $a_{TN}^{(3)}$ | 0 | 0 |
| $a_{TN}^{(2)}$ | −20.54217049 | −13.90920983 |
| $a_{TN}^{(1)}$ | −0.500198805 | −1.907891682 |
| $b_{TN}^{(3)}$ | 0 | 0 |
| $b_{TN}^{(2)}$ | 0.036939908 | 0.04540127 |
| $c_{TN}$ | 0.399487179 | 0.382644628 |
| $a_{TE}^{(2)}$ | 0 | 0 |
| $a_{TE}^{(1)}$ | 5.085265993 | 1.386937823 |
| $b_{TE}^{(2)}$ | 0 | 0 |
| $c_{TE}$ | 0.158376068 | 0.157438017 |
| $a_{\psi Si}^{(4)}$ | 0 | 0 |
| $a_{\psi Si}^{(3)}$ | 0 | 0 |
| $a_{\psi Si}^{(2)}$ | 0.001491321 | 0 |
| $a_{\psi Si}^{(1)}$ | 0.042768727 | −0.007722013 |
| $b_{\psi Si}^{(4)}$ | 0 | 0 |
| $b_{\psi Si}^{(3)}$ | 0 | 0 |
| $b_{\psi Si}^{(2)}$ | 159.6686391 | 0 |
| $c_{\psi Si}$ | 14.15384615 | 47.63085399 |
| $a_{\theta LT}^{(2)}$ | 0 | 0 |
| $a_{\theta LT}^{(1)}$ | 0.012313864 | 0 |
| $b_{\theta LT}^{(2)}$ | 0 | 0 |
| $c_{\theta LT}$ | −48.4034188 | 0 |
| $d_{TLTTS}$ | 0 | 0 |
| $d_{TLTTN}$ | −34.27397947 | −21.45483754 |
| $d_{TLTTE}$ | 0 | 0 |
| $d_{TLT\psi Si}$ | 0.278464842 | 0 |
| $d_{TLT\theta LT}$ | −0.425894828 | 0 |
| $d_{TSTN}$ | 46.58606596 | 0 |
| $d_{TSTE}$ | 92.95289822 | 102.0248205 |
| $d_{TS\psi Si}$ | 0 | 0.493711224 |
| $d_{TS\theta LT}$ | 0 | 0 |
| $d_{TNTE}$ | −26.83666562 | 0 |
| $d_{TN\psi Si}$ | −0.133932768 | −0.129081681 |
| $d_{TN\psi LT}$ | −0.107712568 | 0 |
| $d_{TE\psi Si}$ | 0 | 0 |
| $d_{TE\theta LT}$ | 0 | 0 |
| $d_{\psi Si\theta LT}$ | 0 | 0 |
| e | −2.444079693 | −1.863631594 |

TABLE 18

| | Si(100) THIRD HIGHER ORDER MODE |
|---|---|
| $a_{TLT}^{(2)}$ | 0 |
| $a_{TLT}^{(1)}$ | −13.69744796 |
| $b_{TLT}^{(2)}$ | 0 |
| $c_{TLT}$ | 0.242117117 |
| $a_{TS}^{(2)}$ | 0 |
| $a_{TS}^{(1)}$ | −21.67672451 |

TABLE 18-continued

| | Si(100) THIRD HIGHER ORDER MODE |
|---|---|
| $b_{TS}^{(2)}$ | 0 |
| $c_{TS}$ | 0.24740991 |
| $a_{TN}^{(3)}$ | 0 |
| $a_{TN}^{(2)}$ | 0 |
| $a_{TN}^{(1)}$ | 0 |
| $b_{TN}^{(3)}$ | 0 |
| $b_{TN}^{(2)}$ | 0 |
| $c_{TN}$ | 0 |
| $a_{TE}^{(2)}$ | 0 |
| $a_{TE}^{(1)}$ | 0 |
| $b_{TE}^{(2)}$ | 0 |
| $c_{TE}$ | 0 |
| $a_{\psi Si}^{(4)}$ | 0 |
| $a_{\psi Si}^{(3)}$ | 0 |
| $a_{\psi Si}^{(2)}$ | 0 |
| $a_{\psi Si}^{(1)}$ | −0.012294125 |
| $b_{\psi Si}^{(4)}$ | 0 |
| $b_{\psi Si}^{(3)}$ | 0 |
| $b_{\psi Si}^{(2)}$ | 0 |
| $c_{\psi Si}$ | 23.5472973 |
| $a_{\theta LT}^{(2)}$ | 0 |
| $a_{\theta LT}^{(1)}$ | −0.043141927 |
| $b_{\theta LT}^{(2)}$ | 0 |
| $c_{\theta LT}$ | −50.74774775 |
| $D_{TLTTS}$ | 0 |
| $D_{TLTTN}$ | 0 |
| $D_{TLTTE}$ | 0 |
| $D_{TLT\psi Si}$ | 0 |
| $D_{TLT\theta LT}$ | 1.006243214 |
| $D_{TSTN}$ | 0 |
| $D_{TSTE}$ | 0 |
| $D_{TS\psi Si}$ | 0 |
| $D_{TS\theta LT}$ | 0 |
| $D_{TNTE}$ | 0 |
| $D_{TN\psi Si}$ | 0 |
| $D_{TN\psi LT}$ | 0 |
| $D_{TE\psi Si}$ | 0 |
| $D_{TE\theta LT}$ | 0 |
| $D_{\psi Si\theta LT}$ | −0.002432123 |
| e | −2.624644502 |

TABLE 19

| | Si(110) THIRD HIGHER ORDER MODE | |
|---|---|---|
| | $0 \leq \psi_{Si} < 30$ | $30 \leq \psi_{Si} \leq 90$ |
| $a_{TLT}^{(2)}$ | 0 | 0 |
| $a_{TLT}^{(1)}$ | −11.03265079 | 0 |
| $b_{TLT}^{(2)}$ | 0 | 0 |
| $c_{TLT}$ | 0.256828704 | 0 |
| $a_{TS}^{(2)}$ | 0 | 0 |
| $a_{TS}^{(1)}$ | −4.308771413 | 0.663966622 |
| $b_{TS}^{(2)}$ | 0 | 0 |
| $c_{TS}$ | 0.254976852 | 0.252631579 |
| $a_{TN}^{(3)}$ | 0 | −41.616937 |
| $a_{TN}^{(2)}$ | 0 | 15.26191272 |
| $a_{TN}^{(1)}$ | 0.749735997 | 1.074574236 |
| $b_{TN}^{(3)}$ | 0 | 0.006033304 |
| $b_{TN}^{(2)}$ | 0 | 0.043147922 |
| $c_{TN}$ | 0.380092593 | 0.303157895 |
| $a_{TE}^{(2)}$ | 0 | 0 |
| $a_{TE}^{(1)}$ | −0.678702233 | 11.03955295 |
| $b_{TE}^{(2)}$ | 0 | 0 |
| $c_{TE}$ | 0.155960648 | 0.160921053 |
| $a_{\psi Si}^{(4)}$ | 0 | 0 |
| $a_{\psi Si}^{(3)}$ | 0 | 0 |
| $a_{\psi Si}^{(2)}$ | 0 | 0 |
| $a_{\psi Si}^{(1)}$ | 0.020332938 | 0.010235202 |
| $b_{\psi Si}^{(4)}$ | 0 | 0 |
| $b_{\psi Si}^{(3)}$ | 0 | 0 |
| $b_{\psi Si}^{(2)}$ | 0 | 0 |
| $c_{\psi Si}$ | 5.99537037 | 66.78947368 |

TABLE 19-continued

Si(110)
THIRD HIGHER ORDER MODE

| | $0 \leq \psi_{Si} < 30$ | $30 \leq \psi_{Si} \leq 90$ |
|---|---|---|
| $a_{\theta LT}^{(2)}$ | −0.003658214 | 0 |
| $a_{\theta LT}^{(1)}$ | 0.048112599 | 0.016635787 |
| $b_{\theta LT}^{(2)}$ | 71.1933299 | 0 |
| $c_{\theta LT}$ | −50.89814815 | −49.93684211 |
| $d_{TLTTS}$ | 0 | 0 |
| $d_{TLTTN}$ | 0 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTN}$ | 0 | 0 |
| $d_{TSTE}$ | 0 | 0 |
| $d_{TS\psi Si}$ | 0 | −0.323118596 |
| $d_{TS\theta LT}$ | 0 | 0.713957036 |
| $d_{TNTE}$ | 0 | 0 |
| $d_{TN\psi Si}$ | −0.144459086 | 0 |
| $d_{TN\psi LT}$ | 0 | 0 |
| $d_{TE\psi Si}$ | 0.79407423 | 0.334206608 |
| $d_{TE\theta LT}$ | 0 | 0 |
| $d_{\psi Si\theta LT}$ | −0.002496666 | 0.001289273 |
| e | −2.360031711 | −3.077359987 |

TABLE 20

Si(111)
THIRD HIGHER ORDER MODE
$0 < T_{LT} < 0.25$
$0 \leq \psi_{Si} < 30$

| | |
|---|---|
| $a_{TLT}^{(2)}$ | 0 |
| $a_{TLT}^{(1)}$ | −23.116307 |
| $b_{TLT}^{(2)}$ | 0 |
| $c_{TLT}$ | 0.2289801 |
| $a_{TS}^{(2)}$ | 0 |
| $a_{TS}^{(1)}$ | −14.28753349 |
| $b_{TS}^{(2)}$ | 0 |
| $c_{TS}$ | 0.260572139 |
| $a_{TN}^{(3)}$ | 0 |
| $a_{TN}^{(2)}$ | 0 |
| $a_{TN}^{(1)}$ | −0.440595972 |
| $b_{TN}^{(3)}$ | 0 |
| $b_{TN}^{(2)}$ | 0 |
| $c_{TN}$ | 0.411940299 |
| $a_{TE}^{(2)}$ | 0 |
| $a_{TE}^{(1)}$ | 0 |
| $b_{TE}^{(2)}$ | 0 |
| $c_{TE}$ | 0 |
| $a_{\psi Si}^{(4)}$ | 0 |
| $a_{\psi Si}^{(3)}$ | 0 |
| $a_{\psi Si}^{(2)}$ | 0 |
| $a_{\psi Si}^{(1)}$ | 0.029126872 |
| $b_{\psi Si}^{(4)}$ | 0 |
| $b_{\psi Si}^{(3)}$ | 0 |
| $b_{\psi Si}^{(2)}$ | 0 |
| $c_{\psi Si}$ | 11.96517413 |
| $a_{\theta LT}^{(2)}$ | 0 |
| $a_{\theta LT}^{(1)}$ | 0 |
| $b_{\theta LT}^{(2)}$ | 0 |
| $c_{\theta LT}$ | 0 |
| $d_{TLTTS}$ | 0 |
| $d_{TLTTN}$ | 0 |
| $d_{TLTTE}$ | 0 |
| $d_{TLT\psi Si}$ | 0 |
| $d_{TLT\theta LT}$ | 0 |
| $d_{TSTN}$ | 0 |
| $d_{TSTE}$ | 0 |
| $d_{TS\psi Si}$ | 0.930830627 |
| $d_{TS\theta LT}$ | 0 |
| $d_{TNTE}$ | 0 |
| $d_{TN\psi Si}$ | −0.129081681 |
| $d_{TN\psi LT}$ | 0 |

TABLE 20-continued

Si(111)
THIRD HIGHER ORDER MODE
$0 < T_{LT} < 0.25$
$0 \leq \psi_{Si} < 30$

| | |
|---|---|
| $d_{TE\psi Si}$ | 0 |
| $d_{TE\theta LT}$ | 0 |
| $d_{\psi Si\theta LT}$ | 0 |
| e | −2.122238265 |

TABLE 21

Si(111)
THIRD HIGHER ORDER MODE
$0 < T_{LT} < 0.25$
$30 \leq \psi_{Si} \leq 60$

| | $0 < T_N < 0.3$ | $0.3 \leq T_N < 0.5$ | $0.5 \leq T_N \leq 2.0$ |
|---|---|---|---|
| $a_{TLT}^{(2)}$ | 0 | 0 | 0 |
| $a_{TLT}^{(1)}$ | −8.85598025 | −13.00016665 | −14.59159182 |
| $b_{TLT}^{(2)}$ | 0 | 0 | 0 |
| $c_{TLT}$ | 0.228097345 | 0.22804878 | 0.228054299 |
| $a_{TS}^{(2)}$ | 103.6914504 | 0 | 0 |
| $a_{TS}^{(1)}$ | −1.916300209 | −1.043153875 | −2.152482595 |
| $b_{TS}^{(2)}$ | 0.001674808 | 0 | 0 |
| $c_{TS}$ | 0.25420354 | 0.254634146 | 0.251809955 |
| $a_{TN}^{(3)}$ | 0 | 0 | 0 |
| $a_{TN}^{(2)}$ | 0 | 0 | 0 |
| $a_{TN}^{(1)}$ | −2.052521715 | 1.895724222 | −3.806230027 |
| $b_{TN}^{(3)}$ | 0 | 0 | 0 |
| $b_{TN}^{(2)}$ | 0 | 0 | 0 |
| $c_{TN}$ | 0.187810619 | 0.403414634 | 0.604072398 |
| $a_{TE}^{(2)}$ | 0 | 0 | 0 |
| $a_{TE}^{(1)}$ | 6.773288364 | 5.622244745 | 4.676153327 |
| $b_{TE}^{(2)}$ | 0 | 0 | 0 |
| $c_{TE}$ | 0.163274336 | 0.167317073 | 0.16561086 |
| $a_{\psi Si}^{(4)}$ | 0 | 0 | 0 |
| $a_{\psi Si}^{(3)}$ | 0 | 0 | 0 |
| $a_{\psi Si}^{(2)}$ | 0 | 0 | 0 |
| $a_{\psi Si}^{(1)}$ | −0.035810857 | 0 | 0.001284581 |
| $b_{\psi Si}^{(4)}$ | 0 | 0 | 0 |
| $b_{\psi Si}^{(3)}$ | 0 | 0 | 0 |
| $b_{\psi Si}^{(2)}$ | 0 | 0 | 0 |
| $c_{\psi Si}$ | 50.7079646 | 0 | 47.46606335 |
| $a_{\theta LT}^{(2)}$ | −0.004232627 | −0.004038546 | 0 |
| $a_{\theta LT}^{(1)}$ | 0.047188385 | 0.050497193 | 0.025858407 |
| $b_{\theta LT}^{(2)}$ | 70.63732477 | 71.2056157 | 0 |
| $c_{\theta LT}$ | −50.2300885 | −50.47804878 | −50.00904977 |
| $d_{TLTTS}$ | 0 | 144.8256764 | 175.1562687 |
| $d_{TLTTN}$ | 0 | −71.99871186 | 62.29352459 |
| $d_{TLTTE}$ | 0 | 0 | 0 |
| $d_{TLT\psi Si}$ | 0 | 0 | 0.579045093 |
| $d_{TLT\theta LT}$ | 0 | 0 | 0 |
| $d_{TSTN}$ | 0 | 0 | 0 |
| $d_{TSTE}$ | 0 | 0 | 0 |
| $d_{TS\psi Si}$ | 0 | 0.421981204 | 0 |
| $d_{TS\theta LT}$ | 0.662353425 | 0.864834339 | 0.455548641 |
| $d_{TNTE}$ | 0 | 0 | 0 |
| $d_{TN\psi Si}$ | 0 | 0 | 0.218878849 |
| $d_{TN\psi LT}$ | 0 | 0 | −0.178003295 |
| $d_{TE\psi Si}$ | 0 | 0 | 0 |
| $d_{TE\theta LT}$ | 0 | 0 | 0 |
| $d_{\psi Si\theta LT}$ | 0.002492698 | 0.002050178 | 0 |
| e | −1.992833526 | −1.990755952 | −2.158637111 |

TABLE 22

Si(111)
THIRD HIGHER ORDER MODE
$0.25 \leq T_{LT} \leq 3.5$

| | $0 \leq \psi_{Si} < 30$ | $30 \leq \psi_{Si} \leq 60$ |
|---|---|---|
| $a_{TLT}^{(2)}$ | 0 | 0 |
| $a_{TLT}^{(1)}$ | −4.28090475 | 0 |
| $b_{TLT}^{(2)}$ | 0 | 0 |
| $c_{TLT}$ | 0.275829876 | 0 |
| $a_{TS}^{(2)}$ | 0 | 0 |
| $a_{TS}^{(1)}$ | −10.77092012 | −1.545108081 |
| $b_{TS}^{(2)}$ | 0 | 0 |
| $c_{TS}$ | 0.254356846 | 0.254105263 |
| $a_{TN}^{(3)}$ | 0 | 0 |
| $a_{TN}^{(2)}$ | 0 | 0 |
| $a_{TN}^{(1)}$ | −0.547621988 | −0.893667583 |
| $b_{TN}^{(3)}$ | 0 | 0 |
| $b_{TN}^{(2)}$ | 0 | 0 |
| $c_{TN}$ | 0.396680498 | 0.392631679 |
| $a_{TE}^{(2)}$ | 0 | 0 |
| $a_{TE}^{(1)}$ | 0 | 0.708331428 |
| $b_{TE}^{(2)}$ | 0 | 0 |
| $c_{TE}$ | 0 | 0.159684211 |
| $a_{\psi Si}^{(4)}$ | 0 | 0 |
| $a_{\psi Si}^{(3)}$ | 0 | 0 |
| $a_{\psi Si}^{(2)}$ | 0 | 0 |
| $a_{\psi Si}^{(1)}$ | 0.033675166 | −0.011260677 |
| $b_{\psi Si}^{(4)}$ | 0 | 0 |
| $b_{\psi Si}^{(3)}$ | 0 | 0 |
| $b_{\psi Si}^{(2)}$ | 0 | 0 |
| $c_{\psi Si}$ | 11.70124481 | 48.21052632 |
| $a_{\theta LT}^{(2)}$ | 0 | −0.003806532 |
| $a_{\theta LT}^{(1)}$ | −0.012544759 | 0.039951436 |
| $b_{\theta LT}^{(2)}$ | 0 | 67.93672687 |
| $c_{\theta LT}$ | −49.37759336 | −49.42315789 |
| $d_{TLTTS}$ | 122.2019913 | 0 |
| $d_{TLTTN}$ | 0 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTN}$ | 0 | 0 |
| $d_{TSTE}$ | 0 | 0 |
| $d_{TS\psi Si}$ | 0.657009296 | −0.317058863 |
| $d_{TS\theta LT}$ | 0 | 0.702776192 |
| $d_{TNTE}$ | 0 | −16.38117608 |
| $d_{TN\psi Si}$ | −0.139004432 | 0.128605996 |
| $d_{TN\psi LT}$ | 0 | 0 |
| $d_{TE\psi Si}$ | 0 | 0 |
| $d_{TE\theta LT}$ | 0 | 0 |
| $d_{\psi Si\theta LT}$ | 0.001351095 | 0.001928116 |
| e | −2.653122338 | −2.237232738 |

The inventors of preferred embodiments of the present application performed experiments to discover how the response intensities of the first higher order mode, the second higher order mode, and the third higher order mode changed when the above parameters $T_{LT}$, $\theta_{LT}$, $T_N$, $T_S$, $T_E$, $\psi_{Si}$, and $T_{Si}$ were changed in various ways.

The absolute values of S11 were obtained as the response intensities of the higher order modes when the above parameters were changed. The smaller the decibel display value of the absolute value of S11, the higher the response intensity of the higher order mode. When calculating S11, the electrode finger crossing width was 20λ, the number of pairs of electrode fingers was ninety-four pairs, and S11 was obtained using an electrode finger pair model employing a two-dimensional finite element method.

The IDT electrode has a structure in which Ti/Pt/Ti/Al metal films are stacked in this order from the piezoelectric body side. Furthermore, the thickness of the IDT electrode was changed by changing the thickness of the Pt film. In addition, as the wavelength normalized film thickness $T_E$ of the IDT electrode, a wavelength normalized film thickness expressed as an aluminum thickness using the thicknesses and densities of the individual electrode layers was obtained using the mass of the entire IDT electrode estimated from the densities of the individual metal films.

First Higher Order Mode

An acoustic wave resonator having the admittance characteristic illustrated in FIG. 2 was used as a reference structure.

Figure 3:
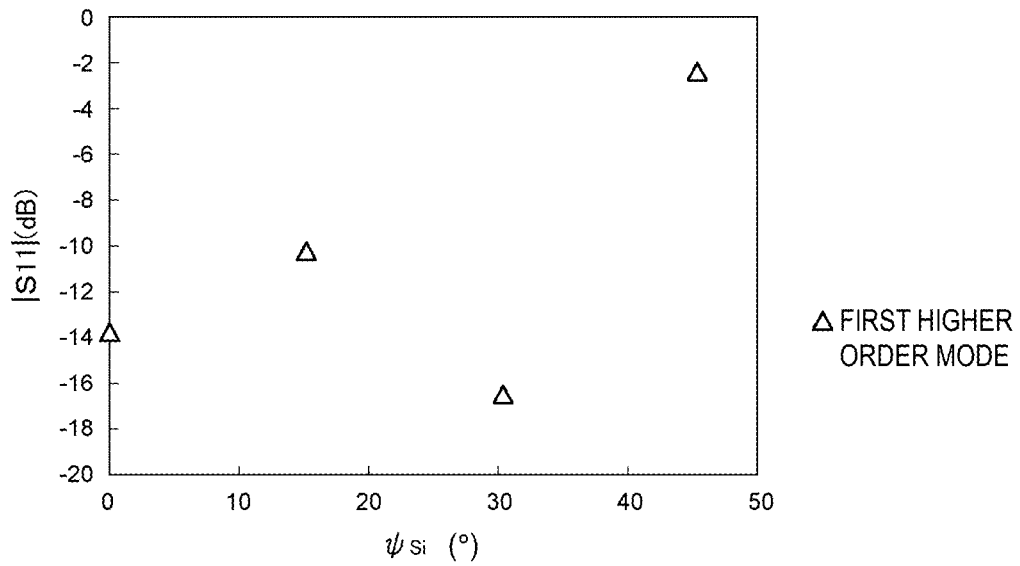
FIG. 3 is a diagram illustrating the relationship between a propagation direction $\psi_{Si}$ inside a support substrate and a response intensity S11 of a first higher order mode.

That is, an acoustic wave resonator in which the Euler angles of the support substrate 2=(about 0°, about 0°, about 45°), the film thickness of the silicon oxide film 4=about 0.30λ, the Euler angles of the piezoelectric body 5=(about 0°, about −40°, about 0°), and the wavelength λ determined by the electrode finger pitch of the IDT electrode 6=about 1λ μm was used as a reference structure. In the reference structure, the IDT electrode 6 is made of a multilayer metal film in which an Al film and a Ti film are stacked. The thickness of the multilayer metal film expressed as an aluminum thickness using the thicknesses and densities of the individual electrode layers was about 0.05λ. FIGS. 3 to 8 are diagrams illustrating changes in the response intensity S11 of the first higher order mode when parameters are changed relative to the reference structure. As illustrated in FIG. 3, when the propagation direction $\psi_{Si}$ inside the support substrate is changed in a range from about 0° to about 45°, it is clear that the response intensity S11 of the first higher order mode changes relative to the reference structure.

Figure 4:
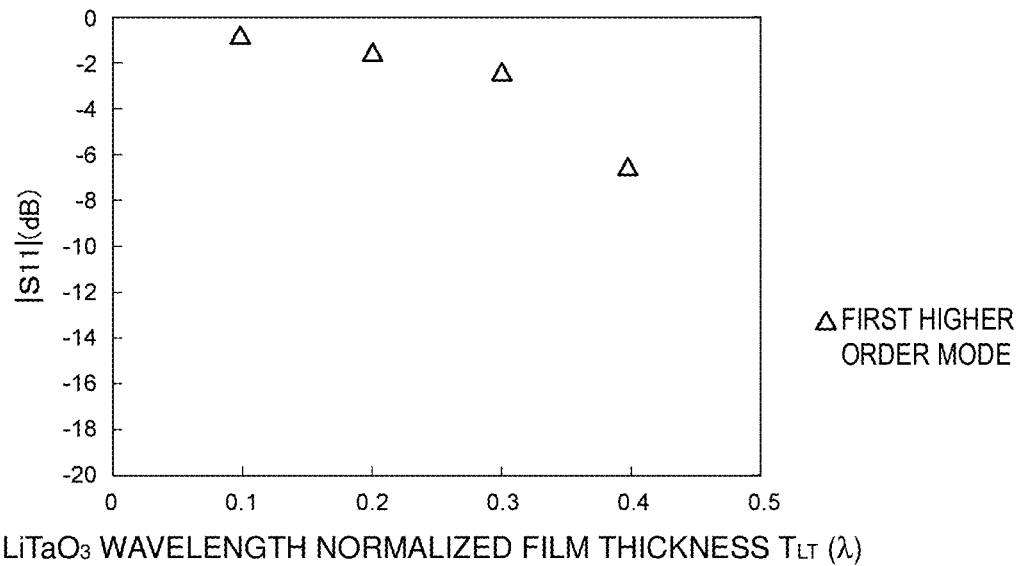
FIG. 4 is a diagram illustrating the relationship between a wavelength normalized film thickness $T_{LT}$ of a piezoelectric body made of lithium tantalate and the response intensity S11 of the first higher order mode.

Similarly, as illustrated in FIG. 4, it is clear that the response intensity S11 of the first higher order mode also changes in the case where the wavelength normalized film thickness $I_{LT}$ of the piezoelectric body made of lithium tantalate is changed.

Figure 5:
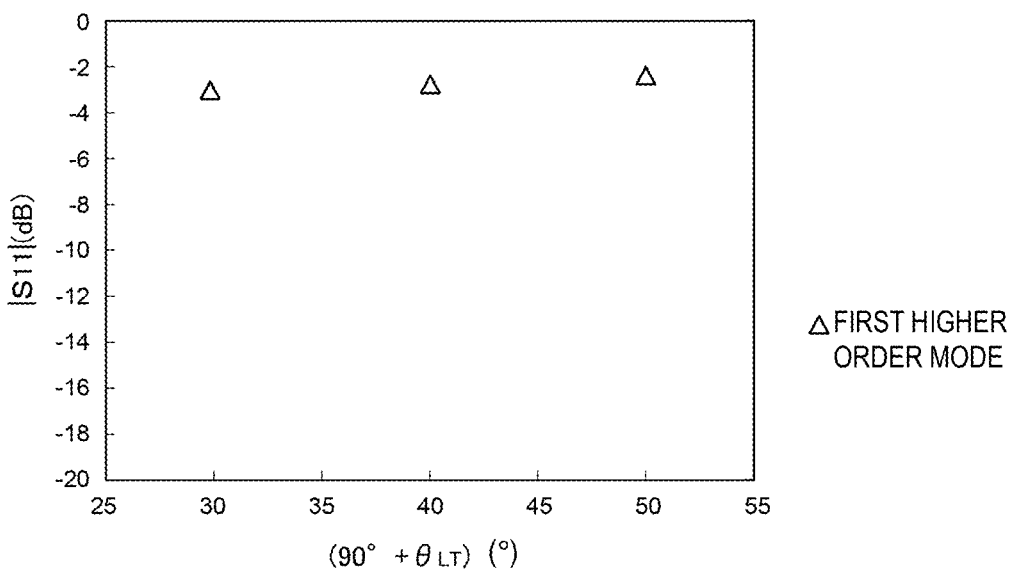
FIG. 5 is a diagram illustrating the relationship between a cut angle (90°+$\theta_{LT}$) of the piezoelectric body made of lithium tantalate and the response intensity S11 of the first higher order mode.

Furthermore, as illustrated in FIG. 5, the response intensity S11 of the first higher order mode also changes in the case where the cut angle (about 90°+$\theta_{LT}$) of the piezoelectric body made of lithium tantalate changes.

Figure 6:
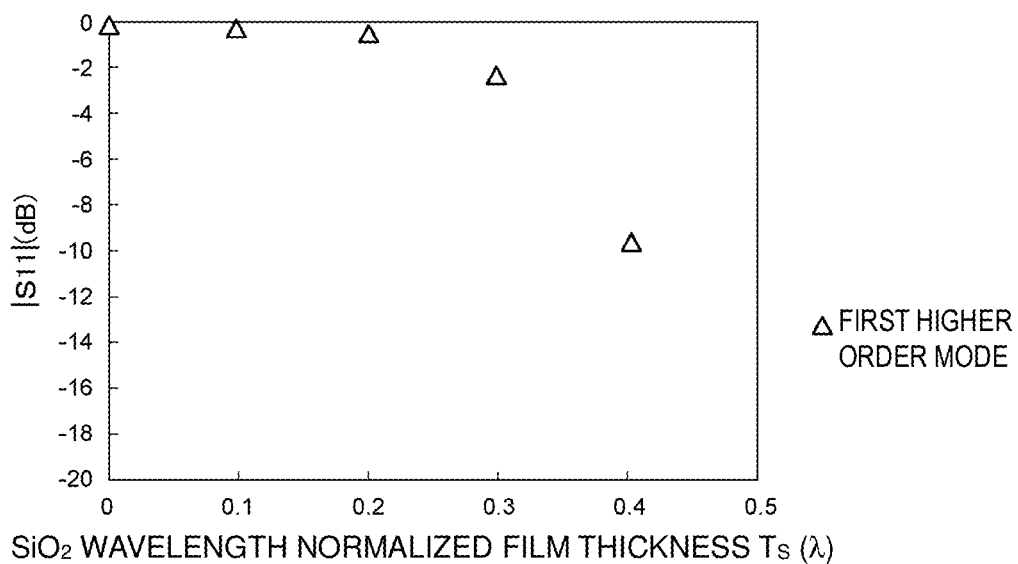
FIG. 6 is a diagram illustrating the relationship between a wavelength normalized film thickness $T_S$ of a silicon oxide film and the response intensity S11 of the first higher order mode.

As illustrated in FIG. 6, the response intensity S11 of the first higher order mode also changes in the case where the wavelength normalized film thickness $T_S$ of the silicon oxide film is changed.

Figure 7:
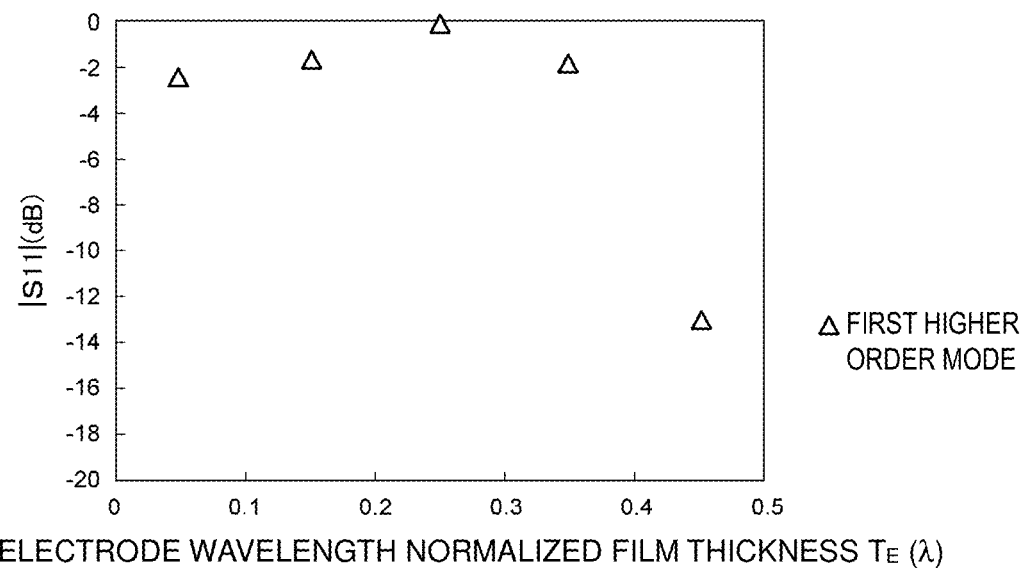
FIG. 7 is a diagram illustrating the relationship between a wavelength normalized film thickness $T_E$ of an IDT electrode and the response intensity S11 of the first higher order mode.

As illustrated in FIG. 7, the response intensity S11 of the first higher order mode also changes in the case where the wavelength normalized film thickness $T_E$, which is expressed as an Al thickness, of the IDT electrode changes.

Figure 8:
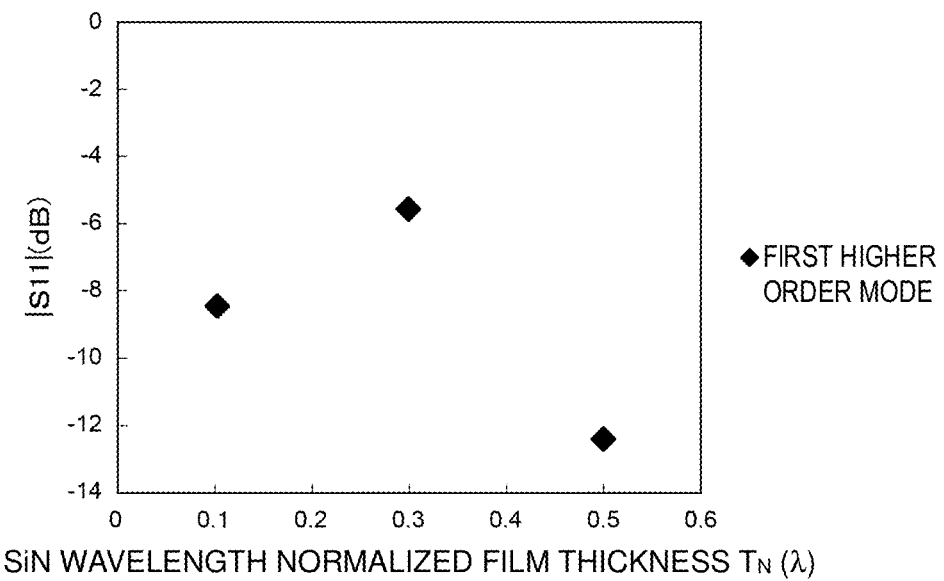
FIG. 8 is a diagram illustrating the relationship between a wavelength normalized film thickness $T_N$ of a silicon nitride film and the response intensity S11 of the first higher order mode.

As illustrated in FIG. 8, it is clear that the intensity S11 of the first higher order mode changes when the wavelength normalized film thickness $T_N$ of the silicon nitride film is changed.

It is clear from FIGS. 3 to 8 that the response intensity of the first higher order mode can be adjusted by changing these parameters. In other words, the response intensity of the first higher order mode can be reduced by selecting the values of these parameters.

From the calculation results of FIGS. 3 to 8 and so forth, the inventors of preferred embodiments of the present application deduced that $I_h$ corresponding to the response intensity of a higher-order mode can be obtained using the above-described Formula (1) and the coefficients a, b, c, d, and e in above Tables 12 to 22.

The values listed in Tables 12 to 14 were found for the coefficients in Formula (1) in accordance with the crystal orientation (100), (110), or (111) of the support substrate and the respective ranges of the wavelength normalized film thickness $T_{LT}$ of the piezoelectric body made of lithium tantalate, the wavelength normalized film thickness $T_N$ of the silicon nitride film, the wavelength normalized film thickness $T_S$ of the silicon oxide film, the wavelength normalized film thickness $T_E$ of the IDT electrode, and the propagation direction $\psi_{Si}$ inside the support substrate. In this way, conditions of $T_{LT}$, $\theta_{LT}$, $T_N$, $T_S$, $T_E$, and $\psi_{Si}$ at which $I_{h1}$, which corresponds to the response intensity of the first higher order mode, is greater than about −2.4 are determined.

Incidentally, in a multiplexer in which a plurality of acoustic wave filters are connected to each other at one end, it is required that the response intensity of a higher order mode be greater than about −2.4 dB for S11. This is in order to make the effect on the bandpass characteristics of other acoustic wave filters negligible. Usually, in mobile phone devices and the like, ripples appearing in the passband are required to be about −0.8 dB or more from the viewpoint of ensuring reception sensitivity. However, when a higher order mode exists in the passband of another acoustic wave filter, a ripple of about ⅓ the response intensity of the higher order mode is generated in the passband of the other filter. Therefore, it is preferable to make the response intensity S11 of such a higher order mode greater than about −2.4 dB in order to make the ripple inside the pass band greater than or equal to about −0.8 dB.

In addition, $T_{Si}$>about 20 in the acoustic wave device 1 of the first preferred embodiment of the present invention.

Since $I_h$>about −2.4 and $T_{Si}$>about 20 for the first higher order mode, the effect of the response of the first higher order mode on the passband of the other acoustic wave filter can be effectively reduced or prevented. This will be explained while referring to FIGS. 9 to 12.

Figure 9:
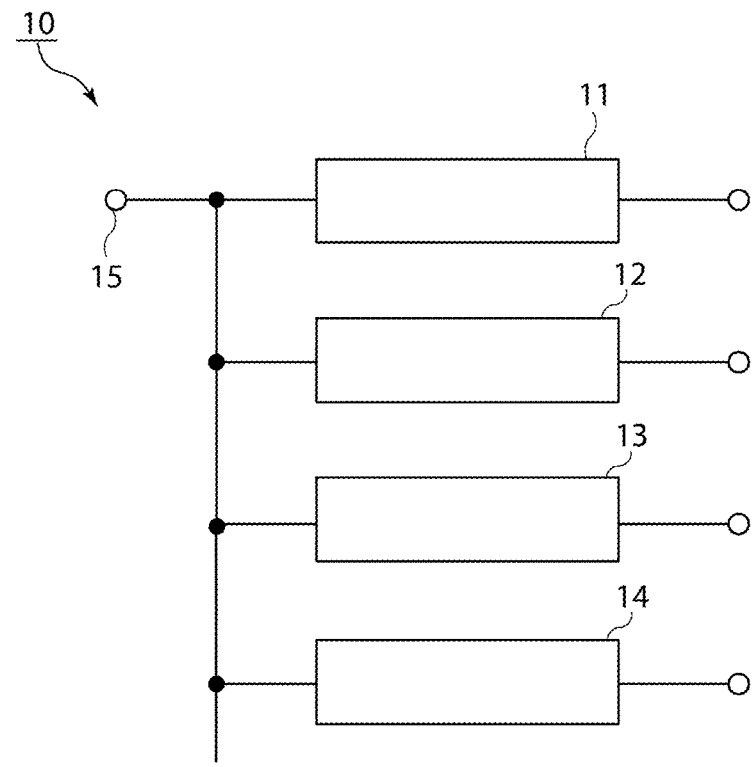
FIG. 9 is a circuit diagram of a multiplexer including the acoustic wave device of the first preferred embodiment of the present invention.
Figure 10:
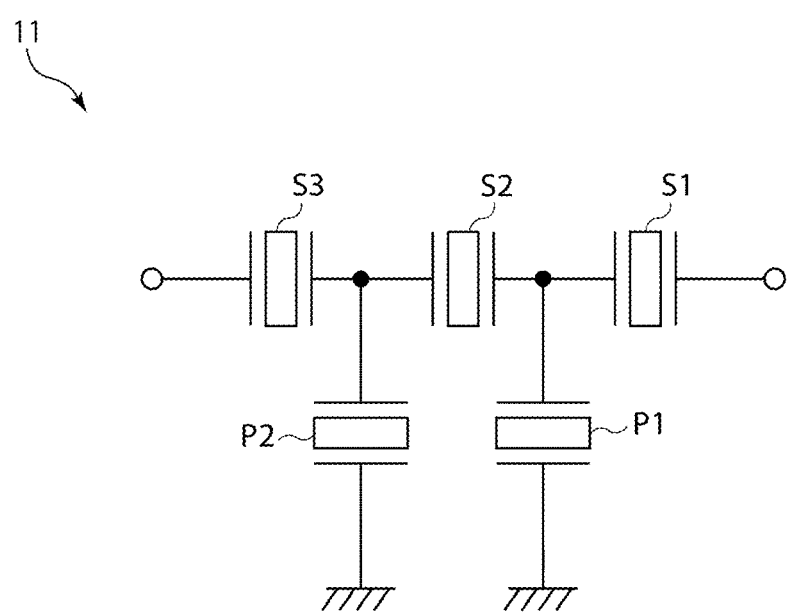
FIG. 10 is a circuit diagram illustrating an acoustic wave filter that is used in a multiplexer and includes the acoustic wave device of the first preferred embodiment of the present invention.

FIG. 9 is a circuit diagram of a multiplexer. In a multiplexer 10, first to fourth acoustic wave filters 11 to 14 are connected to each other via a common connection on an antenna terminal 15 side. FIG. 10 is a circuit diagram of the first acoustic wave filter 11. The first acoustic wave filter 11 includes a plurality of series arm resonators S1 to S3 and a plurality of parallel arm resonators P1 and P2. In other words, the first acoustic wave filter 11 is a ladder filter. The series arm resonators S1 to S3 and the parallel arm resonators P1 and P2 are preferably defined using the acoustic wave device 1 of the above-described preferred embodiment. The multiplexer 10 can be used as a carrier aggregation composite filter device, for example.

In a preferred embodiment of the present invention, the circuit configuration of an acoustic wave filter including the acoustic wave device according to the present preferred embodiment is not limited to this example. For example, an acoustic wave filter including a longitudinally coupled resonator filter may be used. In this case, the longitudinally coupled resonator acoustic wave filter may be an acoustic wave device of a preferred embodiment of the present invention. Alternatively, an acoustic wave resonator connected to a longitudinally coupled resonator acoustic wave filter may be defined by using an acoustic wave device according to a preferred embodiment of the present invention.

The pass bands of the first to fourth acoustic wave filters 11 to 14 are respectively referred to as first to fourth pass bands. The frequency positions of the pass bands are as follows: first pass band<second pass band<third pass band<fourth pass band.

For comparison, a multiplexer of a comparative example according to the present invention was prepared in which a first acoustic wave filter was configured in the same manner as in the above-described preferred embodiment except for use of the acoustic wave resonator having the reference structure.

Figure 11A:
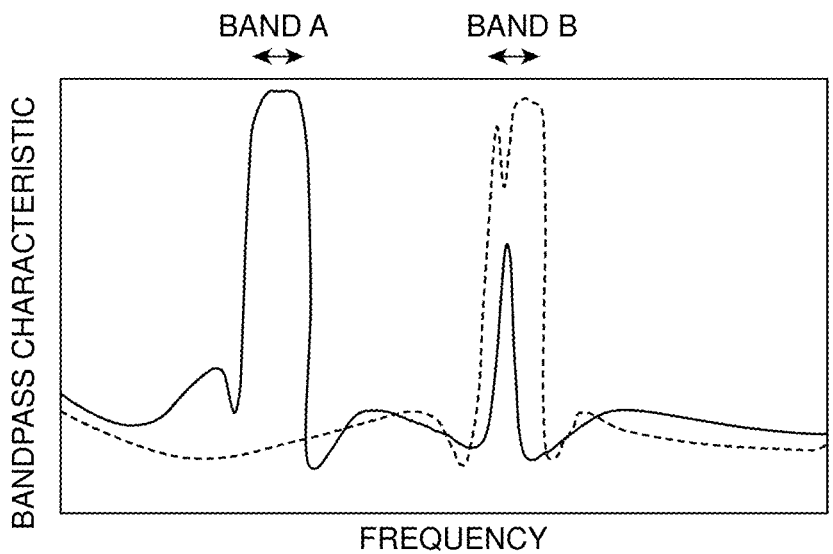
FIG. 11A is a diagram illustrating a filter characteristic of a multiplexer including an acoustic wave device of a comparative example and FIG. 11B is a diagram illustrating a filter characteristic of a multiplexer of the first preferred embodiment of the present invention.

FIG. 11A illustrates the filter characteristics of a first acoustic wave filter and a second acoustic wave filter of the multiplexer of the comparative example. The pass band of the first acoustic wave filter is a first pass band A. The pass band of the second acoustic wave filter is a second pass band B. A large ripple appears in the second pass band B. This is because a large response appears due to the first higher order mode of an acoustic wave resonator used in the first acoustic wave filter.

Figure 11B:
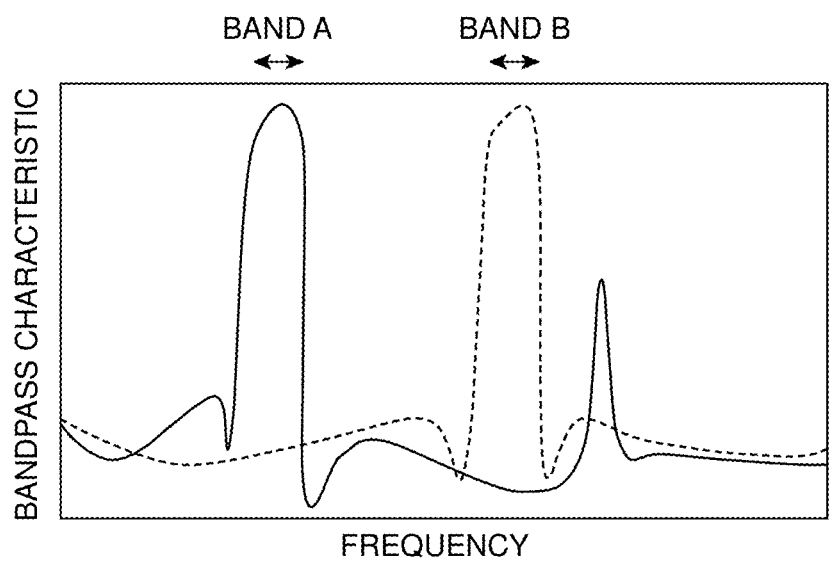

FIG. 11B is a diagram illustrating the filter characteristic of a multiplexer as a preferred embodiment of the present invention. Here, the first acoustic wave filter is provided using the acoustic wave device of the above-described preferred embodiment. Therefore, a large ripple does not appear in the second pass band B. In other words, a large ripple does not appear in the pass band B of the second acoustic wave filter, which is another filter. Therefore, degradation of the filter characteristic of the second acoustic wave filter is unlikely to occur.

Thus, in the multiplexer according to a preferred embodiment of the present invention, the response of the first higher order mode is reduced or prevented in the acoustic wave filters including the acoustic wave device configured in accordance with a preferred embodiment of the present invention, and therefore degradation of the filter characteristic of the other acoustic wave filter having a higher pass band can be effectively reduced or prevented.

Figure 12:
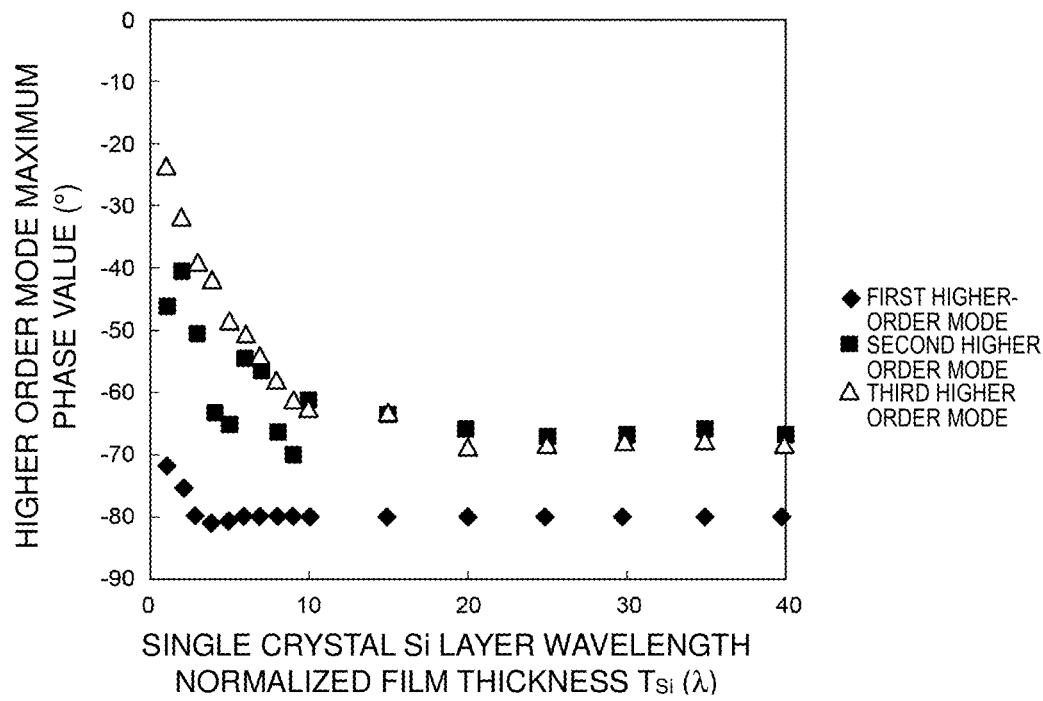
FIG. 12 is a diagram illustrating the relationships between a wavelength normalized film thickness $T_{Si}$ of a support substrate and the responses of first, second, and third higher order modes.

FIG. 12 is a diagram illustrating the relationship between the wavelength normalized film thickness $T_{Si}$ of the support substrate 2 and the response intensities S11 of the first higher order mode, the second higher order mode, and the third higher order mode. As is clear from FIG. 12, it is clear that the response intensities of the first higher order mode, the second higher order mode, and the third higher order mode can be more effectively reduced or prevented when $T_{Si}$>about 20.

Second Higher Order Mode

Figure 13:
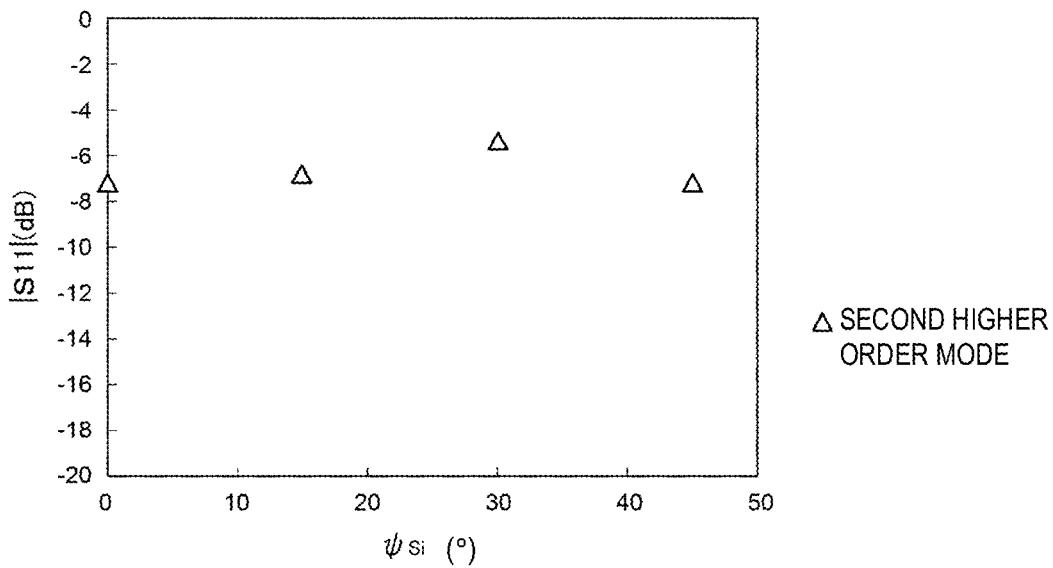
FIG. 13 is a diagram illustrating the relationship between a propagation direction $\psi_{Si}$ inside a support substrate and a response intensity S11 of a second higher order mode.
Figure 14:
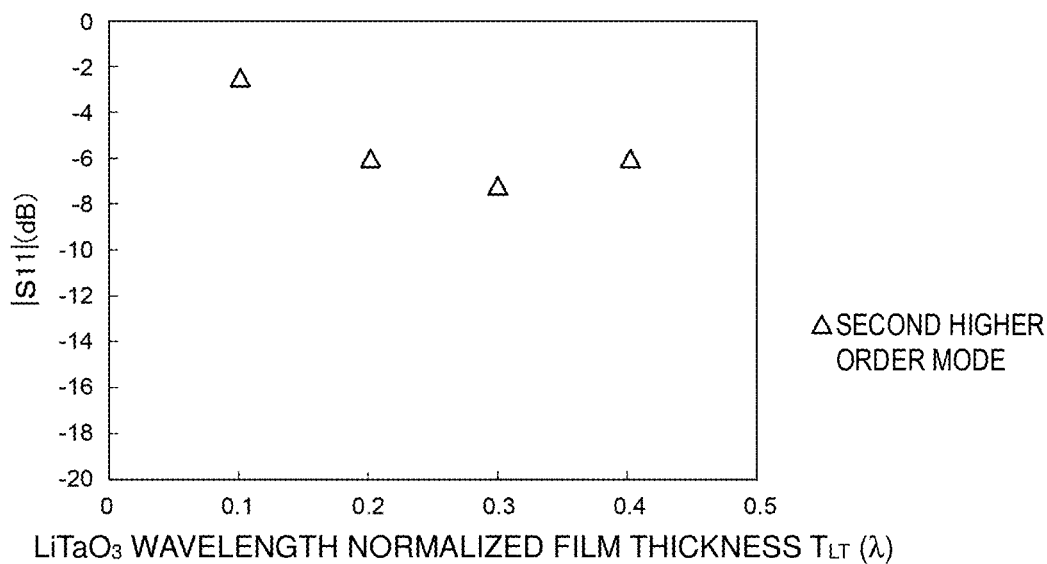
FIG. 14 is a diagram illustrating the relationship between a wavelength normalized film thickness $T_{LT}$ of a piezoelectric body made of lithium tantalate and the response intensity S11 of the second higher order mode.
Figure 15:
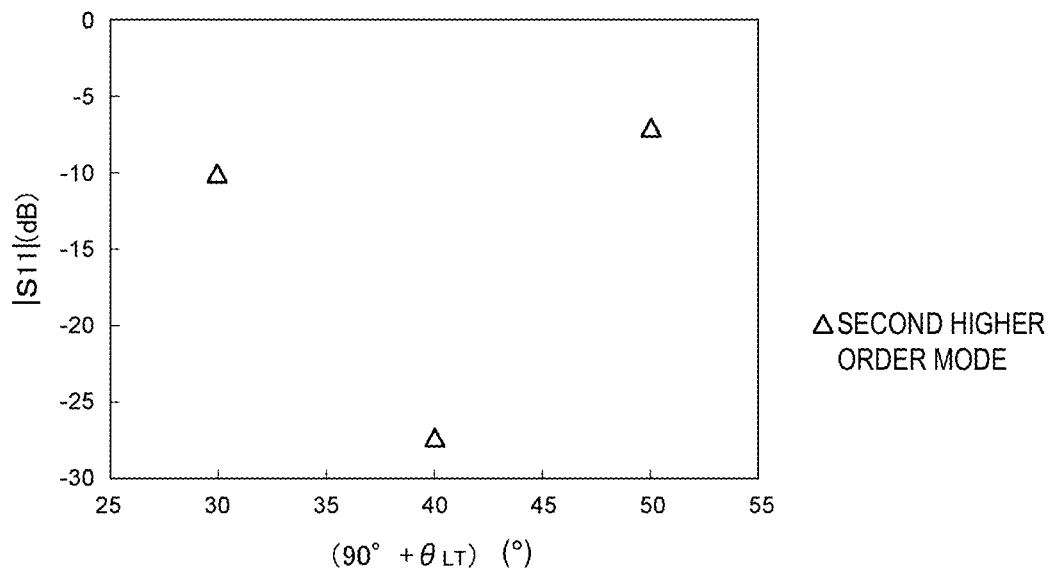
FIG. 15 is a diagram illustrating the relationship between a cut angle (90°+$\theta_{LT}$) of the piezoelectric body made of lithium tantalate and the response intensity S11 of the second higher order mode.

FIG. 13 is a diagram illustrating the relationship between the propagation direction $\psi_{Si}$ inside the support substrate and a response intensity S11 of a second higher order mode. As is clear from FIG. 13, the response intensity S11 of the second higher order mode changes when $\psi_{Si}$ changes. Similarly, as illustrated in FIG. 14, the response intensity S11 of the second higher order mode also changes in the case where the wavelength normalized film thickness $T_{LT}$ of the piezoelectric body made of lithium tantalate changes. As illustrated in FIG. 15, the response intensity S11 of the second higher order mode also changes in the case where the cut angle $(90°+\theta_{LT})$ of the piezoelectric body made of lithium tantalate changes.

Figure 16:
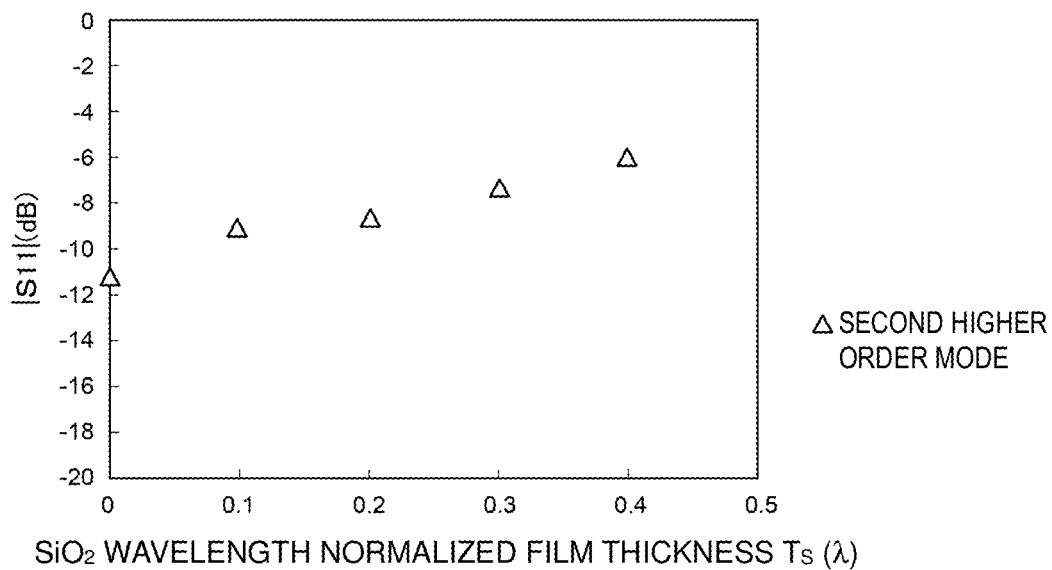
FIG. 16 is a diagram illustrating the relationship between a wavelength normalized film thickness $T_S$ of a silicon oxide film and the response intensity S11 of the second higher order mode.
Figure 17:
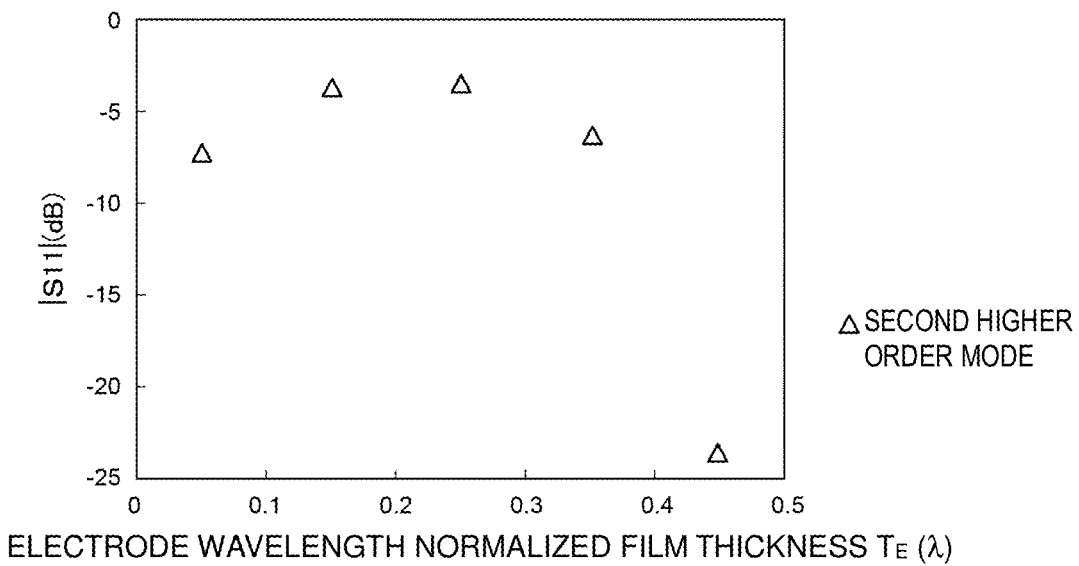
FIG. 17 is a diagram illustrating the relationship between a wavelength normalized film thickness $T_E$ of an IDT electrode and the response intensity S11 of the second higher order mode.
Figure 18:
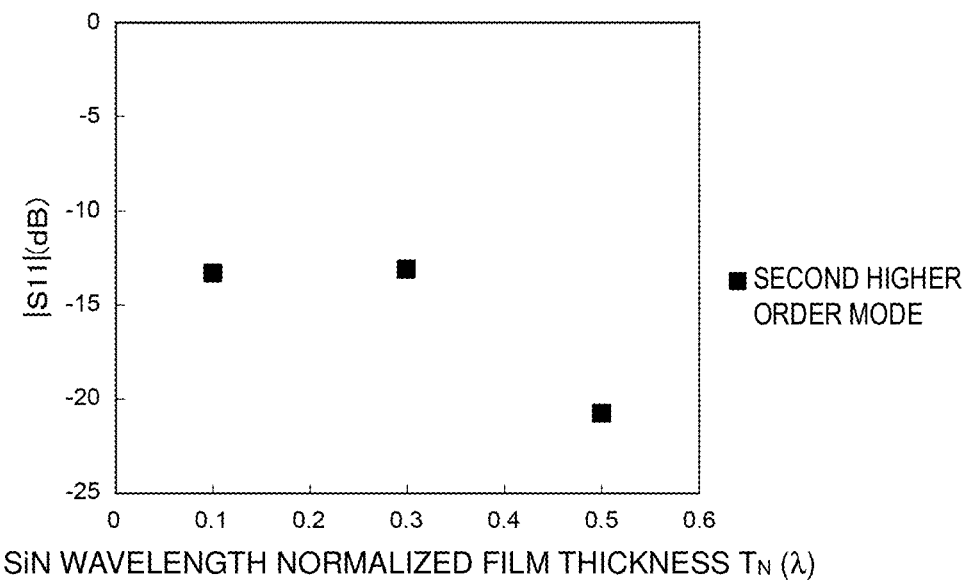
FIG. 18 is a diagram illustrating the relationship between a wavelength normalized film thickness $T_N$ of a silicon nitride film and the response intensity S11 of the second higher order mode.

As illustrated in FIG. 16, the response intensity S11 of the second higher order mode also changes in the case where the wavelength normalized film thickness $T_S$ of the silicon oxide film changes. Furthermore, as illustrated in FIG. 17, the response intensity S11 of the second higher order mode also changes in the case where the Al-converted wavelength normalized film thickness $T_E$ of the IDT electrode changes. In addition, as illustrated in FIG. 18, the response intensity S11 of the second higher order mode also changes in the case where the wavelength normalized film thickness $T_N$ of the silicon nitride film changes.

From the calculation results in FIGS. 13 to 18 and so forth, values of the coefficients in Formula (1) for achieving a $I_{h2}$ corresponding to the response intensity of the second higher order mode were obtained, similarly to as in the case of the first higher order mode. $I_{h2}$ corresponding to the response intensity of the second higher order mode can be expressed when the coefficients of Formula (1) are set as in above Tables 15 to 17 in accordance with the crystal orientation (100), (110), or (111) of the support substrate and the respective ranges of the wavelength normalized film thickness $T_{LT}$ of the piezoelectric body made of lithium tantalate, the wavelength normalized film thickness $T_N$ of the silicon nitride film, the wavelength normalized film thickness $T_S$ of the silicon oxide film, the wavelength normalized film thickness $T_E$ of the IDT electrode, and the propagation direction $\psi_{Si}$, and the second higher order mode response can also be made sufficiently small by determining $T_{LT}$, $\theta_{LT}$, $T_N$, $T_S$, $T_E$, and $\psi_{Si}$ conditions for which $I_h2$ is greater than or equal to about −2.4 among these values of $I_h2$ and by making $T_{Si}$>about 20.

Third Higher Order Mode

Figure 19:
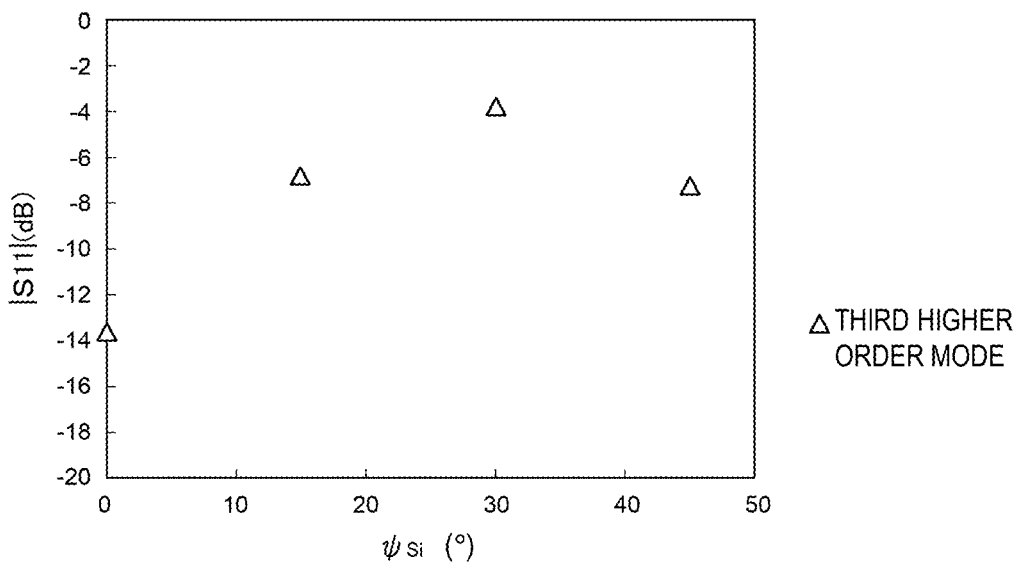
FIG. 19 is a diagram illustrating the relationship between a propagation direction $\psi_{Si}$ inside a support substrate and a response intensity S11 of a third higher order mode.
Figure 20:
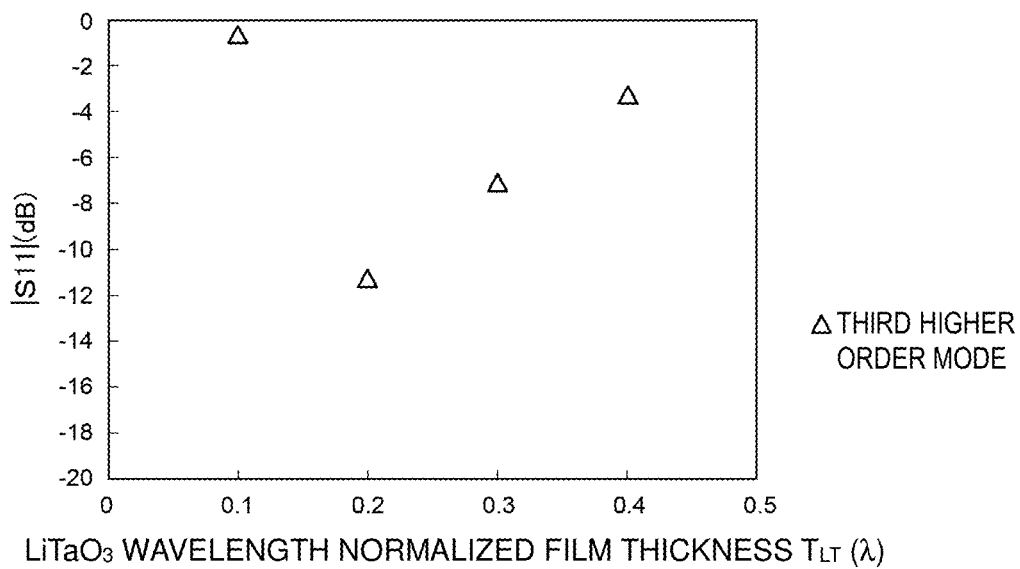
FIG. 20 is a diagram illustrating the relationship between a wavelength normalized film thickness $T_{LT}$ of a piezoelectric body made of lithium tantalate and the response intensity S11 of the third higher order mode.
Figure 21:
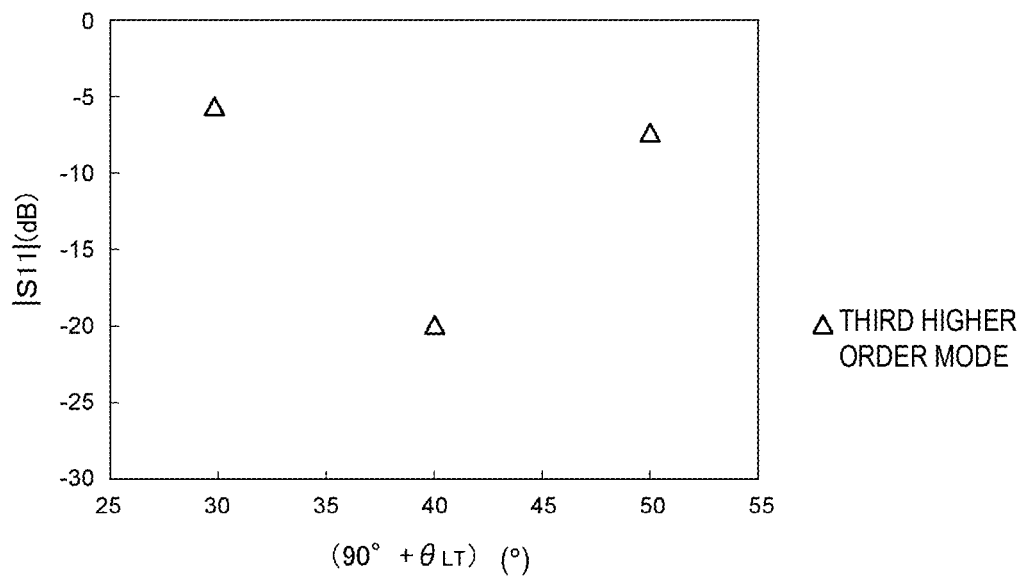
FIG. 21 is a diagram illustrating the relationship between a cut angle (90°+$\theta_{LT}$) of the piezoelectric body made of lithium tantalate and the response intensity S11 of the third higher order mode.
Figure 22:
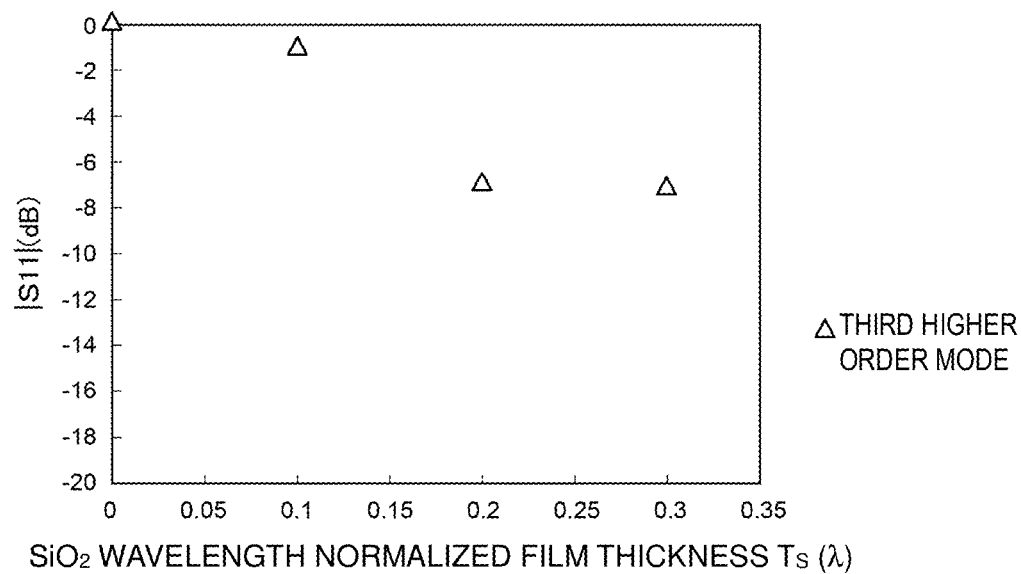
FIG. 22 is a diagram illustrating the relationship between a wavelength normalized film thickness $T_S$ of a silicon oxide film and the response intensity S11 of the third higher order mode.

FIG. 19 is a diagram illustrating the relationship between the propagation direction $\psi_{Si}$ inside the support substrate and a response intensity S11 of a third higher order mode. As is clear from FIG. 19, the response intensity S11 of the third higher order mode changes when $\psi_{Si}$ changes. Similarly, as illustrated in FIG. 20, the response intensity S11 of the third higher order mode also changes in the case where the wavelength normalized film thickness $T_{LT}$ of the piezoelectric body made of lithium tantalate changes. As illustrated in FIG. 21, the response intensity S11 of the third higher order mode also changes in the case where the cut angle (90°+$\theta_{LT}$) of the piezoelectric body made of lithium tantalate changes. As illustrated in FIG. 22, the response intensity S11 of the third higher order mode also changes in the case where the wavelength normalized film thickness $T_S$ of the silicon oxide film changes.

Figure 23:
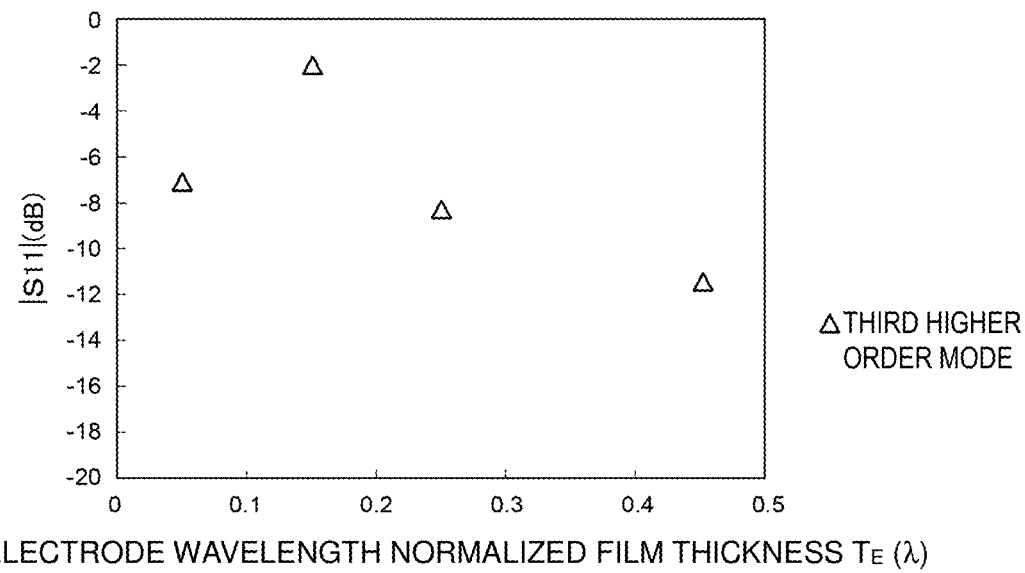
FIG. 23 is a diagram illustrating the relationship between a wavelength normalized film thickness $T_E$ of an IDT electrode and the response intensity S11 of the third higher order mode.
Figure 24:
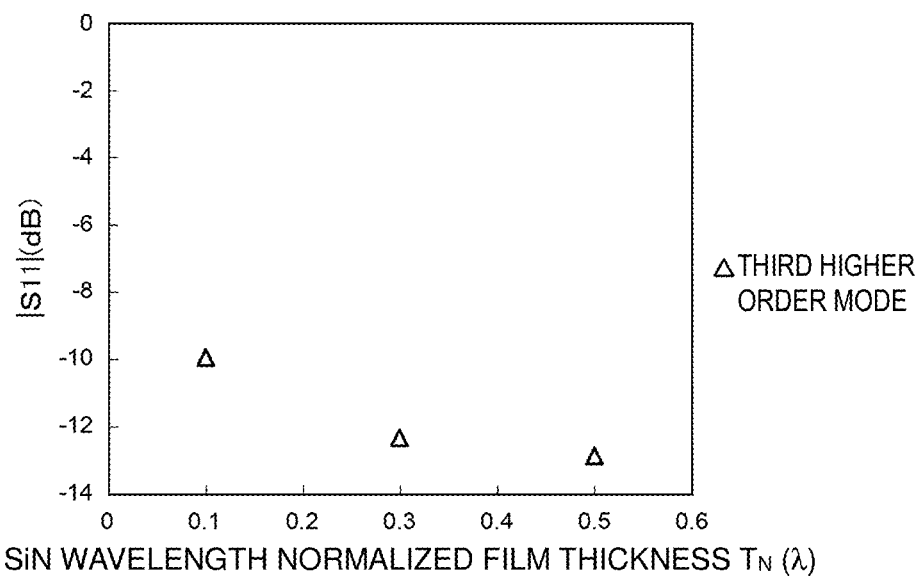
FIG. 24 is a diagram illustrating the relationship between a wavelength normalized film thickness $T_N$ of a silicon nitride film and the response intensity S11 of the third higher order mode.

Furthermore, as illustrated in FIG. 23, the response intensity S11 of the third higher order mode also changes in the case where the Al-converted wavelength normalized film thickness $T_E$ of the IDT electrode changes. In addition, as illustrated in FIG. 24, the response intensity S11 of the third higher order mode also changes in the case where the wavelength normalized film thickness $T_N$ of the silicon nitride film changes.

From FIGS. 19 to 24 and so forth, the values of the coefficients in Formula (1) expressing $I_{h3}$ corresponding to the response intensity of the third higher order mode expressed by Formula (1) were obtained. In other words, $I_{h3}$ corresponding to the response intensity of the third higher order mode can be expressed when the coefficients of Formula (1) are set as in above Tables 18 to 22 in accordance with the crystal orientation (100), (110), or (111) of the support substrate and the respective ranges of the wavelength normalized film thickness $T_{LT}$ of the piezoelectric body made of lithium tantalate, the wavelength normalized film thickness $T_N$ of the silicon nitride film, the wavelength normalized film thickness $T_S$ of the silicon oxide film, the wavelength normalized film thickness $T_E$ of the IDT electrode, and the propagation direction $\psi_{Si}$, and the third higher order mode response can be made sufficiently small by determining $T_{LT}$, $\theta_{LT}$, $T_N$, $T_S$, $T_E$, and $\psi_{Si}$ conditions for which $I_{h3}$ is greater than or equal to about −2.4 among these values of $I_{h3}$ and by making $T_{Si}$>about 20.

Structures of Preferred Embodiments

It is preferable that $I_h$>about −2.4 for all of the first higher order mode, the second higher order mode, and the third higher order mode. In this case, the effect of the first to third higher order modes on another acoustic wave filter can be effectively reduced or prevented. Furthermore, $I_h$>about −2.4 may be achieved for $I_h$ for the first higher order mode and the second higher order mode, $I_h$ for the first higher order mode and the third higher order mode, or $I_h$ for the second higher order mode and the third higher order mode.

In this case, the effect of two higher order modes from among the first to third higher order modes can be reduced or prevented.

When the structure according to preferred embodiments of the present invention is adopted, as described above, there is a tendency for a higher order mode to be trapped in a portion of the structure where the silicon oxide film 4 and the piezoelectric body 5 are stacked, but by making the portion where the silicon oxide film 4 and the piezoelectric body 5 are stacked thin by making the thickness of the piezoelectric body 5 less than or equal to about 3.5λ, for example, it becomes less likely that a higher-order mode will be trapped.

More preferably, the film thickness of the piezoelectric body 5 made of lithium tantalate is less than or equal to about 2.5λ, for example, and in this case, the absolute value of the temperature coefficient of frequency TCF can be reduced. Still more preferably, the film thickness of the piezoelectric body 5 made of lithium tantalate is less than or equal to about 1.5λ, for example. In this case, the electromechanical coupling coefficient can be easily adjusted. Still more preferably, the film thickness of the piezoelectric body 5 made of lithium tantalate is less than or equal to about 0.5λ, for example. In this case, the electromechanical coupling coefficient can be easily adjusted over a wide range.

In the present invention, crystallographically equivalent orientations are treated as being identical in each substrate material.

Silicon crystal orientations expressed as Si(100), Si(110), and Si(111) as mentioned above will be described in more detail below.

Figure 32:
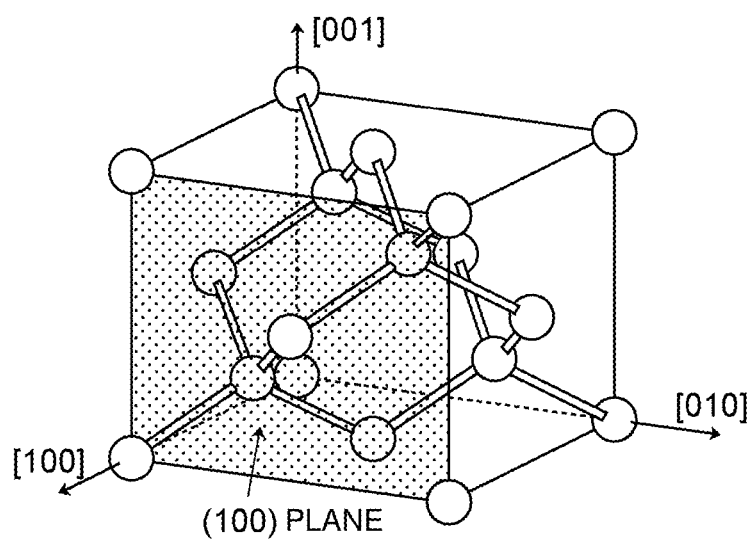
FIG. 32 is a schematic diagram explaining a crystal orientation.

As illustrated in FIG. 32, Si(100) represents a substrate that has been cut along the (100) plane perpendicular to the crystal axis represented by the Miller index [100] in a silicon crystal structure having a diamond structure. Crystallographically equivalent planes such as Si(010) are also included.

Figure 33:
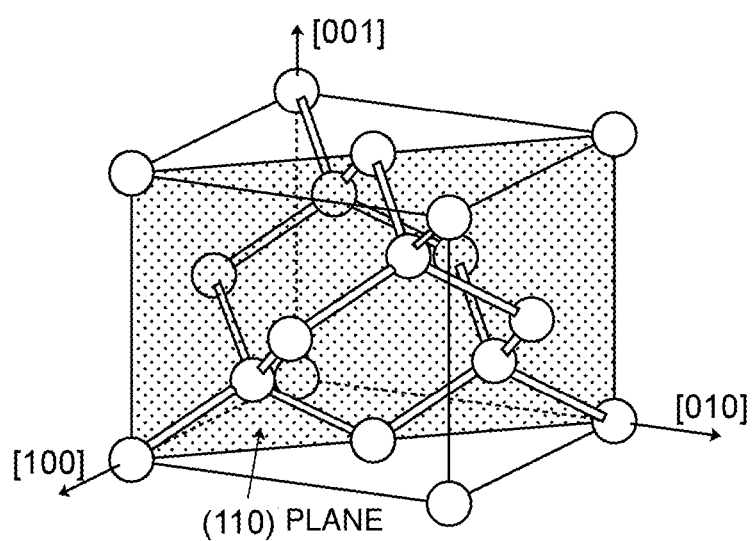
FIG. 33 is a schematic diagram explaining a crystal orientation.

As illustrated in FIG. 33, Si(110) represents a substrate that has been cut along the (110) plane perpendicular to the crystal axis represented by the Miller index [110] in a silicon crystal structure having a diamond structure. Other crystallographically equivalent planes are also included.

Figure 34:
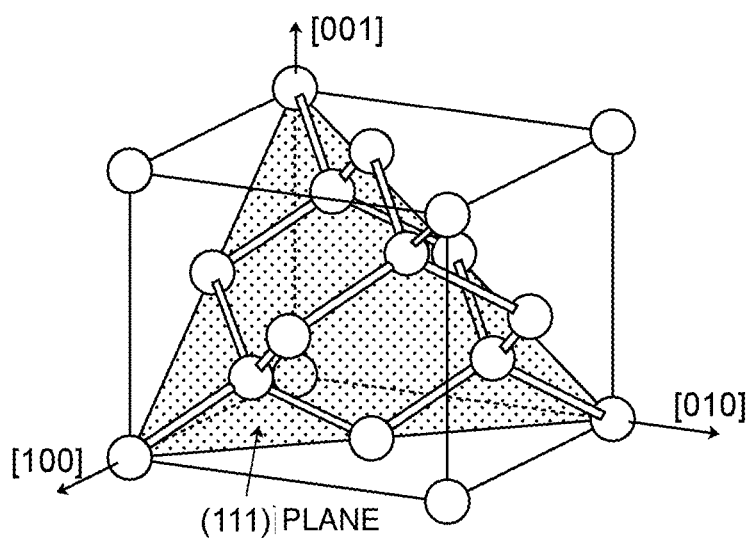
FIG. 34 is a schematic diagram explaining a crystal orientation.

As illustrated in FIG. 34, Si(111) represents a substrate that has been cut along the (111) plane perpendicular to the crystal axis represented by the Miller index [111] in a silicon crystal structure having a diamond structure. Other crystallographically equivalent planes are also included.

In above Formula (1), a) in the case where Si(100) (Euler angles ($\phi_{Si}$=about 0±5°, $\theta_{Si}$=about 0±5°, $\psi_{Si}$)) is used, the range of $\psi_{Si}$ is about 0°≤$\psi_{Si}$≤about 45°. However, due to the symmetry of the crystal structure of Si(100), $\psi_{Si}$ and $\psi_{Si}$±(n×90°) are synonymous (n=1, 2, 3 . . . ). Similarly, $\psi_{Si}$ and −$\psi_{Si}$ are synonymous.

(b) In the case where Si(110) (Euler angles ($\phi_{Si}$=about −45±5°, $\theta_{Si}$=about −90±5°, $\psi_{Si}$)) is used, the range of $\psi_{Si}$ is about 0°≤$\psi_{Si}$≤about 90°. Due to the symmetry of the crystal structure of Si(110), $\psi_{Si}$ and $\psi_{Si}$±(n×180°) are synonymous (n=1, 2, 3 . . . ). Similarly, $\psi_{Si}$ and −$\psi_{Si}$ are synonymous.

(c) In the case where Si(111) (Euler angles $\phi_{Si}$=about −45±5°, $\theta_{Si}$=about −54.73561±5°, $\psi_{Si}$)) is used, the range of $\psi_{Si}$ is about 0°≤$\psi_{Si}$≤about 60°. However, due to the symmetry of the crystal structure of Si(111), $\psi_{Si}$ and $\psi_{Si}$±(n× 120°) are synonymous (n=1, 2, 3 . . . ). Similarly, $\psi_{Si}$ and −$\psi_{Si}$ are synonymous.

In addition, although the range of $\theta_{LT}$ is about −180°<$\theta_{LT}$≤about 0°, $\theta_{LT}$ and $\theta_{LT}$ 180° may be treated as being synonymous.

In this specification, for example, in Euler angles (about 0°±5°, θ, about 0°±15°), "about 0°±5°" means within a range greater than or equal to about −5° and less than or equal to about +5° and "about 0°±15°" means within a range greater than or equal to about −15° and less than or equal to about +15°.

Figure 25:
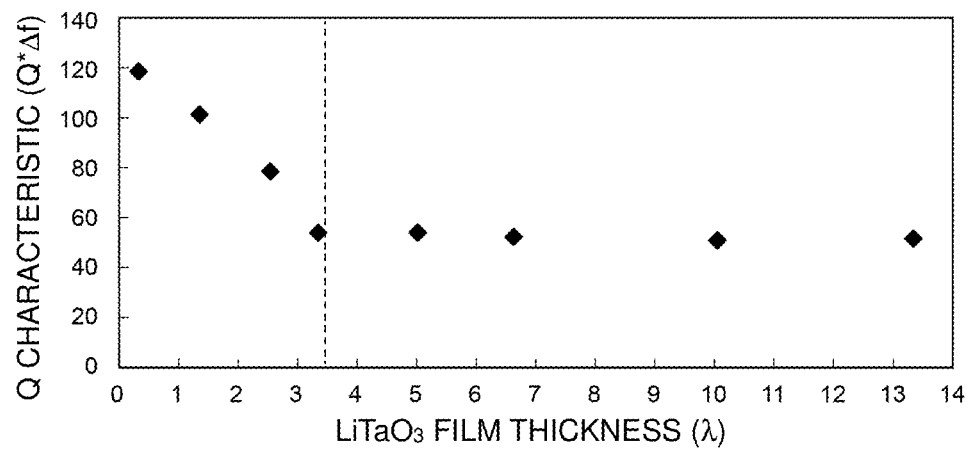
FIG. 25 is a diagram illustrating the relationship between the film thickness of a $LiTaO_3$ film and a Q value in an acoustic wave device.
Figure 26:
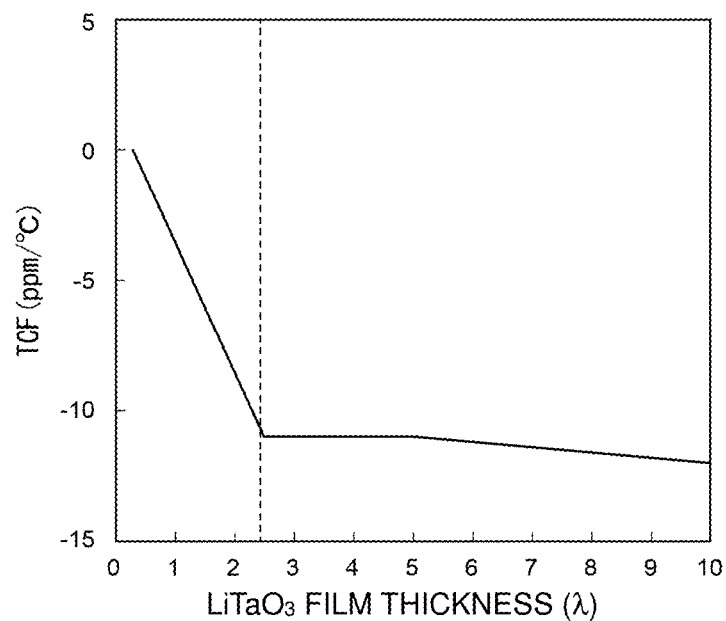
FIG. 26 is a diagram illustrating the relationship between the film thickness of a $LiTaO_3$ film and a temperature coefficient of frequency TCF in an acoustic wave device.
Figure 27:
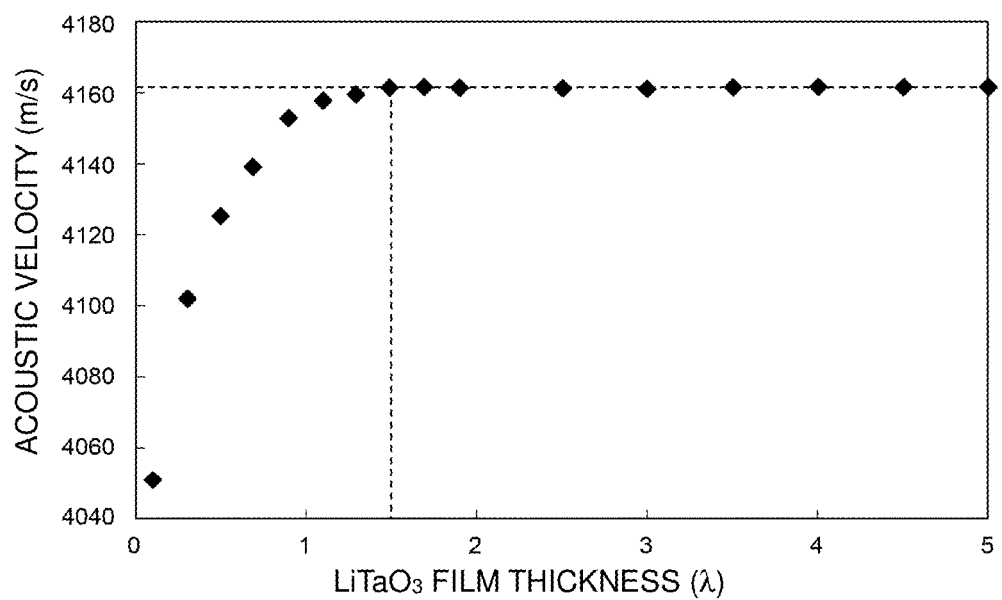
FIG. 27 is a diagram illustrating the relationship between the film thickness of a $LiTaO_3$ film and acoustic velocity in an acoustic wave device.

FIG. 25 is a diagram illustrating the relationship between the film thickness of a LiTaO₃ film and the Q value in an acoustic wave device in which a low-acoustic-velocity film made of a silicon oxide film having a thickness of about 0.35λ and a piezoelectric film made of lithium tantalate having Euler angles (about 0°, about −40°, about 0°) are stacked on a high-acoustic-velocity support substrate made of silicon. The vertical axis in FIG. 25 represents the product of a Q characteristic and a relative bandwidth (Δf) of a resonator. In addition, FIG. 26 is a diagram illustrating the relationship between the film thickness of a LiTaO₃ film and the temperature coefficient of frequency TCF. FIG. 27 is a diagram illustrating the relationship between the film thickness of a LiTaO₃ film and acoustic velocity. From FIG. 25, the film thickness of the LiTaO₃ film is preferably less than or equal to about 3.5λ. In this case, the Q value is higher than in the case where the film thickness is greater than about 3.5λ. More preferably, the film thickness of the LiTaO₃ film is less than or equal to about 2.5λ in order to further increase the Q value.

Furthermore, from FIG. 26, in the case where the film thickness of the LiTaO₃ film is less than or equal to about 2.5λ, the absolute value of the temperature coefficient of frequency TCF can be reduced compared with the case where the film thickness is greater than 2.5λ. More preferably, it is desirable that the film thickness of the LiTaO₃ film be less than or equal to about 2λ, and in this case, the absolute value of the temperature coefficient of frequency TCF can be made to be less than or equal to about 10 ppm/° C. It is further preferable that the film thickness of the LiTaO₃ film be less than or equal to about 1.5λ in order to reduce the absolute value of the temperature coefficient of frequency TCF.

From FIG. 27, if the film thickness of the LiTaO₃ film is greater than about 1.5λ, the change in acoustic velocity is very small.

Figure 28:
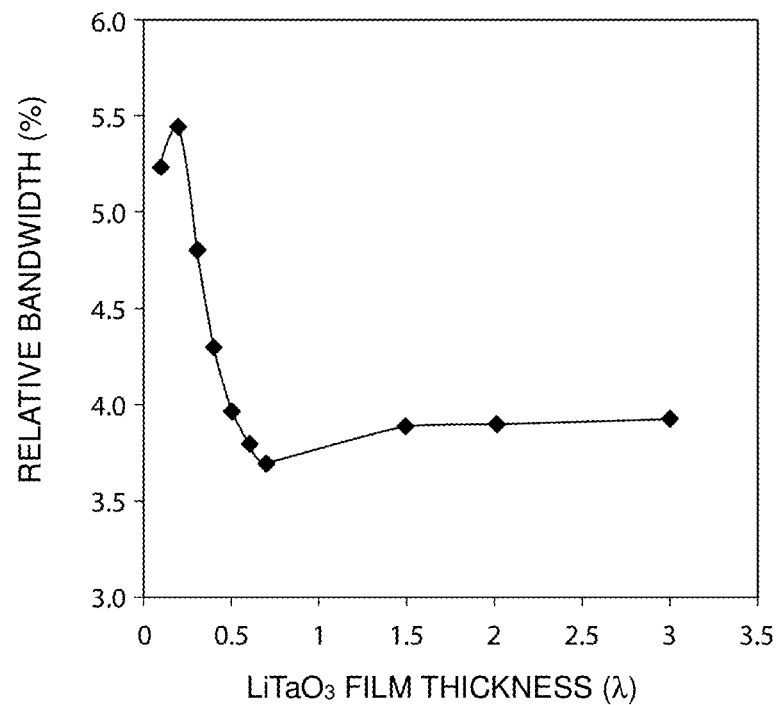
FIG. 28 is a diagram illustrating the relationship between $LiTaO_3$ film thickness and relative bandwidth.

As illustrated in FIG. 28, the relative bandwidth varies by a large amount in a film thickness range from about 0.05λ to about 0.5λ for the LiTaO₃ film. Therefore, the electromechanical coupling coefficient can be adjusted over a wider range. Therefore, it is desirable that the film thickness of the LiTaO₃ film lie in a range from about 0.05λ to about 0.5λ in order to widen the range over which the electromechanical coupling coefficient and the relative bandwidth can be adjusted.

Figure 29:
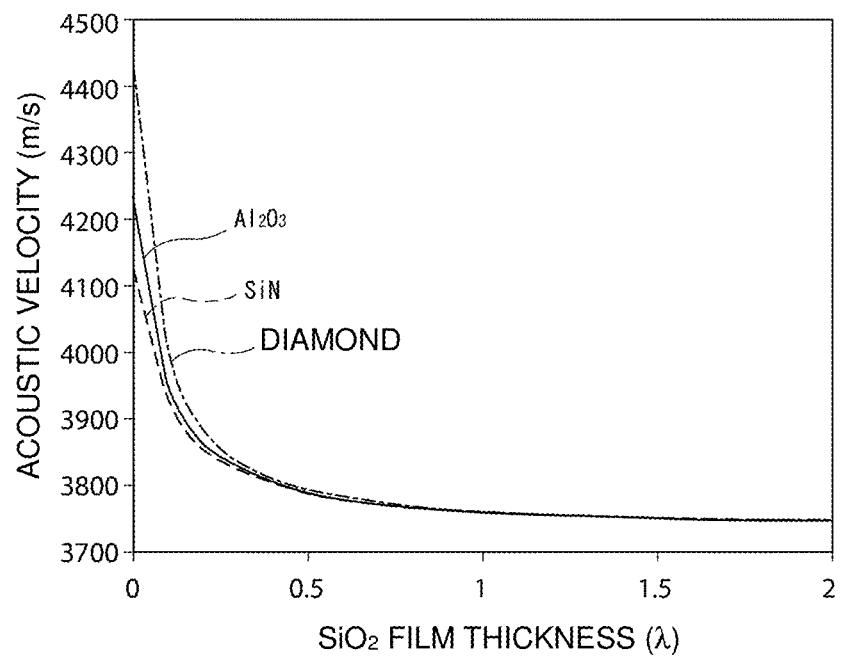
FIG. 29 is a diagram illustrating the relationships between the film thickness of a silicon oxide film, the material of a high-acoustic-velocity film, and acoustic velocity.
Figure 30:
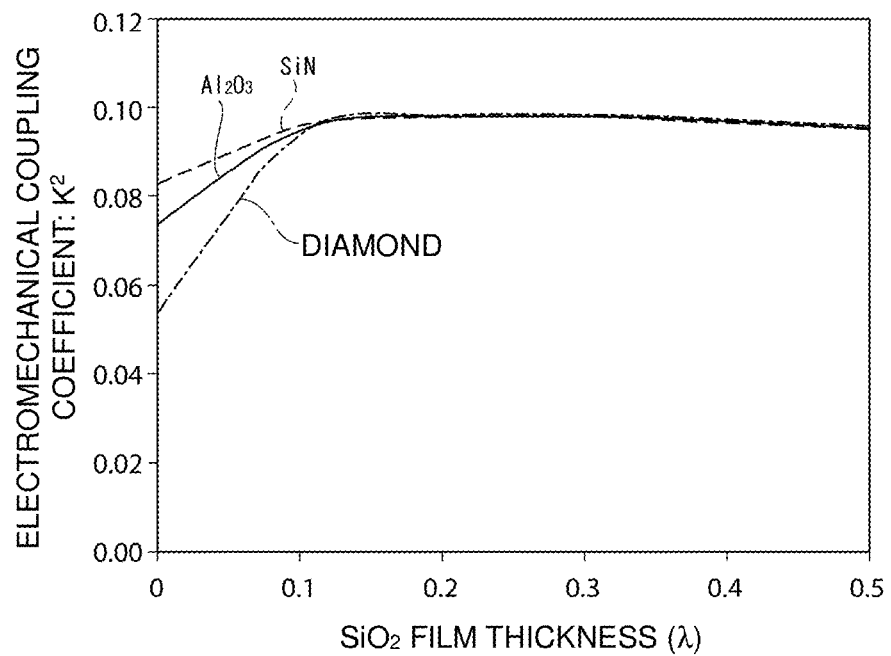
FIG. 30 is a diagram illustrating the relationship between the film thickness of a silicon oxide film, an electromechanical coupling coefficient, and the material of a high-acoustic-velocity film.

FIGS. 29 and 30 are diagrams respectively illustrating the relationships between the silicon oxide film thickness (λ) and the acoustic velocity and the electromechanical coupling coefficient. Here, a silicon nitride film, an aluminum oxide film, and diamond were used as the high-acoustic-velocity film underneath the low-acoustic-velocity film made of SiO₂. The film thickness of the high-acoustic-velocity film was about 1.5λ. The acoustic velocity of a bulk wave in silicon nitride is about 6000 m/s, the acoustic velocity of a bulk wave in aluminum oxide is about 6000 m/s, and the acoustic velocity of a bulk wave in diamond is about 12800 m/s. As illustrated in FIGS. 29 and 30, the electromechanical coupling coefficient and the acoustic velocity substantially do not change even when the material of the high-acoustic-velocity film and the film thickness of the silicon oxide film are changed. In particular, from FIG. 30, it is clear that the electromechanical coupling coefficient substantially does not change regardless of the material of the high-acoustic-velocity film when the film thickness of the silicon oxide film lies in the range from about 0.1λ to about 0.5λ. Furthermore, it is clear from FIG. 29 that the acoustic velocity does not change regardless of the material of the high-acoustic-velocity film when the film thickness of the silicon oxide film lies in a range from about 0.3λ to about 2λ. Therefore, the film thickness of the low-acoustic-velocity film made of silicon oxide is preferably less than or equal to about 2λ and more preferably less than or equal to about 0.5λ.

The acoustic wave devices of the above-described preferred embodiments can be used as a component such as a multiplexer of a radio-frequency front end circuit, for example. An example of such a radio-frequency front end circuit will be described below.

Figure 31:
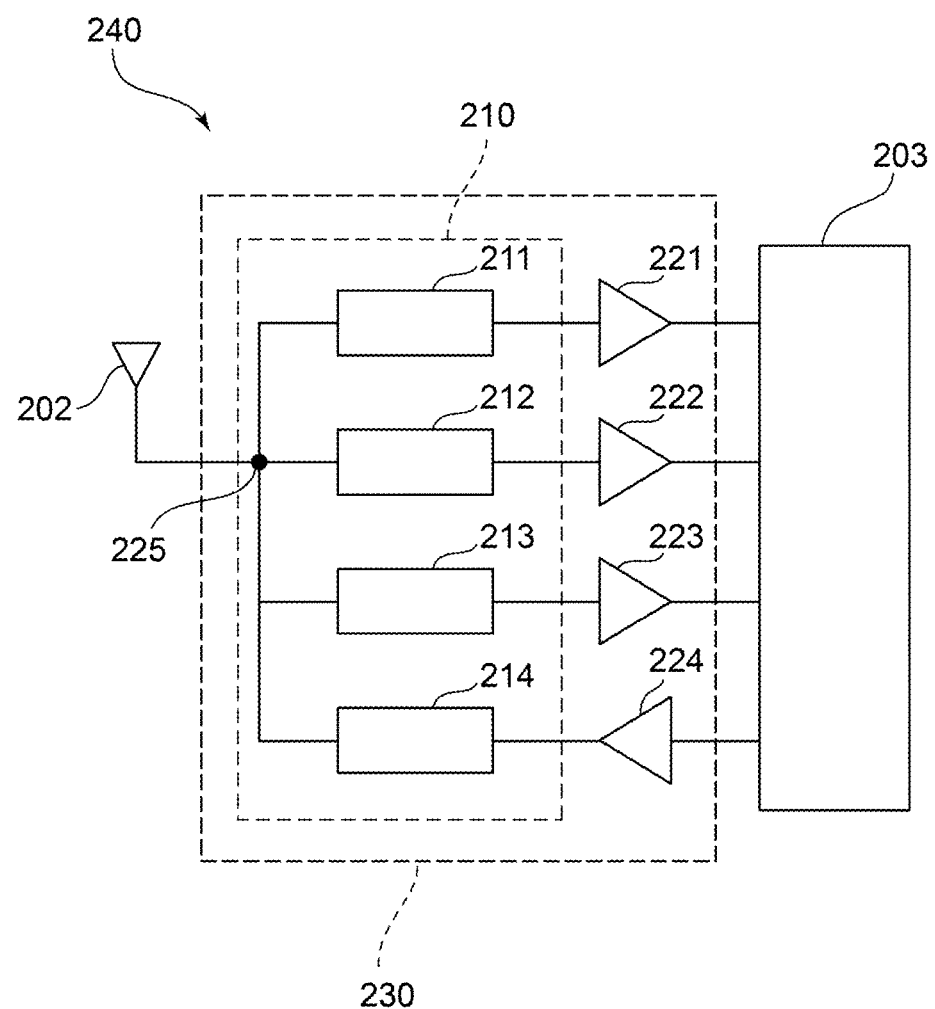
FIG. 31 is a configuration diagram of a communication device according to a preferred embodiment of the present invention that includes a radio-frequency front end circuit.

FIG. 31 is a schematic configuration diagram of a communication device according to a preferred embodiment of the present invention that includes a radio-frequency front end circuit. A communication device 240 includes an antenna 202, a radio-frequency front end circuit 230, and an RF signal processing circuit 203. The radio-frequency front end circuit 230 is a circuit section that is connected to the antenna 202. The radio-frequency front end circuit 230 includes a multiplexer 210 and amplifiers 221 to 224. The multiplexer 210 includes first to fourth filters 211 to 214. The above-described preferred embodiment of the multiplexer of the present invention can be used as the multiplexer 210. The multiplexer 210 preferably includes an antenna common terminal 225 that is connected to the antenna 202. First terminals of the first to third filters 211 to 213, which are reception filters, and a first terminal of the fourth filter 214, which is a transmission filter, are connected to the antenna common terminal 225 via a common connection. Output terminals of the first to third filters 211 to 213 are respectively connected to the amplifiers 221 to 223. In addition, the amplifier 224 is connected to an input terminal of the fourth filter 214.

The output terminals of the amplifiers 221 to 223 are connected to the RF signal processing circuit 203. The input terminal of the amplifier 224 is connected to the RF signal processing circuit 203.

A multiplexer according to a preferred embodiment of the present invention can be suitably used as the multiplexer 210 in the communication device 240.

A multiplexer according to a preferred embodiment of the present invention may include only a plurality of transmission filters or may include a plurality of reception filters.

The multiplexer includes n band pass filters, where n is greater than or equal to 2. Therefore, the multiplexer according to a preferred embodiment of the present invention may be implemented as a duplexer.

Preferred embodiments of the present invention are widely applicable to communication devices such as mobile phones in the form of filters, multiplexers applicable to multi-band systems, front end circuits, and communication devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support substrate made of silicon;
   a silicon nitride film on the support substrate;
   a silicon oxide film on the silicon nitride film;
   a piezoelectric body on the silicon oxide film and made of lithium tantalate; and
an InterDigital Transducer (IDT) electrode on one main surface of the piezoelectric body; wherein
   when $\lambda$ is a wavelength determined by an electrode finger pitch of the IDT electrode, $T_{LT}$ is a wavelength normalized film thickness of the piezoelectric body, $\theta_{LT}$ is a Euler angle $\theta$ of the piezoelectric body, $T_N$ is a wavelength normalized film thickness of the silicon nitride film, $T_S$ is a wavelength normalized film thickness of the silicon oxide film, $T_E$ is a wavelength normalized film thickness of the IDT electrode obtained from a product of a wavelength normalized film thickness of the IDT electrode and a ratio of a density of the IDT electrode to a density of aluminum and expressed as an aluminum thickness, $\psi_{Si}$ is a propagation direction inside the support substrate, and $T_{Si}$ is a wavelength normalized film thickness of the support substrate, $T_{LT}$, $\theta_{LT}$, $T_N$, $T_S$, $T_E$, and $\psi_{Si}$ are set so that at least one of $I_h$ corresponding to a response intensity of a first higher order mode, $I_h$ corresponding to a response intensity of a second higher order mode, and $I_h$ corresponding to a response intensity of a third higher order mode is greater than about −2.4, and $T_{Si}$>about 20;

$$\begin{aligned}
I_h = &\ a_{T_{LT}}^{(2)}\left((T_{LT}-c_{T_{LT}})^2 - b_{T_{LT}}^{(2)}\right) + a_{T_{LT}}^{(1)}(T_{LT}-c_{T_{LT}}) + \\
&\ a_{T_S}^{(2)}\left((T_S-c_{T_S})^2 - b_{T_S}^{(2)}\right) + a_{T_S}^{(1)}(T_S-c_{T_S}) + a_{T_N}^{(3)}\left((T_N-c_{T_N})^3 - b_{T_N}^{(3)}\right) + \\
&\ a_{T_N}^{(2)}\left((T_N-c_{T_N})^2 - b_{T_N}^{(2)}\right) + a_{T_N}^{(1)}(T_N-c_{T_N}) + a_{T_E}^{(2)}\left((T_E-c_{T_E})^2 - b_{T_E}^{(2)}\right) + \\
&\ a_{T_E}^{(1)}(T_E-c_{T_E}) + a_{\psi_{Si}}^{(4)}\left((\psi_{Si}-c_{\psi_{Si}})^4 - b_{\psi_{Si}}^{(4)}\right) + \\
&\ a_{\psi_{Si}}^{(3)}\left((\psi_{Si}-c_{\psi_{Si}})^3 - b_{\psi_{Si}}^{(3)}\right) + a_{\psi_{Si}}^{(2)}\left((\psi_{Si}-c_{\psi_{Si}})^2 - b_{\psi_{Si}}^{(2)}\right) + \\
&\ a_{\psi_{Si}}^{(1)}(\psi_{Si}-c_{\psi_{Si}}) + a_{\theta_{LT}}^{(2)}\left((\theta_{LT}-c_{\theta_{LT}})^2 - b_{\theta_{LT}}^{(2)}\right) + \\
&\ a_{\theta_{LT}}^{(1)}(\theta_{LT}-c_{\theta_{LT}}) + d_{T_{LT}T_S}(T_{LT}-c_{T_{LT}})(T_S-c_{T_S}) + \\
&\ d_{T_{LT}T_N}(T_{LT}-c_{T_{LT}})(T_N-c_{T_N}) + d_{T_{LT}T_E}(T_{LT}-c_{T_{LT}})(T_E-c_{T_E}) + \\
&\ d_{T_{LT}\psi_{Si}}(T_{LT}-c_{T_{LT}})(\psi_{Si}-c_{\psi_{Si}}) + d_{T_{LT}\theta_{LT}}(T_{LT}-c_{T_{LT}})(\theta_{LT}-c_{\theta_{LT}}) + \\
&\ d_{T_S T_N}(T_S-c_{T_S})(T_N-c_{T_N}) + d_{T_S T_E}(T_S-c_{T_S})(T_E-c_{T_E}) + \\
&\ d_{T_S \psi_{Si}}(T_S-c_{T_S})(\psi_{Si}-c_{\psi_{Si}}) + d_{T_S \theta_{LT}}(T_S-c_{T_S})(\theta_{TL}-c_{\theta_{LT}}) + \\
&\ d_{T_N T_E}(T_N-c_{T_N})(T_E-c_{T_E}) + d_{T_N \psi_{Si}}(T_N-c_{T_N})(\psi_{Si}-c_{\psi_{Si}}) + \\
&\ d_{T_N \theta_{LT}}(T_N-c_{T_N})(\theta_{LT}-c_{\theta_{LT}}) + d_{T_E \psi_{Si}}(T_E-c_{T_E})(\psi_{Si}-c_{\psi_{Si}}) + \\
&\ d_{T_E \theta_{LT}}(T_E-c_{T_E})(\theta_{TL}-c_{\theta_{LT}}) + d_{\psi_{Si} \theta_{LT}}(\psi_{Si}-c_{\psi_{Si}})(\theta_{TL}-c_{\theta_{LT}}) + e;
\end{aligned}$$

Formula (1)

coefficients a, b, c, d, and e in the above Formula (1) are values listed in Tables 1 to 11 below determined in accordance with a crystal orientation of the support substrate, a type of higher order mode indicating either the first higher order mode, the second higher order mode, or the third higher order mode, and respective ranges of the wavelength normalized film thickness $T_S$ of the silicon oxide film, the wavelength normalized film thickness $T_{LT}$ of the piezoelectric body, and the propagation direction $\psi_{Si}$ inside the support substrate:

TABLE 1

| | Si(100) FIRST HIGHER ORDER MODE | |
|---|---|---|
| | $0 < T_{LT} < 0.25$ | $0.25 \le T_{LT} \le 3.5$ |
| $a_{TLT}^{(2)}$ | 0 | 0 |
| $a_{TLT}^{(1)}$ | −14.83429368 | 3.069902124 |
| $b_{TLT}^{(2)}$ | 0 | 0 |
| $c_{TLT}$ | 0.221296296 | 0.274301676 |
| $a_{TS}^{(2)}$ | 0 | 0 |
| $a_{TS}^{(1)}$ | −5.435055656 | −11.51705287 |
| $b_{TS}^{(2)}$ | 0 | 0 |
| $c_{TS}$ | 0.244907407 | 0.246648045 |
| $a_{TN}^{(3)}$ | 0 | 0 |
| $a_{TN}^{(2)}$ | 0 | 0 |
| $a_{TN}^{(1)}$ | 0.954625056 | 2.416190553 |
| $b_{TN}^{(3)}$ | 0 | 0 |
| $b_{TN}^{(2)}$ | 0 | 0 |
| $c_{TN}$ | 0.32037037 | 0.345810056 |
| $a_{TE}^{(2)}$ | 163.7465036 | 194.8374496 |
| $a_{TE}^{(1)}$ | 8.852421424 | 2.920900643 |
| $b_{TE}^{(2)}$ | 0.001465714 | 0.001392903 |
| $c_{TE}$ | 0.153587963 | 0.15377095 |
| $a_{\psi Si}^{(4)}$ | 0 | 0 |
| $a_{\psi Si}^{(3)}$ | 0 | 0 |
| $a_{\psi Si}^{(2)}$ | 0 | 0.004515779 |
| $a_{\psi Si}^{(1)}$ | 0.078396962 | 0.109748177 |
| $b_{\psi Si}^{(4)}$ | 0 | 0 |
| $b_{\psi Si}^{(3)}$ | 0 | 0 |
| $b_{\psi Si}^{(2)}$ | 0 | 64.80134827 |
| $c_{\psi Si}$ | 7.083333333 | 10.05586592 |
| $a_{\theta LT}^{(2)}$ | 0 | 0 |
| $a_{\theta LT}^{(1)}$ | −0.024815031 | 0.020111202 |
| $b_{\theta LT}^{(2)}$ | 0 | 0 |
| $c_{\theta LT}$ | −52.03703704 | −51.79888268 |
| $d_{TLTTS}$ | 0 | 0 |
| $d_{TLTTN}$ | 0 | 0 |
| $d_{TLTTE}$ | 0 | −307.8174848 |
| $d_{TLT\psi Si}$ | 0 | 0 |
| $d_{TLT\theta LT}$ | 1.483479323 | 0 |
| $d_{TSTN}$ | 0 | 0 |
| $d_{TSTE}$ | 0 | 0 |
| $d_{TS\psi Si}$ | −1.673812731 | −1.384976956 |
| $d_{TS\theta LT}$ | 0 | 0.672070071 |
| $d_{TNTE}$ | 0 | 0 |
| $d_{TN\psi Si}$ | 0 | 0 |
| $d_{TN\psi LT}$ | 0 | −0.108878788 |
| $d_{TE\psi Si}$ | 0 | 0 |
| $d_{TE\theta LT}$ | 0 | 0 |
| $d_{\psi Si\theta LT}$ | 0.002868735 | 0 |
| e | −2.09327176 | −2.154987875 |

TABLE 2

| | Si(110) FIRST HIGHER ORDER MODE | |
|---|---|---|
| | $0 \le \psi_{Si} < 30$ | $30 \le \psi_{Si} \le 90$ |
| $a_{TLT}^{(2)}$ | 0 | 0 |
| $a_{TLT}^{(1)}$ | −12.83201212 | −9.646567168 |
| $b_{TLT}^{(2)}$ | 0 | 0 |
| $c_{TLT}$ | 0.256470538 | 0.250903614 |
| $a_{TS}^{(2)}$ | 156.859599 | |
| $a_{TS}^{(1)}$ | −21.52776656 | −15.1877177 |
| $b_{TS}^{(2)}$ | 0.001522145 | 0 |
| $c_{TS}$ | 0.261176471 | 0.243825301 |
| $a_{TN}^{(3)}$ | 0 | 0 |
| $a_{TN}^{(2)}$ | 0 | 0 |
| $a_{TN}^{(1)}$ | 18.19696789 | 8.364202341 |
| $b_{TN}^{(3)}$ | 0 | 0 |
| $b_{TN}^{(2)}$ | 0 | 0 |
| $c_{TN}$ | 0.152941176 | 0.272891566 |
| $a_{TE}^{(2)}$ | 0 | 0 |
| $a_{TE}^{(1)}$ | −6.461494684 | −4.137739161 |
| $b_{TE}^{(2)}$ | 0 | 0 |
| $c_{TE}$ | 0.152941176 | 0.153463855 |

TABLE 2-continued

Si(110)
FIRST HIGHER ORDER MODE

| | $0 \leq \psi_{Si} < 30$ | $30 \leq \psi_{Si} \leq 90$ |
|---|---|---|
| $a_{\psi Si}^{(4)}$ | 0 | 0 |
| $a_{\psi Si}^{(3)}$ | 0 | 0 |
| $a_{\psi Si}^{(2)}$ | −0.007084639 | −0.003013228 |
| $a_{\psi Si}^{(1)}$ | −0.301466226 | −0.031376567 |
| $b_{\psi Si}^{(4)}$ | 0 | 0 |
| $b_{\psi Si}^{(3)}$ | 0 | 0 |
| $b_{\psi Si}^{(2)}$ | 49.58131488 | 795.684243 |
| $c_{\psi Si}$ | 25.35294118 | 60.63253012 |
| $a_{\theta LT}^{(2)}$ | 0 | 0 |
| $a_{\theta LT}^{(1)}$ | 0 | 0.009367138 |
| $b_{\theta LT}^{(2)}$ | 0 | 0 |
| $c_{\theta LT}$ | 0 | −52 |
| $d_{TLTTS}$ | 140.9204814 | 0 |
| $d_{TLTTN}$ | 0 | 24.32908352 |
| $d_{TLTTE}$ | 0 | 0 |
| $d_{TLT\psi Si}$ | 0 | 0 |
| $d_{TLT\theta LT}$ | 0 | 0 |
| $d_{TSTN}$ | 51.74259913 | 53.37502263 |
| $d_{TSTE}$ | 0 | 0 |
| $d_{TS\psi Si}$ | 0 | 0 |
| $d_{TS\theta LT}$ | 0 | 0 |
| $d_{TNTE}$ | 0 | 0 |
| $d_{TN\psi Si}$ | 0 | −0.241253979 |
| $d_{TN\psi LT}$ | 0 | 0 |
| $d_{TE\psi Si}$ | 0 | 0 |
| $d_{TE\theta LT}$ | 0 | 0.503490956 |
| $d_{\psi Si\theta LT}$ | 0 | 0 |
| e | −1.714086264 | −1.062610881 |

TABLE 3

Si(111)
FIRST HIGHER ORDER MODE

| | |
|---|---|
| $a_{TLT}^{(2)}$ | 0 |
| $a_{TLT}^{(1)}$ | −11.07513554 |
| $b_{TLT}^{(2)}$ | 0 |
| $c_{TLT}$ | 0.253819444 |
| $a_{TS}^{(2)}$ | 0 |
| $a_{TS}^{(1)}$ | −14.53606605 |
| $b_{TS}^{(2)}$ | 0 |
| $c_{TS}$ | 0.255555556 |
| $a_{TN}^{(3)}$ | 0 |
| $a_{TN}^{(2)}$ | −27.47980058 |
| $a_{TN}^{(1)}$ | 11.21718185 |
| $b_{TN}^{(3)}$ | 0 |
| $b_{TN}^{(2)}$ | 0.012775849 |
| $c_{TN}$ | 0.198611111 |
| $a_{TE}^{(2)}$ | 0 |
| $a_{TE}^{(1)}$ | 0 |
| $b_{TE}^{(2)}$ | 0 |
| $c_{TE}$ | 0 |
| $a_{\psi Si}^{(4)}$ | 0 |
| $a_{\psi Si}^{(3)}$ | 0 |
| $a_{\psi Si}^{(2)}$ | 0 |
| $a_{\psi Si}^{(1)}$ | 0.199446167 |
| $b_{\psi Si}^{(4)}$ | 0 |
| $b_{\psi Si}^{(3)}$ | 0 |
| $b_{\psi Si}^{(2)}$ | 0 |
| $c_{\psi Si}$ | 31.80555556 |
| $a_{\theta LT}^{(2)}$ | 0 |
| $a_{\theta LT}^{(1)}$ | 0.020411672 |
| $b_{\theta LT}^{(2)}$ | 0 |
| $c_{\theta LT}$ | −49.55555556 |
| $d_{TLTTS}$ | 0 |
| $d_{TLTTN}$ | 59.65672759 |
| $d_{TLTTE}$ | 0 |
| $d_{TLT\psi Si}$ | 0 |
| $d_{TLT\theta LT}$ | 0 |
| $d_{TSTN}$ | 118.0753788 |
| $d_{TSTE}$ | 0 |
| $d_{TS\psi Si}$ | 0 |

TABLE 3-continued

Si(111)
FIRST HIGHER ORDER MODE

| | |
|---|---|
| $d_{TS\theta LT}$ | 0 |
| $d_{TNTE}$ | 0 |
| $d_{TN\psi Si}$ | 0 |
| $d_{TN\psi LT}$ | 0 |
| $d_{TE\psi Si}$ | 0 |
| $d_{TE\theta LT}$ | 0 |
| $d_{\psi Si\theta LT}$ | 0 |
| e | −1.633231485 |

TABLE 4

Si(100)
SECOND HIGHER ORDER MODE

| | |
|---|---|
| $a_{TLT}^{(2)}$ | 0 |
| $a_{TLT}^{(1)}$ | −11.81358789 |
| $b_{TLT}^{(2)}$ | 0 |
| $c_{TLT}$ | 0.233372093 |
| $a_{TS}^{(2)}$ | 0 |
| $a_{TS}^{(1)}$ | 12.8161063 |
| $b_{TS}^{(2)}$ | 0 |
| $c_{TS}$ | 0.256511628 |
| $a_{TN}^{(3)}$ | 51.69588497 |
| $a_{TN}^{(2)}$ | −32.3186317 |
| $a_{TN}^{(1)}$ | −4.371415613 |
| $b_{TN}^{(3)}$ | 0.001717063 |
| $b_{TN}^{(2)}$ | 0.027148945 |
| $c_{TN}$ | 0.29627907 |
| $a_{TE}^{(2)}$ | 0 |
| $a_{TE}^{(1)}$ | 1.615825178 |
| $b_{TE}^{(2)}$ | 0 |
| $c_{TE}$ | 0.151744186 |
| $a_{\psi Si}^{(4)}$ | 0 |
| $a_{\psi Si}^{(3)}$ | 0.000212057 |
| $a_{\psi Si}^{(2)}$ | −0.001603831 |
| $a_{\psi Si}^{(1)}$ | −0.204451256 |
| $b_{\psi Si}^{(4)}$ | 0 |
| $b_{\psi Si}^{(3)}$ | −751.8827776 |
| $b_{\psi Si}^{(2)}$ | 48.11032991 |
| $c_{\psi Si}$ | 27.48837209 |
| $a_{\theta LT}^{(2)}$ | 0 |
| $a_{\theta LT}^{(1)}$ | 0.02976445 |
| $b_{\theta LT}^{(2)}$ | 0 |
| $c_{\theta LT}$ | −49.6744186 |
| $d_{TLTTS}$ | 0 |
| $d_{TLTTN}$ | 0 |
| $d_{TLTTE}$ | 107.5358299 |
| $d_{TLT\psi Si}$ | 0 |
| $d_{TLT\theta LT}$ | 0 |
| $d_{TSTN}$ | 0 |
| $d_{TSTE}$ | 0 |
| $d_{TS\psi Si}$ | 1.157163274 |
| $d_{TS\theta LT}$ | 0 |
| $d_{TNTE}$ | 0 |
| $d_{TN\psi Si}$ | −0.328790695 |
| $d_{TN\psi LT}$ | −0.146613553 |
| $d_{TE\psi Si}$ | 0 |
| $d_{TE\theta LT}$ | 0 |
| $d_{\psi Si\theta LT}$ | 0 |
| e | −3.188900929 |

TABLE 5

Si(110)
SECOND HIGHER ORDER MODE

| | $0 \leq \psi_{Si} < 30$ | $30 \leq \psi_{Si} \leq 90$ |
|---|---|---|
| $a_{TLT}^{(2)}$ | 114.8844473 | 193.3812097 |
| $a_{TLT}^{(1)}$ | −8.088688831 | 0.512582429 |
| $b_{TLT}^{(2)}$ | 0.0016209 | 0.001754662 |
| $c_{TLT}$ | 0.254008909 | 0.251239669 |

TABLE 5-continued

| | Si(110) SECOND HIGHER ORDER MODE | |
|---|---|---|
| | $0 \leq \psi_{Si} < 30$ | $30 \leq \psi_{Si} \leq 90$ |
| $a_{TS}^{(2)}$ | 0 | 0 |
| $a_{TS}^{(1)}$ | −7.32209573 | −6.329562725 |
| $b_{TS}^{(2)}$ | 0 | 0 |
| $c_{TS}$ | 0.252672606 | 0.271900826 |
| $a_{TN}^{(3)}$ | 0 | −81.37971878 |
| $a_{TN}^{(2)}$ | −8.528039509 | 39.7113193 |
| $a_{TN}^{(1)}$ | −1.120271161 | 0.826800765 |
| $b_{TN}^{(3)}$ | 0 | 0.006887919 |
| $b_{TN}^{(2)}$ | 0.053619178 | 0.025205929 |
| $c_{TN}$ | 0.423830735 | 0.200826446 |
| $a_{TE}^{(2)}$ | 0 | 0 |
| $a_{TE}^{(1)}$ | 9.909256206 | 0 |
| $b_{TE}^{(2)}$ | 0 | 0 |
| $c_{TE}$ | 0.160523385 | 0 |
| $a_{\psi Si}^{(4)}$ | 0 | 0 |
| $a_{\psi Si}^{(3)}$ | 0 | 0 |
| $a_{\psi Si}^{(2)}$ | 0 | 0.003197968 |
| $a_{\psi Si}^{(1)}$ | 0.018063648 | −0.015576788 |
| $b_{\psi Si}^{(4)}$ | 0 | 0 |
| $b_{\psi Si}^{(3)}$ | 0 | 0 |
| $b_{\psi Si}^{(2)}$ | 0 | 108.7630626 |
| $c_{\psi Si}$ | 8.797327394 | 38.92561983 |
| $a_{\theta LT}^{(2)}$ | 0 | 0 |
| $a_{\theta LT}^{(1)}$ | −0.003063309 | 0.049075185 |
| $b_{\theta LT}^{(2)}$ | 0 | 0 |
| $c_{\theta LT}$ | −49.54120267 | −48.89256198 |
| $d_{TLTTS}$ | 0 | −167.1962018 |
| $d_{TLTTN}$ | −32.41085998 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTN}$ | 33.06314431 | 0 |
| $d_{TSTE}$ | 124.8374401 | 0 |
| $d_{TS\psi Si}$ | 0 | 0.486860801 |
| $d_{TS\theta LT}$ | 0 | 0 |
| $d_{TNTE}$ | −38.52108083 | 0 |
| $d_{TN\psi Si}$ | 0 | 0 |
| $d_{TN\psi LT}$ | 0 | 0 |
| $d_{TE\psi Si}$ | 0 | 0 |
| $d_{TE\theta LT}$ | 0.494639958 | 0 |
| $d_{\psi Si\theta LT}$ | −0.001623976 | 0.014724275 |
| e | −2.271454108 | −2.472699496 |

TABLE 6

| | Si(111) SECOND HIGHER ORDER MODE | |
|---|---|---|
| | $0 \leq \psi_{Si} < 30$ | $30 \leq \psi_{Si} \leq 60$ |
| $a_{TLT}^{(2)}$ | 0 | 0 |
| $a_{TLT}^{(1)}$ | −19.73613055 | −14.94881654 |
| $b_{TLT}^{(2)}$ | 0 | 0 |
| $c_{TLT}$ | 0.239145299 | 0.24607438 |
| $a_{TS}^{(2)}$ | 0 | 0 |
| $a_{TS}^{(1)}$ | −6.009225958 | 0.384596926 |
| $b_{TS}^{(2)}$ | 0 | 0 |
| $c_{TS}$ | 0.246837607 | 0.24862259 |
| $a_{TN}^{(3)}$ | 0 | 0 |
| $a_{TN}^{(2)}$ | −20.54217049 | −13.90920983 |
| $a_{TN}^{(1)}$ | −0.500198805 | −1.907891682 |
| $b_{TN}^{(3)}$ | 0 | 0 |
| $b_{TN}^{(2)}$ | 0.036939908 | 0.04540127 |
| $c_{TN}$ | 0.399487179 | 0.382644628 |
| $a_{TE}^{(2)}$ | 0 | 0 |
| $a_{TE}^{(1)}$ | 5.085265993 | 1.386937823 |
| $b_{TE}^{(2)}$ | 0 | 0 |
| $c_{TE}$ | 0.158376068 | 0.157438017 |
| $a_{\psi Si}^{(4)}$ | 0 | 0 |
| $a_{\psi Si}^{(3)}$ | 0 | 0 |
| $a_{\psi Si}^{(2)}$ | 0.001491321 | 0 |
| $a_{\psi Si}^{(1)}$ | 0.042768727 | −0.007722013 |

TABLE 6-continued

| | Si(111) SECOND HIGHER ORDER MODE | |
|---|---|---|
| | $0 \leq \psi_{Si} < 30$ | $30 \leq \psi_{Si} \leq 60$ |
| $b_{\psi Si}^{(4)}$ | 0 | 0 |
| $b_{\psi Si}^{(3)}$ | 0 | 0 |
| $b_{\psi Si}^{(2)}$ | 159.6686391 | 0 |
| $c_{\psi Si}$ | 14.15384615 | 47.63085399 |
| $a_{\theta LT}^{(2)}$ | 0 | 0 |
| $a_{\theta LT}^{(1)}$ | 0.012313864 | 0 |
| $b_{\theta LT}^{(2)}$ | 0 | 0 |
| $c_{\theta LT}$ | −48.4034188 | 0 |
| $d_{TLTTS}$ | 0 | 0 |
| $d_{TLTTN}$ | −34.27397947 | −21.45483754 |
| $d_{TLTTE}$ | 0 | 0 |
| $d_{TLT\psi Si}$ | 0.278464342 | 0 |
| $d_{TLT\theta LT}$ | −0.425894328 | 0 |
| $d_{TSTN}$ | 46.58606596 | 0 |
| $d_{TSTE}$ | 92.95289822 | 102.0248205 |
| $d_{TS\psi Si}$ | 0 | 0.493711224 |
| $d_{TS\theta LT}$ | 0 | 0 |
| $d_{TNTE}$ | −26.83666562 | 0 |
| $d_{TN\psi Si}$ | −0.133932768 | −0.129081681 |
| $d_{TN\psi LT}$ | −0.107712568 | 0 |
| $d_{TE\psi Si}$ | 0 | 0 |
| $d_{TE\theta LT}$ | 0 | 0 |
| $d_{\psi Si\theta LT}$ | 0 | 0 |
| e | −2.444079693 | −1.863631594 |

TABLE 7

| | Si(100) THIRD HIGHER ORDER MODE |
|---|---|
| $a_{TLT}^{(2)}$ | 0 |
| $a_{TLT}^{(1)}$ | −13.69744796 |
| $b_{TLT}^{(2)}$ | 0 |
| $c_{TLT}$ | 0.242117117 |
| $a_{TS}^{(2)}$ | 0 |
| $a_{TS}^{(1)}$ | −21.67672451 |
| $b_{TS}^{(2)}$ | 0 |
| $c_{TS}$ | 0.24740991 |
| $a_{TN}^{(3)}$ | 0 |
| $a_{TN}^{(2)}$ | 0 |
| $a_{TN}^{(1)}$ | 0 |
| $b_{TN}^{(3)}$ | 0 |
| $b_{TN}^{(2)}$ | 0 |
| $c_{TN}$ | 0 |
| $a_{TE}^{(2)}$ | 0 |
| $a_{TE}^{(1)}$ | 0 |
| $b_{TE}^{(2)}$ | 0 |
| $c_{TE}$ | 0 |
| $a_{\psi Si}^{(4)}$ | 0 |
| $a_{\psi Si}^{(3)}$ | 0 |
| $a_{\psi Si}^{(2)}$ | 0 |
| $a_{\psi Si}^{(1)}$ | −0.012294125 |
| $b_{\psi Si}^{(4)}$ | 0 |
| $b_{\psi Si}^{(3)}$ | 0 |
| $b_{\psi Si}^{(2)}$ | 0 |
| $c_{\psi Si}$ | 23.5472973 |
| $a_{\theta LT}^{(2)}$ | 0 |
| $a_{\theta LT}^{(1)}$ | −0.043141927 |
| $b_{\theta LT}^{(2)}$ | 0 |
| $c_{\theta LT}$ | −50.74774775 |
| $d_{TLTTS}$ | 0 |
| $d_{TLTTN}$ | 0 |
| $d_{TLTTE}$ | 0 |
| $d_{TLT\psi Si}$ | 0 |
| $d_{TLT\theta LT}$ | 1.006243214 |
| $d_{TSTN}$ | 0 |
| $d_{TSTE}$ | 0 |
| $d_{TS\psi Si}$ | 0 |
| $d_{TS\theta LT}$ | 0 |
| $d_{TNTE}$ | 0 |
| $d_{TN\psi Si}$ | 0 |
| $d_{TN\psi LT}$ | 0 |

TABLE 7-continued

Si(100)
THIRD HIGHER ORDER MODE

| | |
|---|---|
| $d_{TE\psi Si}$ | 0 |
| $d_{TE\theta LT}$ | 0 |
| $d_{\psi Si\theta LT}$ | −0.002432123 |
| e | −2.624644502 |

TABLE 8

Si(110)
THIRD HIGHER ORDER MODE

| | $0 \leq \psi_{Si} < 30$ | $30 \leq \psi_{Si} \leq 90$ |
|---|---|---|
| $a_{TLT}^{(2)}$ | 0 | 0 |
| $a_{TLT}^{(1)}$ | −11.03265079 | 0 |
| $b_{TLT}^{(2)}$ | 0 | 0 |
| $c_{TLT}$ | 0.256828704 | 0 |
| $a_{TS}^{(2)}$ | 0 | 0 |
| $a_{TS}^{(1)}$ | −4.308771413 | 0.663966622 |
| $b_{TS}^{(2)}$ | 0 | 0 |
| $c_{TS}$ | 0.254976852 | 0.252631579 |
| $a_{TN}^{(3)}$ | 0 | −41.616937 |
| $a_{TN}^{(2)}$ | 0 | 15.26191272 |
| $a_{TN}^{(1)}$ | 0.749735997 | 1.074574236 |
| $b_{TN}^{(3)}$ | 0 | 0.006033304 |
| $b_{TN}^{(2)}$ | 0 | 0.043147922 |
| $c_{TN}$ | 0.380092593 | 0.303157395 |
| $a_{TE}^{(2)}$ | 0 | 0 |
| $a_{TE}^{(1)}$ | −0.678702233 | 11.03955295 |
| $b_{TE}^{(2)}$ | 0 | 0 |
| $c_{TE}$ | 0.155960648 | 0.160921053 |
| $a_{\psi Si}^{(4)}$ | 0 | 0 |
| $a_{\psi Si}^{(3)}$ | 0 | 0 |
| $a_{\psi Si}^{(2)}$ | 0 | 0 |
| $a_{\psi Si}^{(1)}$ | 0.020332938 | 0.010235202 |
| $b_{\psi Si}^{(4)}$ | 0 | 0 |
| $b_{\psi Si}^{(3)}$ | 0 | 0 |
| $b_{\psi Si}^{(2)}$ | 0 | 0 |
| $c_{\psi Si}$ | 5.99537037 | 66.78947368 |
| $a_{\theta LT}^{(2)}$ | −0.003658214 | 0 |
| $a_{\theta LT}^{(1)}$ | 0.048112599 | 0.016635787 |
| $b_{\theta LT}^{(2)}$ | 71.1933299 | 0 |
| $c_{\theta LT}$ | −50.89814815 | −49.93684211 |
| $d_{TLTTS}$ | 0 | 0 |
| $d_{TLTTN}$ | 0 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTN}$ | 0 | 0 |
| $d_{TSTE}$ | 0 | 0 |
| $d_{TS\psi Si}$ | 0 | −0.323118590 |
| $d_{TS\theta LT}$ | 0 | 0.713957036 |
| $d_{TNTE}$ | 0 | 0 |
| $d_{TN\psi Si}$ | −0.144459086 | 0 |
| $d_{TN\psi LT}$ | 0 | 0 |
| $d_{TE\psi Si}$ | 0.79407423 | 0.334206608 |
| $d_{TE\theta LT}$ | 0 | 0 |
| $d_{\psi Si\theta LT}$ | −0.002496666 | 0.001289273 |
| e | −2.360031711 | −3.077359987 |

TABLE 9

Si(111)
THIRD HIGHER ORDER MODE
$0 < T_{LT} < 0.25$
$0 \leq \psi_{Si} < 30$

| | |
|---|---|
| $a_{TLT}^{(2)}$ | 0 |
| $a_{TLT}^{(1)}$ | −23.116307 |
| $b_{TLT}^{(2)}$ | 0 |
| $c_{TLT}$ | 0.2289801 |
| $a_{TS}^{(2)}$ | 0 |
| $a_{TS}^{(1)}$ | −14.28753349 |

TABLE 9-continued

Si(111)
THIRD HIGHER ORDER MODE
$0 < T_{LT} < 0.25$
$0 \leq \psi_{Si} < 30$

| | |
|---|---|
| $b_{TS}^{(2)}$ | 0 |
| $c_{TS}$ | 0.260572139 |
| $a_{TN}^{(3)}$ | 0 |
| $a_{TN}^{(2)}$ | 0 |
| $a_{TN}^{(1)}$ | −0.440595972 |
| $b_{TN}^{(3)}$ | 0 |
| $b_{TN}^{(2)}$ | 0 |
| $c_{TN}$ | 0.411940299 |
| $a_{TE}^{(2)}$ | 0 |
| $a_{TE}^{(1)}$ | 0 |
| $b_{TE}^{(2)}$ | 0 |
| $c_{TE}$ | 0 |
| $a_{\psi Si}^{(4)}$ | 0 |
| $a_{\psi Si}^{(3)}$ | 0 |
| $a_{\psi Si}^{(2)}$ | 0 |
| $a_{\psi Si}^{(1)}$ | 0.029126872 |
| $b_{\psi Si}^{(4)}$ | 0 |
| $b_{\psi Si}^{(3)}$ | 0 |
| $b_{\psi Si}^{(2)}$ | 0 |
| $c_{\psi Si}$ | 11.96517413 |
| $a_{\theta LT}^{(2)}$ | 0 |
| $a_{\theta LT}^{(1)}$ | 0 |
| $b_{\theta LT}^{(2)}$ | 0 |
| $c_{\theta LT}$ | 0 |
| $d_{TLTTS}$ | 0 |
| $d_{TLTTN}$ | 0 |
| $d_{TLTTE}$ | 0 |
| $d_{TLT\psi Si}$ | 0 |
| $d_{TLT\theta LT}$ | 0 |
| $d_{TSTN}$ | 0 |
| $d_{TSTE}$ | 0 |
| $d_{TS\psi Si}$ | 0.930830627 |
| $d_{TS\theta LT}$ | 0 |
| $d_{TNTE}$ | 0 |
| $d_{TN\psi Si}$ | −0.129081681 |
| $d_{TN\psi LT}$ | 0 |
| $d_{TE\psi Si}$ | 0 |
| $d_{TE\theta LT}$ | 0 |
| $d_{\psi Si\theta LT}$ | 0 |
| e | −2.122238265 |

TABLE 10

Si(111)
THIRD HIGHER ORDER MODE
$0 < T_{LT} < 0.25$
$30 \leq \psi_{Si} \leq 60$

| | $0 < T_N < 0.3$ | $0.3 \leq T_N < 0.5$ | $0.5 \leq T_N \leq 2.0$ |
|---|---|---|---|
| $a_{TLT}^{(2)}$ | 0 | 0 | 0 |
| $a_{TLT}^{(1)}$ | −8.85598025 | −13.00016665 | −14.59159182 |
| $b_{TLT}^{(2)}$ | 0 | 0 | 0 |
| $c_{TLT}$ | 0.228097345 | 0.22804878 | 0.228054299 |
| $a_{TS}^{(2)}$ | 103.6914504 | 0 | 0 |
| $a_{TS}^{(1)}$ | −1.916300209 | −1.043153875 | −2.152482595 |
| $b_{TS}^{(2)}$ | 0.001674808 | 0 | 0 |
| $c_{TS}$ | 0.25420354 | 0.254634146 | 0.251809955 |
| $a_{TN}^{(3)}$ | 0 | 0 | 0 |
| $a_{TN}^{(2)}$ | 0 | 0 | 0 |
| $a_{TN}^{(1)}$ | −2.052521715 | 1.895724222 | −3.806230027 |
| $b_{TN}^{(3)}$ | 0 | 0 | 0 |
| $b_{TN}^{(2)}$ | 0 | 0 | 0 |
| $c_{TN}$ | 0.187610619 | 0.403414634 | 0.604072398 |
| $a_{TE}^{(2)}$ | 0 | 0 | 0 |
| $a_{TE}^{(1)}$ | 6.773288364 | 5.622244745 | 4.676153327 |
| $b_{TE}^{(2)}$ | 0 | 0 | 0 |
| $c_{TE}$ | 0.163274336 | 0.167317073 | 0.46561086 |
| $a_{\psi Si}^{(4)}$ | 0 | 0 | 0 |
| $a_{\psi Si}^{(3)}$ | 0 | 0 | 0 |
| $a_{\psi Si}^{(2)}$ | 0 | 0 | 0 |
| $a_{\psi Si}^{(1)}$ | −0.035810857 | 0 | 0.001284581 |

TABLE 10-continued

Si(111)
THIRD HIGHER ORDER MODE
$0 < T_{LT} < 0.25$
$30 \leq \psi_{Si} \leq 60$

| | $0 < T_N < 0.3$ | $0.3 \leq T_N < 0.5$ | $0.5 \leq T_N \leq 2.0$ |
|---|---|---|---|
| $b_{\psi Si}^{(4)}$ | 0 | 0 | 0 |
| $b_{\psi Si}^{(3)}$ | 0 | 0 | 0 |
| $b_{\psi Si}^{(2)}$ | 0 | 0 | 0 |
| $c_{\psi Si}$ | 50.7079646 | 0 | 47.46606335 |
| $a_{\theta LT}^{(2)}$ | −0.004232627 | −0.004038546 | 0 |
| $a_{\theta LT}^{(1)}$ | 0.047188385 | 0.050497193 | 0.025858407 |
| $b_{\theta LT}^{(2)}$ | 70.63732477 | 71.2056157 | 0 |
| $c_{\theta LT}$ | −50.2300885 | −50.47804878 | −50.00904977 |
| $d_{TLTTS}$ | 0 | 144.8256764 | 175.1562687 |
| $d_{TLTTN}$ | 0 | −71.99871186 | 62.29352459 |
| $d_{TLTTE}$ | 0 | 0 | 0 |
| $d_{TLT\psi Si}$ | 0 | 0 | 0.579045093 |
| $d_{TLT\theta LT}$ | 0 | 0 | 0 |
| $d_{TSTN}$ | 0 | 0 | 0 |
| $d_{TSTE}$ | 0 | 0 | 0 |
| $d_{TS\psi Si}$ | 0 | 0.421981204 | 0 |
| $d_{TS\theta LT}$ | 0.662353425 | 0.864834339 | 0.455548641 |
| $d_{TNTE}$ | 0 | 0 | 0 |
| $d_{TN\psi Si}$ | 0 | 0 | 0.213878349 |
| $d_{TN\psi LT}$ | 0 | 0 | −0.173003295 |
| $d_{TE\psi Si}$ | 0 | 0 | 0 |
| $d_{TE\theta LT}$ | 0 | 0 | 0 |
| $d_{\psi Si\theta LT}$ | 0.002492698 | 0.002050178 | 0 |
| e | −1.992833526 | −1.990755952 | −2.158637111 |

TABLE 11

Si(111)
THIRD HIGHER ORDER MODE
$0.25 \leq T_{LT} \leq 3.5$

| | $0 \leq \psi_{Si} < 30$ | $30 \leq \psi_{Si} \leq 60$ |
|---|---|---|
| $a_{TLT}^{(2)}$ | 0 | 0 |
| $a_{TLT}^{(1)}$ | −4.23090475 | 0 |
| $b_{TLT}^{(2)}$ | 0 | 0 |
| $c_{TLT}$ | 0.275829876 | 0 |
| $a_{TS}^{(2)}$ | 0 | 0 |
| $a_{TS}^{(1)}$ | −10.77092012 | −1.545108081 |
| $b_{TS}^{(2)}$ | 0 | 0 |
| $c_{TS}$ | 0.254356846 | 0.254105263 |
| $a_{TN}^{(3)}$ | 0 | 0 |
| $a_{TN}^{(2)}$ | 0 | 0 |
| $a_{TN}^{(1)}$ | −0.547621988 | −0.893667583 |
| $b_{TN}^{(3)}$ | 0 | 0 |
| $b_{TN}^{(2)}$ | 0 | 0 |
| $c_{TN}$ | 0.396680498 | 0.392631579 |
| $a_{TE}^{(2)}$ | 0 | 0 |
| $a_{TE}^{(1)}$ | 0 | 0.708331426 |
| $b_{TE}^{(2)}$ | 0 | 0 |
| $c_{TE}$ | 0 | 0.159684211 |
| $a_{\psi Si}^{(4)}$ | 0 | 0 |
| $a_{\psi Si}^{(3)}$ | 0 | 0 |
| $a_{\psi Si}^{(2)}$ | 0 | 0 |
| $a_{\psi Si}^{(1)}$ | 0.033675166 | −0.011260677 |
| $b_{\psi Si}^{(4)}$ | 0 | 0 |
| $b_{\psi Si}^{(3)}$ | 0 | 0 |
| $b_{\psi Si}^{(2)}$ | 0 | 0 |
| $c_{\psi Si}$ | 11.70124481 | 48.21052632 |
| $a_{\theta LT}^{(2)}$ | 0 | −0.003806532 |
| $a_{\theta LT}^{(1)}$ | −0.012544759 | 0.039951436 |
| $b_{\theta LT}^{(2)}$ | 0 | 67.93672687 |
| $c_{\theta LT}$ | −49.37759336 | −49.42315789 |
| $d_{TLTTS}$ | 122.2019913 | 0 |
| $d_{TLTTN}$ | 0 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTN}$ | 0 | 0 |
| $d_{TSTE}$ | 0 | 0 |

TABLE 11-continued

Si(111)
THIRD HIGHER ORDER MODE
$0.25 \leq T_{LT} \leq 3.5$

| | $0 \leq \psi_{Si} < 30$ | $30 \leq \psi_{Si} \leq 60$ |
|---|---|---|
| $d_{TS\psi Si}$ | 0.657009296 | −0.317058863 |
| $d_{TS\theta LT}$ | 0 | 0.702776192 |
| $d_{TNTE}$ | 0 | −16.38117608 |
| $d_{TN\psi Si}$ | −0.139004432 | 0.128605996 |
| $d_{TN\psi LT}$ | 0 | 0 |
| $d_{TE\psi Si}$ | 0 | 0 |
| $d_{TE\theta LT}$ | 0 | 0 |
| $d_{\psi Si\theta LT}$ | 0.001351095 | 0.001928116 |
| e | −2.653122338 | −2.237232738. |

2. The acoustic wave device according to claim 1, wherein the thickness of the piezoelectric body is less than or equal to about 3.5λ.

3. The acoustic wave device according to claim 2, wherein the thickness of the piezoelectric body is less than or equal to about 2.5λ.

4. The acoustic wave device according to claim 2, wherein the thickness of the piezoelectric body is less than or equal to about 1.5λ.

5. The acoustic wave device according to claim 2, wherein the thickness of the piezoelectric body is less than or equal to about 0.5λ.

6. A multiplexer comprising:
N acoustic wave filters having different pass bands, where N is greater than or equal to 2; wherein
first terminals of the N acoustic wave filters are connected to each other via a common connection on an antenna terminal side;
at least one acoustic wave filter of the N acoustic wave filters except for the acoustic wave filter having the highest pass band includes one or more acoustic wave resonators; and
at least one acoustic wave resonator of the one or more acoustic wave resonators is the acoustic wave device according to claim 1.

7. The multiplexer according to claim 6, wherein the multiplexer is a carrier aggregation composite filter device.

8. The multiplexer according to claim 6, wherein the at least one acoustic wave filter includes a plurality of series arm resonators and a plurality of parallel arm resonators defining a ladder filter.

9. The multiplexer according to claim 6, further comprising:
an antenna connected to the antenna common terminal.

10. The acoustic wave device according to claim 1, wherein $I_h$ for the first higher order mode and $I_h$ for the second higher order mode are greater than about −2.4.

11. The acoustic wave device according to claim 1, wherein $I_h$ for the first higher order mode and $I_h$ for the third higher order mode are greater than about −2.4.

12. The acoustic wave device according to claim 1, wherein $I_h$ for the second higher order mode and $I_h$ for the third higher order mode are greater than about −2.4.

13. The acoustic wave device according to claim 1, wherein $I_h$ for the first higher order mode, $I_h$ for the second higher order mode, and $I_h$ for the third higher order mode are all greater than about −2.4.

14. The acoustic wave device according to claim 1, wherein the acoustic wave device is an acoustic wave resonator.

15. An acoustic wave filter comprising:
a plurality of resonators; wherein
at least one resonator of the plurality of resonators is the acoustic wave device according to claim 1.

16. A radio-frequency front end circuit comprising:
an acoustic wave filter including the acoustic wave device according to claim 1; and
a power amplifier connected to the acoustic wave filter.

17. A communication device comprising:
a radio-frequency front end circuit including an acoustic wave filter including the acoustic wave device according to claim 1, and a power amplifier connected to the acoustic wave filter; and
an RF signal processing circuit.

18. The acoustic wave device according to claim 1, wherein
the support substrate is a single crystal silicon substrate doped with impurities; and
the piezoelectric body is made of lithium tantalate doped with iron.

19. The acoustic wave device according to claim 1, wherein
the silicon oxide film or the silicon nitride film includes a multilayer structure including a plurality of layers; and
the plurality of layers include an intermediate layer made of titanium or nickel.

* * * * *